(12) United States Patent
Asaoka

(10) Patent No.: US 11,727,992 B2
(45) Date of Patent: Aug. 15, 2023

(54) SEMICONDUCTOR MEMORY DEVICE

(71) Applicant: KIOXIA CORPORATION, Tokyo (JP)

(72) Inventor: Norichika Asaoka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/824,758

(22) Filed: May 25, 2022

(65) Prior Publication Data
US 2022/0284963 A1 Sep. 8, 2022

Related U.S. Application Data

(63) Continuation of application No. 17/103,691, filed on Nov. 24, 2020, now Pat. No. 11,386,960, which is a continuation of application No. 16/286,530, filed on Feb. 26, 2019, now Pat. No. 10,867,679.

(30) Foreign Application Priority Data

Sep. 18, 2018 (JP) .................................. 2018-173374

(51) Int. Cl.
| | |
|---|---|
| *G11C 8/00* | (2006.01) |
| *G11C 16/08* | (2006.01) |
| *G11C 16/16* | (2006.01) |
| *G11C 16/04* | (2006.01) |
| *G11C 16/32* | (2006.01) |
| *G11C 16/26* | (2006.01) |

(52) U.S. Cl.
CPC .......... *G11C 16/08* (2013.01); *G11C 16/0483* (2013.01); *G11C 16/16* (2013.01); *G11C 16/26* (2013.01); *G11C 16/32* (2013.01)

(58) Field of Classification Search
CPC ..... G11C 16/08; G11C 16/0483; G11C 16/16; G11C 16/26; G11C 16/32
USPC ..................................................... 365/230.01
See application file for complete search history.

(56) References Cited

U.S. PATENT DOCUMENTS

| | | | |
|---|---|---|---|
| 5,812,490 A | 9/1998 | Tsukude | |
| 5,826,056 A | 10/1998 | Noda | |
| 5,930,194 A | 7/1999 | Yamagata et al. | |
| 6,125,078 A | 9/2000 | Ooishi et al. | |

(Continued)

FOREIGN PATENT DOCUMENTS

| | | |
|---|---|---|
| JP | 2005322383 A | 11/2005 |
| JP | 2011192385 A | 9/2011 |
| JP | 2014179141 A | 9/2014 |

*Primary Examiner* — Viet Q Nguyen
(74) *Attorney, Agent, or Firm* — Kim & Stewart LLP

(57) ABSTRACT

A semiconductor memory device includes first, second, third, and fourth planes, a first address bus connected to the first and third planes, a second address bus connected to the second and fourth planes, and a control circuit configured to execute a synchronous process on at least two planes in response to a first command set including a first address and a second address. The control circuit is configured to transfer the first address to the first and third planes through the first address bus, and the second address to the second and fourth planes through the second address bus, and during the synchronous process, select a first block in one of the first and third planes, based on the transferred first address and select a second block in one of the second and fourth planes, based on the transferred second address.

14 Claims, 37 Drawing Sheets

(56) References Cited

U.S. PATENT DOCUMENTS

| | | |
|---|---|---|
| 6,728,819 B2 | 4/2004 | Farmwald et al. |
| 7,111,103 B2 | 9/2006 | Wang et al. |
| 7,111,144 B2 | 9/2006 | Hardman et al. |
| 7,243,193 B2 | 7/2007 | Walmsley |
| 7,251,173 B2 | 7/2007 | Lunde et al. |
| 7,263,023 B2 | 8/2007 | Suh |
| 7,263,381 B2 | 8/2007 | Minko |
| 7,310,258 B2 | 12/2007 | Lee et al. |
| 8,190,808 B2 | 5/2012 | Lai et al. |
| 8,347,042 B2 | 1/2013 | You |
| 8,724,397 B2 | 5/2014 | Asaoka et al. |
| 9,666,296 B1 | 5/2017 | Maejima |
| 9,792,995 B1 | 10/2017 | Shah et al. |
| 9,852,795 B2 | 12/2017 | Kang et al. |
| 9,881,684 B2 * | 1/2018 | Shirakawa ......... G11C 16/3445 |
| 10,002,671 B2 | 6/2018 | Shimizu et al. |
| 10,096,366 B2 * | 10/2018 | Akamine ............... G11C 16/08 |
| 10,397,738 B2 | 8/2019 | Roberts et al. |
| 10,497,447 B2 | 12/2019 | Shin |
| 10,777,239 B2 * | 9/2020 | Sato ....................... G11C 16/34 |
| 10,803,946 B2 * | 10/2020 | Imamoto ............... G06F 3/0604 |
| 10,867,679 B2 * | 12/2020 | Asaoka .................. G11C 16/32 |
| 10,876,679 B2 * | 12/2020 | Monir .................... F16M 11/18 |
| 10,892,020 B2 * | 1/2021 | Hioka .................... H10B 43/30 |
| 10,957,404 B2 * | 3/2021 | Sugahara ................. G11C 7/04 |
| 11,093,172 B2 * | 8/2021 | Sugahara ............... G11C 16/26 |
| 11,158,388 B2 * | 10/2021 | Hioka .................... H10B 43/30 |
| 11,386,960 B2 * | 7/2022 | Asaoka ............. G11C 16/0483 |
| 2014/0244909 A1 | 8/2014 | Shirakawa et al. |
| 2014/0269073 A1 | 9/2014 | Itagaki |
| 2015/0355965 A1 | 12/2015 | Peddle |
| 2020/0026466 A1 | 1/2020 | Takano |

* cited by examiner

FIG. 15

|  | PB_SEL | | | |
|---|---|---|---|---|
|  | ⟨0⟩ | ⟨1⟩ | ⟨2⟩ | ⟨3⟩ |
| PB0 | 0 | 0 | 0 | 0 |
| PB1 | 1 | 0 | 0 | 0 |
| PB2 | 0 | 1 | 0 | 0 |
| PB3 | 1 | 1 | 0 | 0 |
| PB4 | 0 | 0 | 1 | 0 |
| ... | ... | ... | ... | ... |
| PB15 | 1 | 1 | 1 | 1 |

FIG. 20

|  | PB_SEL ||
|  | <0> | <1> |
|---|---|---|
| IPB0<br>(PB0~PB3) | 0 | 0 |
| IPB1<br>(PB4~PB7) | 0 | 1 |
| IPB2<br>(PB8~PB11) | 1 | 0 |
| IPB3<br>(PB12~PB15) | 1 | 1 |

*FIG. 26*

| | PB_SEL | |
|---|---|---|
| | ⟨0⟩ | ⟨1⟩ |
| PSET0<br>(PB0, PB4, PB8, PB12) | 0 | 0 |
| PSET1<br>(PB1, PB5, PB9, PB13) | 0 | 1 |
| PSET2<br>(PB2, PB6, PB10, PB14) | 1 | 0 |
| PSET3<br>(PB3, PB7, PB11, PB15) | 1 | 1 |

FIG. 34

| | | PBSET_SEL<1:0> | | | |
| --- | --- | --- | --- | --- | --- |
| | | "00" (PSET0) | "01" (PSET1) | "10" (PSET2) | "11" (PSET3) |
| PBGRP_SEL<1:0> | "11" (GRP3) | PB12 | PB13 | PB14 | PB15 |
| | "10" (GRP2) | PB8 | PB9 | PB10 | PB11 |
| | "01" (GRP1) | PB4 | PB5 | PB6 | PB7 |
| | "00" (GRP0) | PB0 | PB1 | PB2 | PB3 |

SEMICONDUCTOR MEMORY DEVICE

CROSS-REFERENCE TO RELATED APPLICATION

This application is a continuation of U.S. patent application Ser. No. 17/103,691, filed Nov. 24, 2020, which is is a continuation of U.S. patent application Ser. No. 16/286,530, filed Feb. 26, 2019, now U.S. Pat. No. 10,867,679, issued Dec. 15, 2020, which is based upon and claims the benefit of priority from Japanese Patent Application No. 2018-173374, filed Sep. 18, 2018, the entire contents of which are incorporated herein by reference.

FIELD

Embodiments described herein relate generally to a semiconductor memory device.

BACKGROUND

A NAND type flash memory is known as a type of semiconductor memory device.

DESCRIPTION OF THE DRAWINGS

FIG. 15 is a table that shows a correspondence relationship between a signal generated in a plane selection signal generation circuit of the semiconductor memory device according to the second embodiment, and planes.

FIG. 20 is a table that shows a correspondence relationship between a signal generated in a plane selection signal generation circuit of the semiconductor memory device according to the first modification of the second embodiment, and planes.

FIG. 26 is a table that shows a correspondence relationship between a signal generated in a plane selection signal generation circuit of the semiconductor memory device according to the third modification of the second embodiment, and planes.

FIG. 34 is a table that shows a correspondence relationship between a signal generated in a plane selection signal generation circuit of the semiconductor memory device according to the fifth modification of the second embodiment, and planes.

DETAILED DESCRIPTION

Figure 1:
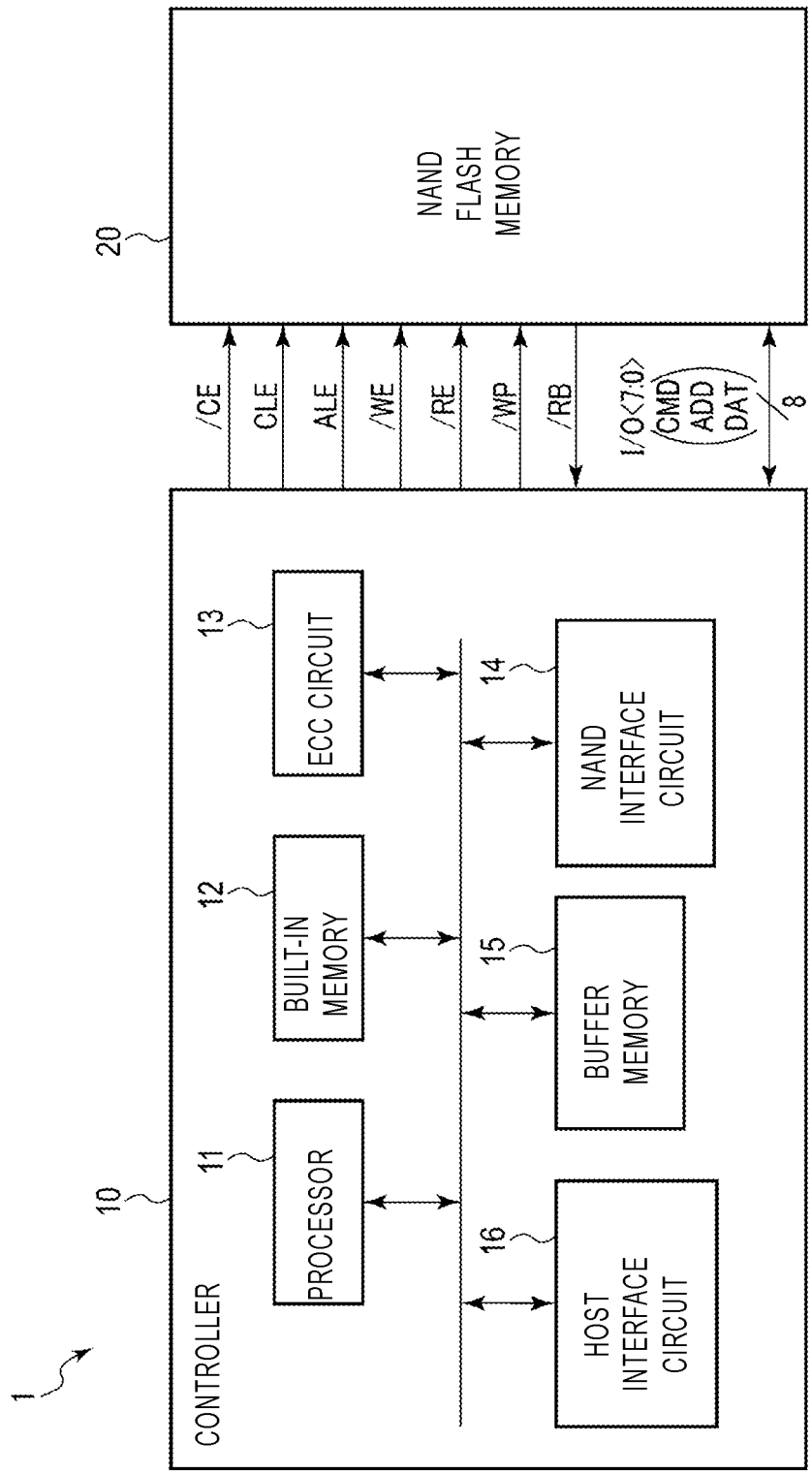
FIG. 1 is a block diagram for explaining the configuration of a memory system according to a first embodiment.

Embodiments provide a technique capable of preventing an increase in circuit area and wiring area of a semiconductor memory device.

In general, according to one embodiment, a semiconductor memory device includes a plurality of planes including a first plane, a second plane, a third plane and a fourth plane, each of the planes including a memory cell array that includes a plurality of blocks each having a plurality of memory cells, a first signal line connected to the first plane, a second signal line connected to the second plane, a third signal line connected to the third plane, a fourth signal line connected to the fourth plane, a first address bus commonly connected to the first plane and the third plane, a second address bus which is commonly connected to the second plane and the fourth plane and is different from the first address bus, and a control circuit configured to execute a synchronous process in which at least two planes are operated synchronously in response to receiving a first command set including a first address and a second address. The control circuit is configured to transfer the first address to the first plane and the third plane through the first address bus, and transfer the second address to the second plane and the fourth plane through the second address bus, and during the synchronous process, select a first block in one of the first and third planes using the first and third signal lines, respectively, based on the transferred first address and select a second block in one of the second and fourth planes using the second and fourth signal lines, respectively, based on the transferred second address.

Hereinafter, embodiments will be described with reference to the drawings. In the following description, elements having the same functions and configurations are given the same reference numerals. In addition, when distinguishing plural elements having common reference numerals, the common reference numerals are appended with subscripts to distinguish among them. In a case where distinction among the plural elements is not needed, the plural elements are referred to only using the common reference numerals and no subscripts are appended.

1. First Embodiment

A semiconductor memory device according to a first embodiment will be described.

1.1. Configuration

First, the configuration of a semiconductor memory device according to a first embodiment will be described.

1.1.1. Overall Configuration of Memory System

FIG. 1 is a block diagram illustrating an example of the configuration of a memory system including a semiconductor memory device according to a first embodiment. The memory system 1 communicates with, for example, an external host device (not illustrated). The memory system 1 stores data from the host device (not illustrated) and returns data read therefrom to the host device.

As illustrated in FIG. 1, the memory system 1 includes a memory controller 10 and a semiconductor memory device (e.g., NAND flash memory) 20. The memory controller 10 receives a command from the host device and controls the semiconductor memory device 20 based on the received command. Specifically, the memory controller 10 writes data instructed to be written from the host device in the semiconductor memory device 20, reads data instructed to be read by the host device from the semiconductor memory device 20, and transmits the read data to the host device. The memory controller 10 is connected to the semiconductor memory device 20 by a NAND bus. The semiconductor memory device 20 includes plural memory cells and stores data in a nonvolatile manner.

The NAND bus transmits and receives signals /CE, CLE, ALE, /WE, /RE, /WP, /RB and I/O<7:0> according to a NAND interface standard through individual signal lines. The signal /CE is a signal that enables the semiconductor memory device 20. The signal CLE notifies the semiconductor memory device 20 that the signal I/O<7:0> transmitted to the semiconductor memory device 20 contains a command when the signal CLE is at an "H (High)" level. The signal ALE notifies the semiconductor memory device 20 that the signal I/O<7:0> transmitted to the semiconductor memory device 20 contains an address when the signal ALE is at an "H" level. The signal /WE instructs the semiconductor memory device 20 to take in the signal I/O<7:0> transmitted to semiconductor memory device 20 as an input signal while the signal /WE is at an "L (Low)" level. The signal /RE instructs the semiconductor memory device 20 to perform an output through the signal I/O<7:0>. The signal /WP instructs the semiconductor memory device 20 to prohibit data writing and erasing. The signal /RB indicates whether the semiconductor memory device 20 is in a ready state (a state in which an external command can be received) or a busy state (a state in which a command cannot be received). The signal I/O<7:0> is, for example, an 8-bit signal. Data is exchanged between the semiconductor memory device 20 and the memory controller through the signal I/O<7:0> and the data includes a command CMD, an address ADD and a data DAT. The data DAT includes write data and read data.

1.1.2. Configuration of Controller

Subsequently, with reference to FIG. 1, the controller of the memory system according to the first embodiment will be explained. The memory controller 10 includes a processor (CPU: Central Processing Unit) 11, a built-in memory (RAM: Random Access Memory) 12, an ECC (Error Check and Correction) circuit 13, a NAND interface circuit 14, a buffer memory 15 and a host interface circuit 16.

The processor 11 controls the overall operation of the memory controller 10. The processor 11 issues a read command according to the NAND interface standard to the semiconductor memory device 20, for example, in response to a data read command received from the host device. This operations of write and erase are carried out in a similar manner. Further, the processor 11 has a function of executing various arithmetic operations on the read data from the semiconductor memory device 20.

The built-in memory 12 is a semiconductor memory such as a DRAM (Dynamic RAM) and is used as a work area of the processor 11. The built-in memory 12 stores firmware, various management tables and the like to manage the semiconductor memory device 20.

The ECC circuit 13 performs an error detection and error correction processing. More specifically, when data is written, the ECC circuit 13 generates an ECC code for each set of data received from the host device. When data is read, the ECC circuit 13 performs an ECC decoding based on the ECC code to detect the presence or absence of an error. When an error is detected, the ECC circuit 13 specifies the bit position of the error and corrects the error.

The NAND interface circuit 14 is connected to the semiconductor memory device 20 through the NAND bus and handles communication with the semiconductor memory device 20. According to an instruction from the processor 11, the NAND interface circuit 14 transmits the command CMD, the address ADD and the write data to the semiconductor memory device 20. Further, the NAND interface circuit 14 receives the read data from the semiconductor memory device 20.

The buffer memory 15 temporarily stores data and the like received by the memory controller 10 from the semiconductor memory device 20 and the host device. The buffer memory 15 is also used, for example, as a memory area that temporarily stores, for example, the read data from the semiconductor memory device 20, and results of calculation on the read data.

The host interface circuit 16 is connected to the host device and handles communication with the host device. The host interface circuit 16 transfers, for example, commands and data received from the host device to the processor 11 and the buffer memory 15, respectively.

1.1.3. Configuration of Semiconductor Memory Device

Next, descriptions will be made on a configuration example of the semiconductor memory device according to the first embodiment.

Figure 2:
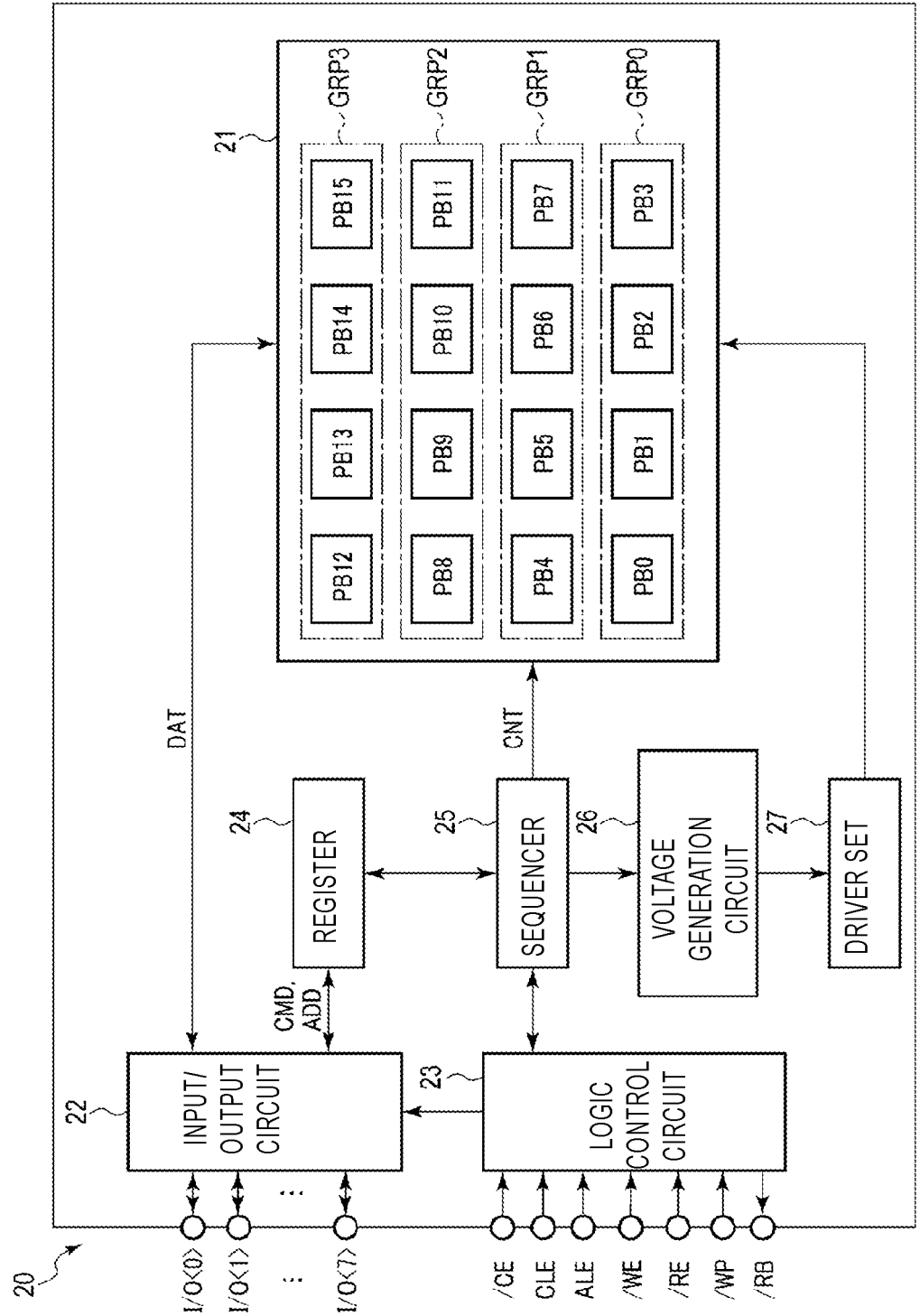
FIG. 2 is a block diagram for explaining the configuration of a semiconductor memory device according to the first embodiment.

FIG. 2 is a block diagram illustrating an example of the configuration of the semiconductor memory device according to the first embodiment. As illustrated in FIG. 2, the semiconductor memory device 20 includes a core unit 21, an input/output circuit 22, a logic control circuit 23, a register 24, a sequencer 25, a voltage generation circuit 26 and a driver set 27.

The core unit 21 includes, for example, 16 planes PB (PB0, PB1, . . . , PB15). Each of the 16 planes PB is classified into four groups GRP. In the example of FIG. 2, for example, the planes PB0 to PB3, the planes PB4 to PB7, the planes PB8 to PB11 and the planes PB12 to PB15 are classified into groups GRP0 to GRP3, respectively. Plural planes PB in the same group GRP may be operated in synchronization with each other and independently from each other.

Each plane PB performs the above-described various operations in units of a block (not illustrated) that includes plural memory cell transistors (not illustrated). Specifically, for example, each plane PB performs a data write operation and a data read operation on some of memory cell transistors in a certain block and performs an erase operation of written data on all memory cell transistors in a certain block. The planes PB0 to PB15 in this embodiment have the same configuration unless specifically mentioned otherwise. Details of the configuration of the planes PB will be described later.

The input/output circuit 22 exchanges the signal I/O<7:0> with the memory controller 10. The input/output circuit 22 transfers the command CMD and the address ADD in the signal I/O<7:0> to the register 24. Further, the input/output circuit 22 exchanges the write data and read data (data DAT) with the core unit 21.

The logic control circuit 23 receives the signals /CE, CLE, ALE, /WE, /RE and /WP from the memory controller 10. Further, the logic control circuit 23 transfers the signal /RB to the memory controller 10 to notify the status of the semiconductor memory device 20 to the outside.

The register 24 stores the command CMD and the address ADD. The address ADD includes a plane address that may identify the planes PB and a block address that may identify blocks in the planes PB. The register 24 transfers, for example, the address ADD and the command CMD to the sequencer 25.

The sequencer 25 receives a command set including the command CMD and the address ADD and controls the entire semiconductor memory device 20 according to a sequence based on the received command set. For example, the sequencer 25 may output a control signal CNT so as to control planes PB classified into a specific group GRP in synchronization to execute the data read operation, the data write operation or the data erase operation.

Based on an instruction from the sequencer 25, the voltage generation circuit 26 generates voltages necessary for the data write operation, the data read operation and the data erase operation. The voltage generation circuit 26 supplies the generated voltages to the driver set 27.

The driver set 27 includes plural drivers and supplies various voltages from the voltage generation circuit 26 to the core unit 21 based on addresses from the register 24.

1.1.4. Configuration of Register and Sequencer

Next, descriptions will be made on the configuration of the register and the sequencer of the semiconductor memory device according to the first embodiment.

Figure 3:
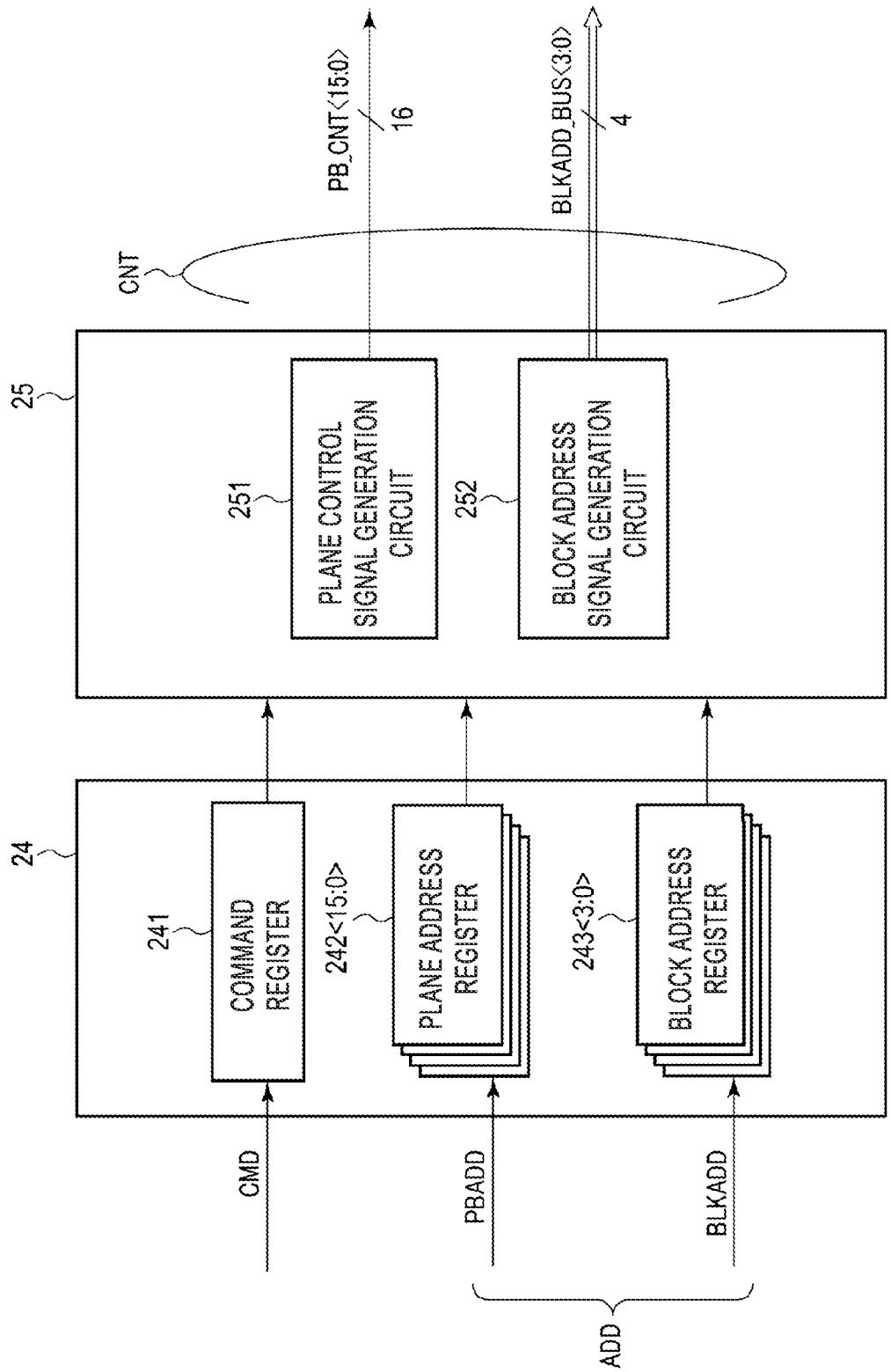
FIG. 3 is a schematic diagram for explaining the configuration of a register and a sequencer of the semiconductor memory device according to the first embodiment.

FIG. 3 is a schematic diagram for explaining the configuration of the register and the sequencer of the semiconductor memory device according to the first embodiment. FIG. 3 illustrates control signals CNT (signals PB_CNT<15:0> and BLKADD_BUS<3:0>) output from the sequencer 25 based on a command set (command CMD and address ADD) input to the register 24.

As illustrated in FIG. 3, the register 24 includes a command register 241, a plane address register 242<15:0> and a block address register 243<3:0>. The sequencer 25 includes a plane control signal generation circuit 251 and a block address signal generation circuit 252.

Upon receiving the command CMD from the input/output circuit 22m, the command register 241 temporarily stores the command CMD.

The plane address register 242<15:0> has, for example, a memory area capable of storing 16 bits, each corresponding to a plane PB in the core unit 21. That is, a plane address register 242<k> (0≤k≤15) has a function of temporarily storing a plane address PBADD indicating a plane PBk that has been received from the input/output circuit 22.

The block address register 243<3:0> has, for example, a function of temporarily storing four of block addresses BLKADD received from the input/output circuit 22.

In response to a request from the sequencer 25, the command register 241, the plane address register 242<15:0> and the block address register 243<3:0> transmit the stored information to the sequencer 25.

The plane control signal generation circuit 251 generates and outputs a signal PB_CNT<15:0> based on the information stored in the register 24. For example, the signal PB_CNT<15:0> is a signal output to 16 signal lines, each corresponding to one plane PB, and includes information indicating which plane PB is to be active.

The block address signal generation circuit 252 generates and outputs signals BLKADD_BUS<3:0> based on the information stored in the register 24. The signals BLKADD_BUS<3:0> are signals output to the four address buses, respectively, and each of the signals BLKADD_BUS<3:0> corresponds to, for example, a set PSET (not illustrated) including plural planes PB different from the above-described group GRP. The signal BLKADD_BUS<3:0> includes a block address BLKADD corresponding to a block to be operated in an active plane PB. It is assumed that the four address buses from which the signals BLKADD_BUS<3:0> are output each include plural signal lines, in which a specific block address BLKADD is specified by the plural signal lines.

Figure 4:
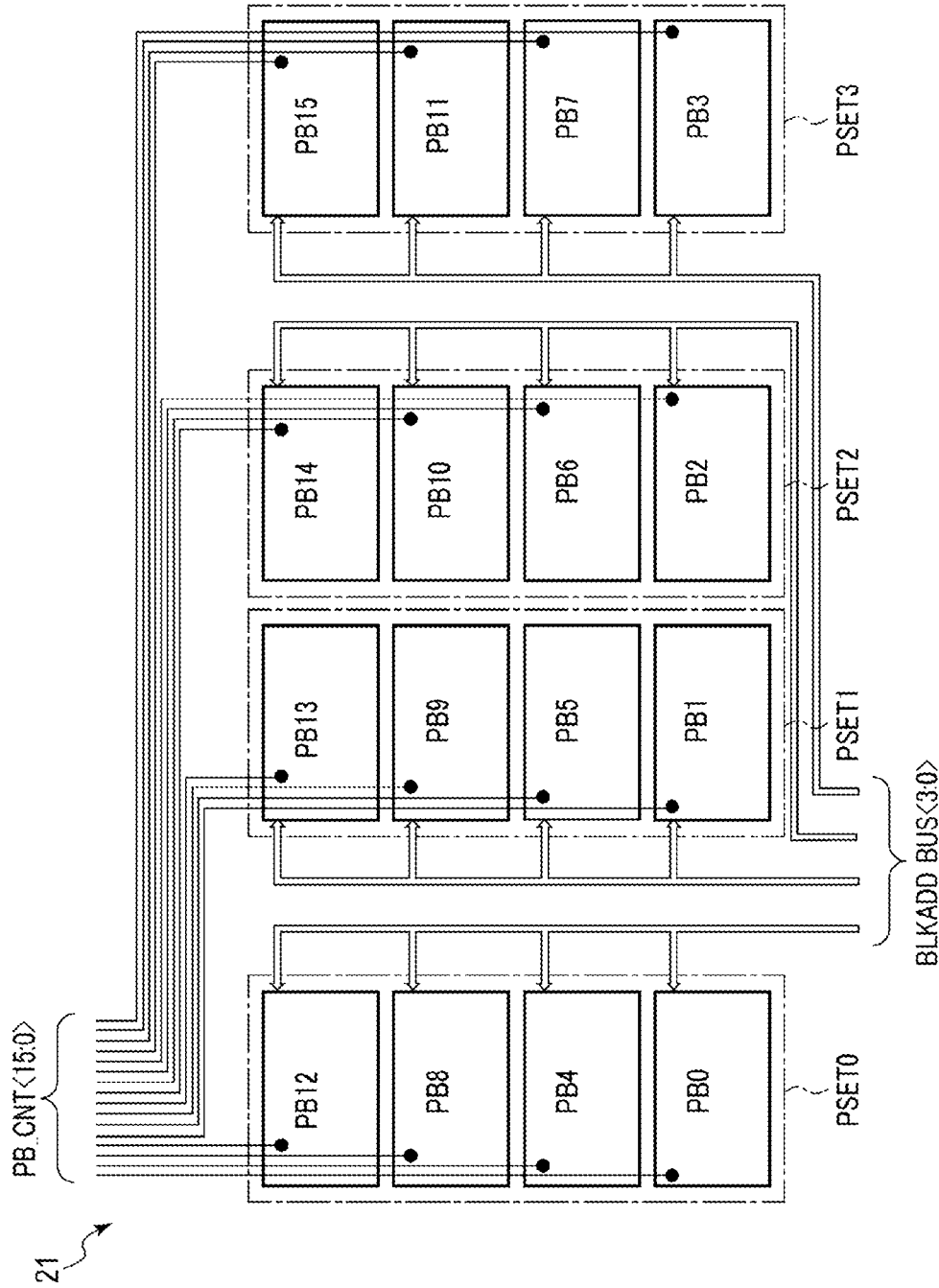
FIG. 4 is a schematic diagram that illustrates a connection relationship between a control signal output from a sequencer and a core unit in the semiconductor memory device according to the first embodiment.

FIG. 4 is a schematic diagram that illustrates a connection relationship between the control signals output from the sequencer and the core unit in the semiconductor memory device according to the first embodiment.

As illustrated in FIG. 4, the signals PB_CNT<15:0> are input to the respective corresponding planes PB. A case where a signal PB_CNT<k> is input to a plane PBk is illustrated in the example of FIG. 4. In addition, the signals BLKADD_BUS<3:0> are input to the respective corresponding sets PSET (PSET0 to PSET3). More specifically, for example, the signal BLKADD_BUS<0> is commonly input to the set PSET0 including the planes PB0, PB4, PB8 and PB12, and the signal BLKADD_BUS<1> is commonly input to the set PSET1 including the planes PB1, PB5, PB9 and PB13. In addition, the signal BLKADD_BUS<2> is commonly input to the set PSET2 including the planes PB2, PB6, PB10 and PB14, and the signal BLKADD_BUS<3> is commonly input to the set PSET3 including the planes PB3, PB7, PB11 and PB15.

1.1.5. Configuration of Plane

Next, descriptions will be made on the configuration of a plane of the semiconductor memory device according to the first embodiment.

Figure 5:
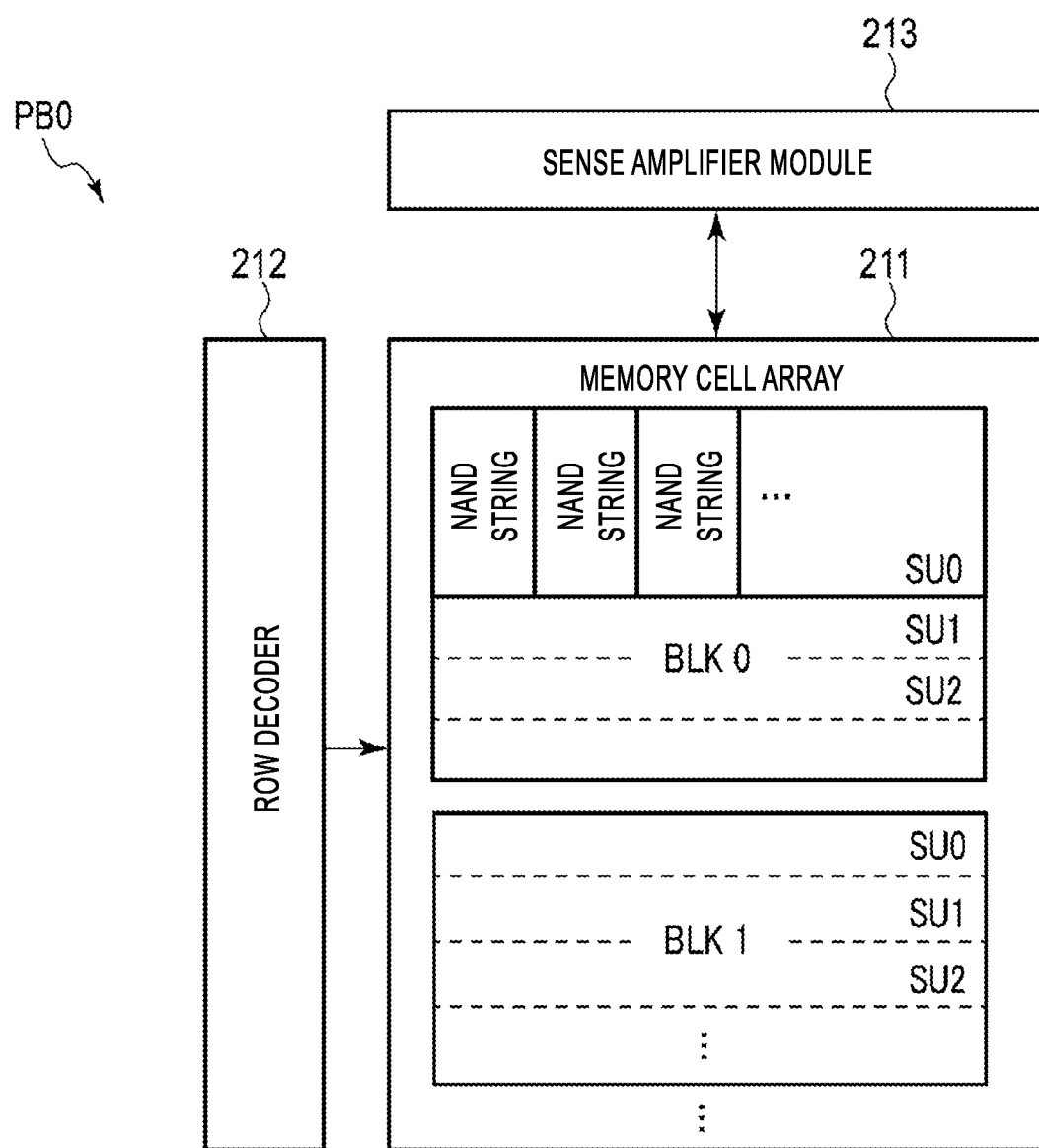
FIG. 5 is a block diagram of one plane in the semiconductor memory device according to the first embodiment.

FIG. 5 is a block diagram of one plane in the semiconductor memory device according to the first embodiment. While the plane PB0 is illustrated in FIG. 5 as an example, other planes PB have the same configuration.

As illustrated in FIG. 5, the plane PB0 includes a memory cell array 211, a row decoder 212 and a sense amplifier module 213.

The memory cell array 211 includes plural blocks BLK (BLK0, BLK1, . . . ). For planes PB other than the plane PB0, the memory cell array 211 includes blocks BLK corresponding to the same block address BLKADD as the plane PB0. Blocks BLK to which the same block address BLKADD is allocated among different planes PB are distinguished by specifying the plane address PBADD. Each block BLK includes plural nonvolatile memory cell transistors associated with word lines and bit lines (not illustrated). The block BLK is, for example, an unit of data erasure, which means that the data in the same block BLK are erased collectively. Each block BLK includes plural string units SU (SU0, SU1, . . . ). Each string unit SU has plural NAND strings NS. The number of blocks in the memory cell array 211, the number of string units in one block BLK and the number of NAND strings in one string unit SU may be set freely.

The row decoder 212 selects a block BLK or the like based on the block address BLKADD in the address ADD stored in the register 24. A voltage from the driver set 27 is transferred to the selected block BLK via the row decoder 212.

At the time of data reading, the sense amplifier module 213 reads data by sensing the threshold voltage of a memory cell transistor and transfers the read data to the input/output circuit 22. At the time of data writing, the sense amplifier module 213 controls the bit lines in accordance with the write data to be written to the memory cell transistors. In addition, the sense amplifier module 213 receives a column address in the address ADD from the register 24 and controls the bit lines based on the column address.

1.1.6. Configuration of Memory Cell Array

Figure 6:
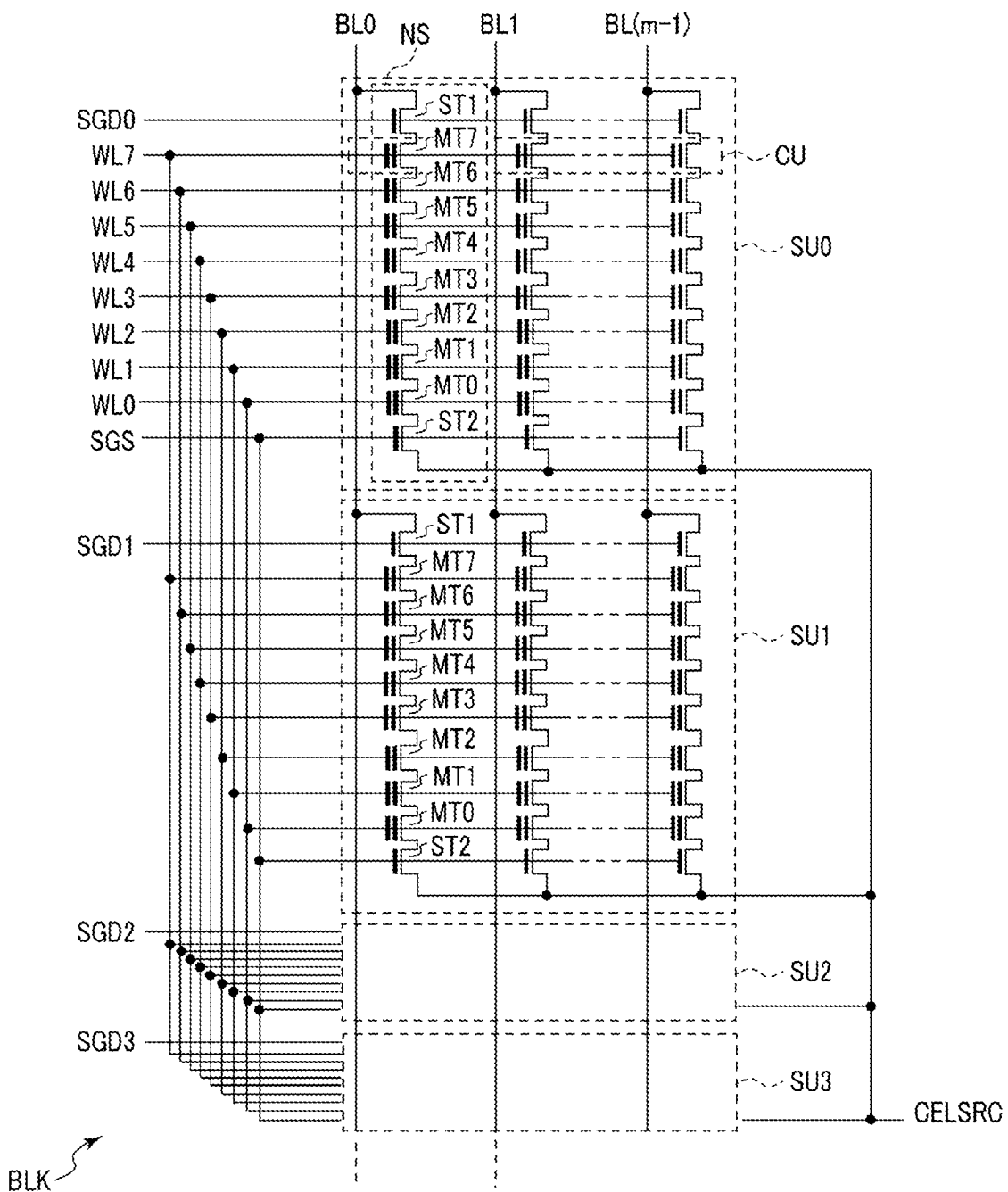
FIG. 6 is a circuit diagram for explaining the configuration of a memory cell array of the semiconductor memory device according to the first embodiment.

Next, descriptions will be made on the configuration of a memory cell array of the semiconductor memory device according to the first embodiment. FIG. 6 is an example of a circuit diagram for explaining the configuration of a memory cell array of the semiconductor memory device according to the first embodiment. FIG. 6 illustrates a circuit diagram of one block BLK in the memory cell array 211.

As illustrated in FIG. 6, each string unit SU includes a set of NAND strings NS. Each of the NAND strings NS includes, for example, 8 memory cell transistors MT (MT0 to MT7), a select transistor ST1 and a select transistor ST2. The number of memory cell transistors MT in one NAND string NS may be, but not limited to, 16, 32, 64, 96, or 128. Each memory cell transistor MT includes a stacked gate including a control gate and a charge storage layer. The memory cell transistors MT are connected in series between the select transistors ST1 and ST2. In the following description, the term "connection" also includes a case where another electrically conductive element is interposed therebetween.

In a certain block BLK, the gates of the select transistors ST1 of the string units SU0 to SU3 are connected to the select gate lines SGD0 to SGD3, respectively. The gates of the select transistors ST2 of all the string units SU in the block BLK are commonly connected to the select gate line SGS. The control gates of the memory cell transistors MT0 to MT7 in the same block BLK are connected to the word lines WL0 to WL7, respectively. That is, the word line WL having the same suffix is commonly connected to all the string units SU in the same block BLK, and the select gate line SGS is commonly connected to all the string units SU in the same block BLK. In the meantime, the select gate line SGD is connected to only one of the string units SU in the same block BLK.

Further, among the NAND strings NS arranged in the form of a matrix in the memory cell array 211, the other end of the select transistor ST1 of the NAND string NS in the same row is connected to one of m bit lines BL (BL0 to BL(m−1) (m is a natural number)). Further, the bit line BL is commonly connected to the NAND strings NS of the same column across plural blocks BLK.

The other end of the select transistor ST2 is connected to a source line CELSRC. The source line CELSRC is commonly connected to plural NAND strings NS across the plural blocks BLK.

As described above, the data erase is performed collectively, for example, for the memory cell transistors MT in the same block BLK. In the meantime, the data read operation and the data write operation may be performed collectively for plural memory cell transistors MT commonly connected to any one word line WL in any string unit SU of any one of the blocks BLK. Such a set of memory cell transistors MT that shares the word line WL in one string unit SU is referred to, for example, as a cell unit CU. In other words, the cell unit CU is a set of memory cell transistors MT that may collectively perform a write operation and a read operation.

One memory cell transistor MT may store, for example, multi-bit data. In the same cell unit CU, a set of one bit stored in the same bit position by each memory cell transistor MT is called a "page". In other words, the "page" may be defined as a portion of a memory space formed in a set of memory cell transistors MT in the same cell unit CU.

1.1.7. Configuration of Row Decoder

Figure 7:
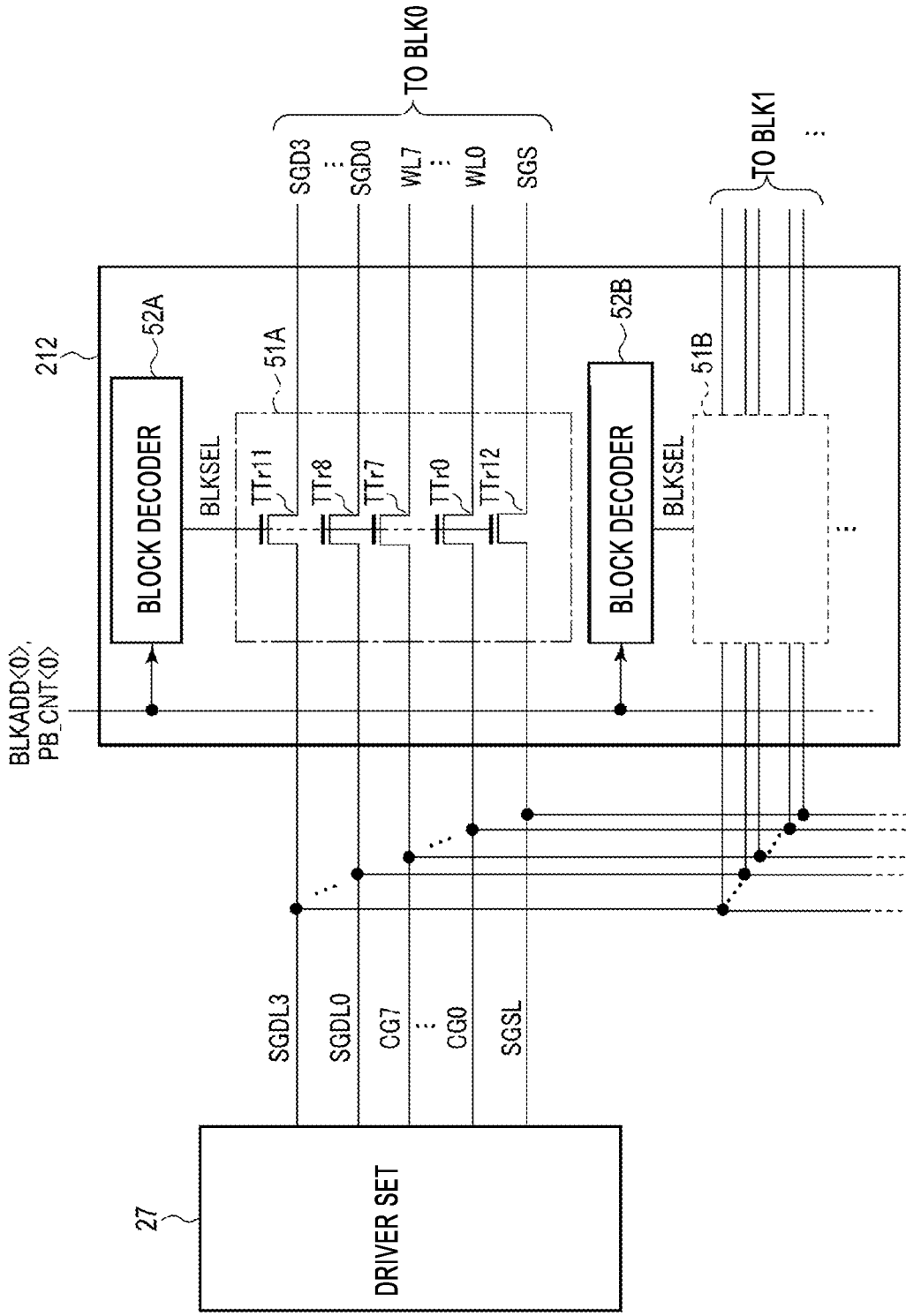
FIG. 7 is a circuit diagram for explaining the configuration of a row decoder of the semiconductor memory device according to the first embodiment.

Next, descriptions will be made on the configuration of a row decoder of the semiconductor memory device according to the first embodiment. FIG. 7 is a circuit diagram for explaining the configuration of a row decoder of the semiconductor memory device according to the first embodiment. The configuration of the row decoder 212 corresponding to the plane PB0 illustrated in FIG. 5 is illustrated in FIG. 7 as an example.

In the following description, a block BLK serving as a target for various operations such as the write operation, the read operation and the erase operation is referred to as a "selected block BLK", and a block BLK other than the selected block BLK is referred to as a "non-selected block BLK". Likewise, in the following description, the word "selected" may be used to describe an element targeted for various operations and the word "non-selected" may be used to describe an element not targeted for various operations, so that such elements may be distinguished from each other.

As illustrated in FIG. 7, the row decoder 212 includes plural transfer switch groups 51 (51A, 51B, . . . ) and plural block decoders 52 (52A, 52B, . . . ).

One transfer switch group 51 and one block decoder 52 are allocated, for example, for each block BLK. In the example of FIG. 7, the transfer switch group 51A and the block decoder 52A are allocated to the block BLK0, and the transfer switch group 51B and the block decoder 52B are allocated to the block BLK1.

The transfer switch group 51 includes, for example, 13 transfer transistors TTr (TTr0 to TTr12).

The transfer transistors TTr0 to TTr7 transfer voltages supplied from the driver set 27 to wirings CG (CG0 to CG7) to the word lines WL0 to WL7 of the selected block BLK, respectively. The transfer transistors TTr0 to TTr7 have respective first ends connected respectively to the word lines WL0 to WL7 of the corresponding block BLK, respective second ends connected respectively to the wirings CG0 to CG7, and respective gates commonly connected to a node BLKSEL.

The transfer transistors TTr8 to TTr11 transfer voltages supplied from the driver set 27 to wirings SGDL (SGDL0 to SGDL3) to the select gate lines SGD0 to SGD3 of the selected block BLK. The transfer transistors TTr8 to TTr11 have respective first ends connected respectively to the select gate lines SGD0 to SGD3 of the corresponding block BLK, respective second ends connected respectively to the wirings SGDL0 to SGDL3, and respective gates commonly connected to the node BLKSEL.

The transfer transistor TTr12 transfers a voltage supplied from the driver set 27 to a wiring SGSL to the select gate line SGS of the selected block BLK. The transfer transistor TTr12 includes a first end connected to the select gate line SGS of the corresponding block BLK, a second end connected to the wiring SGSL, and a gate connected to the node BLKSEL.

For example, the signals PB_CNT<0> and BLKADD_BUS<0> are commonly input to the block decoder 52 in the plane PB0. The block decoder 52 becomes active when its own plane PB is a selected plane PB, and becomes inactive when its own plane PB is a non-selected plane PB. The block decoder 52 of the selected plane PB decodes the signal BLKADD_BUS<0> received from the register 24 at the time of data write operation, data read operation and data erase operation.

As a result of the decoding, when determining that the block BLK corresponding to the block decoder 52 is a selected block BLK, the block decoder 52 outputs a signal of "H" level to the node BLKSEL. The signal output to the node BLKSEL turns on the transfer transistors TTr0 to TTr12 at an "H" level and turns off these transfer transistors at an "L" level.

Therefore, in the row decoder 212 in the selected plane PB, the transfer transistors TTr0 to TTr12 in the transfer switch group 51 corresponding to the selected block BLK may be turned on. As a result, in the selected block BLK in the selected plane PB, the word lines WL0 to WL7 are respectively connected to the wirings CG0 to CG7, the select gate lines SGD0 to SGD3 are respectively connected to the wirings SGDL0 to SGDL3, and the select gate line SGS is connected to the wiring SGSL.

In the meantime, when it is determined that the corresponding block BLK is not a selected block BLK, the block decoder 52 of the selected plane PB outputs a signal of "L" level to the node BLKSEL.

Therefore, in the row decoders 212 in the selected plane PB, the transfer transistors TTr0 to TTr12 in the transfer switch group 51 corresponding to the non-selected block BLK may be turned off. As a result, in the non-selected block BLK in the selected plane PB, the word lines WL are electrically disconnected from the wirings CG, and the select gate lines SGD and SGS are electrically disconnected from the wirings SGDL and SGSL, respectively.

In addition, the block decoder 52 of the non-selected plane PB becomes inactive regardless of whether the corresponding block BLK is a selected block BLK or a non-selected block BLK, and outputs a signal of "L" level to the node BLKSEL.

Therefore, the transfer transistors TTr0 to TTr12 in the transfer switch group 51 of the row decoder 212 in the non-selected plane PB may be turned off. As a result, in all the blocks BLK in the non-selected plane PB, the word lines WL are electrically disconnected from the wirings CG, and the select gate lines SGD and SGS are electrically disconnected from the wirings SGDL and SGSL, respectively.

The driver set 27 supplies voltages to the wirings CG, SGDL and SGSL according to an address ADD received from the register 24. The wirings CG, SGDL and SGSL transfer various voltages supplied from the driver set 27 to each of the transfer switch groups 51A, 51B, . . . . That is, the voltages supplied from the driver set 27 are transferred to the word lines WL and the select gate lines SGD and SGS in the selected block BLK via the transfer transistors TTr0 to TTr12 in the transfer switch group 51 corresponding to the selected block BLK.

Figure 8:
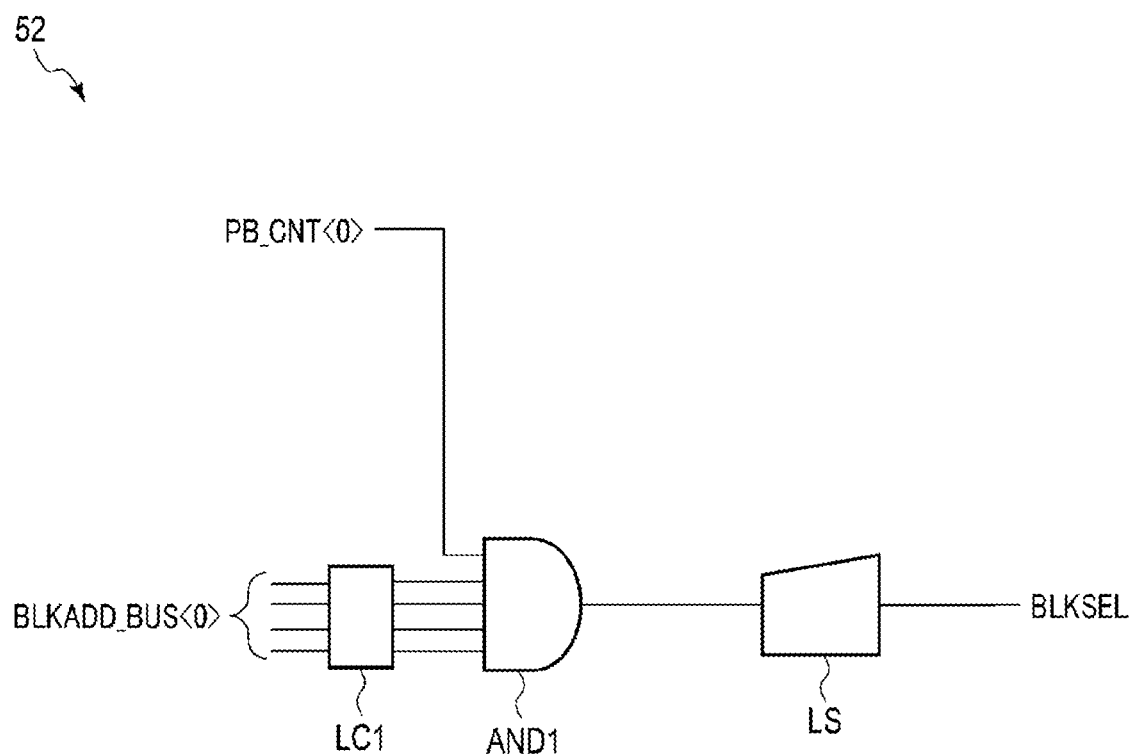
FIG. 8 is a circuit diagram for explaining the configuration of a block decoder of the semiconductor memory device according to the first embodiment.

FIG. 8 is a circuit diagram for explaining the configuration of a block decoder of the semiconductor memory device according to the first embodiment. An example of the configuration of the block decoder 52 in the plane PB0 illustrated in FIG. 7 is illustrated in FIG. 8.

As illustrated in FIG. 8, the block decoder 52 includes logic circuits LC1 and AND1 and a level shifter LS.

The logic circuit LC1 includes input terminals to which the signal BLKADD_BUS<0> is supplied by plural signal lines and output terminals connected to a first input terminal of the logic circuit AND1. The logic circuit LC1 has different configurations for different block decoders 52 according to a corresponding block BLK.

Specifically, for example, when the block address BLKADD of the block BLK0 is supplied from the signal BLKADD_BUS<0> to the logic circuit LC1 in the block decoder 52A corresponding to the block BLK0, the logic circuit LC1 is configured to output a signal of "H" level to all of the output terminals. When a block address BLKADD other than the block BLK0 is supplied from the signal BLKADD_BUS<0>, the logic circuit LC1 in the block decoder 52A is configured to output a signal of "L" level to at least one of the output terminals.

Further, for example, when the block address BLKADD of the block BLK1 is supplied from the signal BLKADD_BUS<0> to the logic circuit LC1 in the block decoder 52B corresponding to the block BLK1, the logic circuit LC1 is configured to output a signal of "H" level to all of the output terminals. When a block address BLKADD other than the block BLK1 is supplied from the signal BLKADD_BUS<0>, the logic circuit LC1 in the block decoder 52B is configured to output a signal of "L" level to at least one of the output terminals.

In the following description, the case where the logic circuit LC1 outputs an "H" level signal at all of the output terminals is referred to as "the block address BLKADD hits."

The logic circuit AND1 is a logical product (AND) circuit that includes a first input terminal connected to the output terminals of the logic circuit LC1, a second input terminal supplied with the signal PB_CNT<0>, and an output terminal connected to an input terminal of the level shifter LS. The logic circuit AND1 outputs an "H" level when an "H" level is input to both of the first input terminal and the second input terminal, and outputs an "L" level when an "L" level is input to at least one of the first input terminal and the second input terminal. For example, the signal PB_CNT<0> has an "H" level when the corresponding plane PB0 is a selected plane PB, and has an "L" level when the corresponding plane PB0 is a non-selected plane PB.

When a signal of "H" level is input to the input terminal of the level shifter LS, the level shifter LS amplifies the input signal and outputs the obtained signal of "H" level to the node BLKSEL. Further, when a signal of "L" level is input to the input terminal of the level shifter LS, the level shifter LS outputs the signal of "L" level to the node BLKSEL.

With the above configuration, the block decoder 52 corresponding to the block BLK of the plane PB0 may output a signal of "H" level when the plane PB0 is selected and the signal BLKADD_BUS<0> hits, and a signal of "L" level when the signal BLKADD_BUS<0> does not hit, to the node BLKSEL. In addition, when the plane PB0 is a non-selected plane or the signal BLKADD_BUS<0> does not hit, the block decoder 52 corresponding to the block BLK of the plane PB0 may output a signal of "L" level to the node BLKSEL.

1.2. Synchronous Operation of Plural Planes

Next, descriptions will be made on a synchronous operation of plural planes in the semiconductor memory device according to the first embodiment.

1.2.1. Command Sequence

Figure 9:
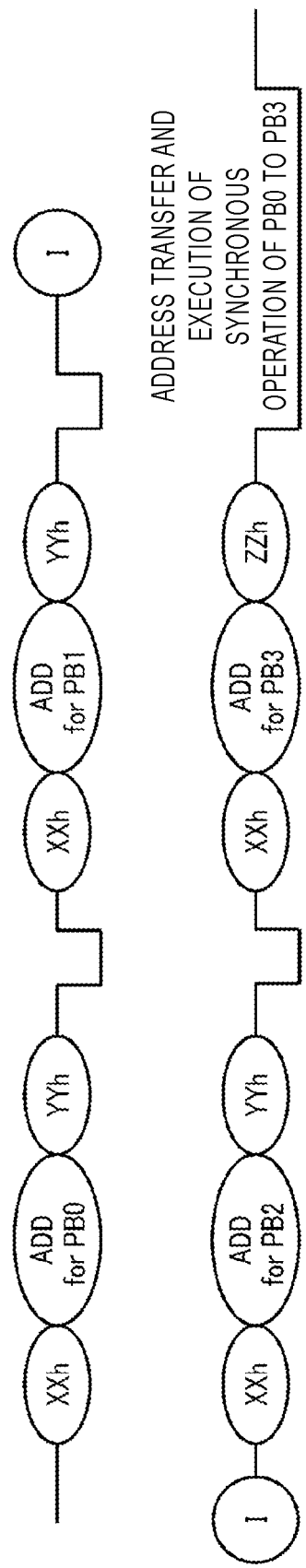
FIG. 9 is a command sequence for explaining a synchronous operation of plural planes in the semiconductor memory device according to the first embodiment.

FIG. 9 illustrates a command sequence for explaining a synchronous operation of plural planes in the semiconductor memory device according to the first embodiment. A command sequence in a case where the planes PB0 to PB3 in the group GRP0 among the planes PB0 to PB15 are controlled in synchronization is illustrated in FIG. 9, as an example.

As illustrated in FIG. 9, the memory controller 10 first issues a command set to the plane PB0 and transmits the command set to the semiconductor memory device 20.

More specifically, the memory controller 10 issues a command "XXh" and transmits the command "XXh" to the semiconductor memory device 20. The command "XXh" is a command issued when designating an address ADD to be subjected to various operations such as a read operation of data from the semiconductor memory device 20 or a write operation of data in the semiconductor memory device 20.

The memory controller 10 issues an address ADD, for example, over five cycles and transmits the address ADD to the semiconductor memory device 20. The address ADD includes a plane address PBADD of the plane PB0, and a block address BLKADD of a block BLK selected in the plane PB0 (hereinafter, also referred to as a block address BLKADD for plane PB0). The address ADD may be issued by any number of cycles without being limited to 5 cycles.

The memory controller 10 issues a command "YYh" and transmits the command "YYh" to the semiconductor memory device 20. According to the command "YYh", the sequencer sets the signal /RB to an "L" level and causes the register 24 to store a command set received immediately before. More specifically, information indicating that the plane PB0 is selected and the block address BLKADD for plane PB0 are stored in the plane address register 242<0> and the block address register 243<0>, respectively. After the storage of the command set is completed, the sequencer 25 sets the signal /RB to an "H" level and informs the memory controller 10 that the semiconductor memory device 20 is in a ready state. When the operation instructed by the above command sequence is a write operation, for example, before the command "YYh" (or a command "ZZh" to be described later), the memory controller 10 transmits data to be written in the semiconductor memory device 20 at the time of the write operation, to the semiconductor memory device 20.

Subsequently, the memory controller 10 issues a command set (i.e., a command "XXh", an address ADD over five cycles and a command "YYh") to the plane PB1 and transmits the command set to the semiconductor memory device 20. Here, the address ADD includes a plane address PBADD of the plane PB1, and a block address BLKADD for the plane PB1. The sequencer 25 sets the signal /RB to an "L" level and stores information indicating that the plane PB1 is selected and the block address BLKADD for the plane PB1 in the plane address register 242<1> and the block address register 243<1>, respectively. After the storage of the command set is completed, the sequencer 25 sets the signal /RB to an "H" level and informs the memory controller 10 that the semiconductor memory device 20 is in a ready state.

Subsequently, the memory controller 10 issues a command set (i.e., a command "XXh", an address ADD over five cycles and a command "YYh") to the plane PB2 and transmits the command set to the semiconductor memory device 20. Here, the address ADD includes a plane address PBADD of the plane PB2, and a block address BLKADD for the plane PB2. The sequencer 25 sets the signal /RB to an "L" level and stores information indicating that the plane PB2 is selected and the block address BLKADD for the plane PB2 in the plane address register 242<2> and the block address register 243<2>, respectively. After the storage of the command set is completed, the sequencer 25 sets the signal /RB to an "H" level and informs the memory controller 10 that the semiconductor memory device 20 is in a ready state.

Subsequently, the memory controller 10 issues a command set (i.e., a command "XXh", an address ADD over five cycles and a command "ZZh") to the plane PB3 and transmits the command set to the semiconductor memory device 20. Here, the address ADD includes a plane address PBADD of the plane PB3, and a block address BLKADD for the plane PB3. The sequencer 25 sets the signal /RB to an "L" level and stores information indicating that the plane PB3 is selected and the block address BLKADD for the plane PB3 in the plane address register 242<3> and the block address register 243<3>, respectively. Upon receiving the command "ZZh", after the storage of the command set is completed, the sequencer 25 executes the operations of the planes PB0 to PB3 in synchronization based on the information of the command CMD and the address ADD stored in the register 24. After the completion of the operations, the sequencer 25 sets the signal /RB to an "H" level and informs the memory controller 10 that the semiconductor memory device 20 is in a ready state.

Thus, the synchronous operation of the planes PB0 to PB3 is completed.

When the above-described synchronous operation is a write operation, for example, commands "80h", "11h" and "10h" may correspond to the commands "XXh", "YYh" and "ZZh", respectively. When the above-described synchronous operation is a read operation, for example, commands "00h", "32h" and "30h" may correspond to the commands "XXh", "YYh" and "ZZh", respectively. However, these specific commands are merely examples and the present disclosure is not limited thereto.

The block addresses BLKADD set for the planes PB0 to PB3 may be different from each other. That is, the planes PB0 to PB3 may execute the synchronous operations on different blocks BLK.

1.2.2. Timing Chart

Figure 10:
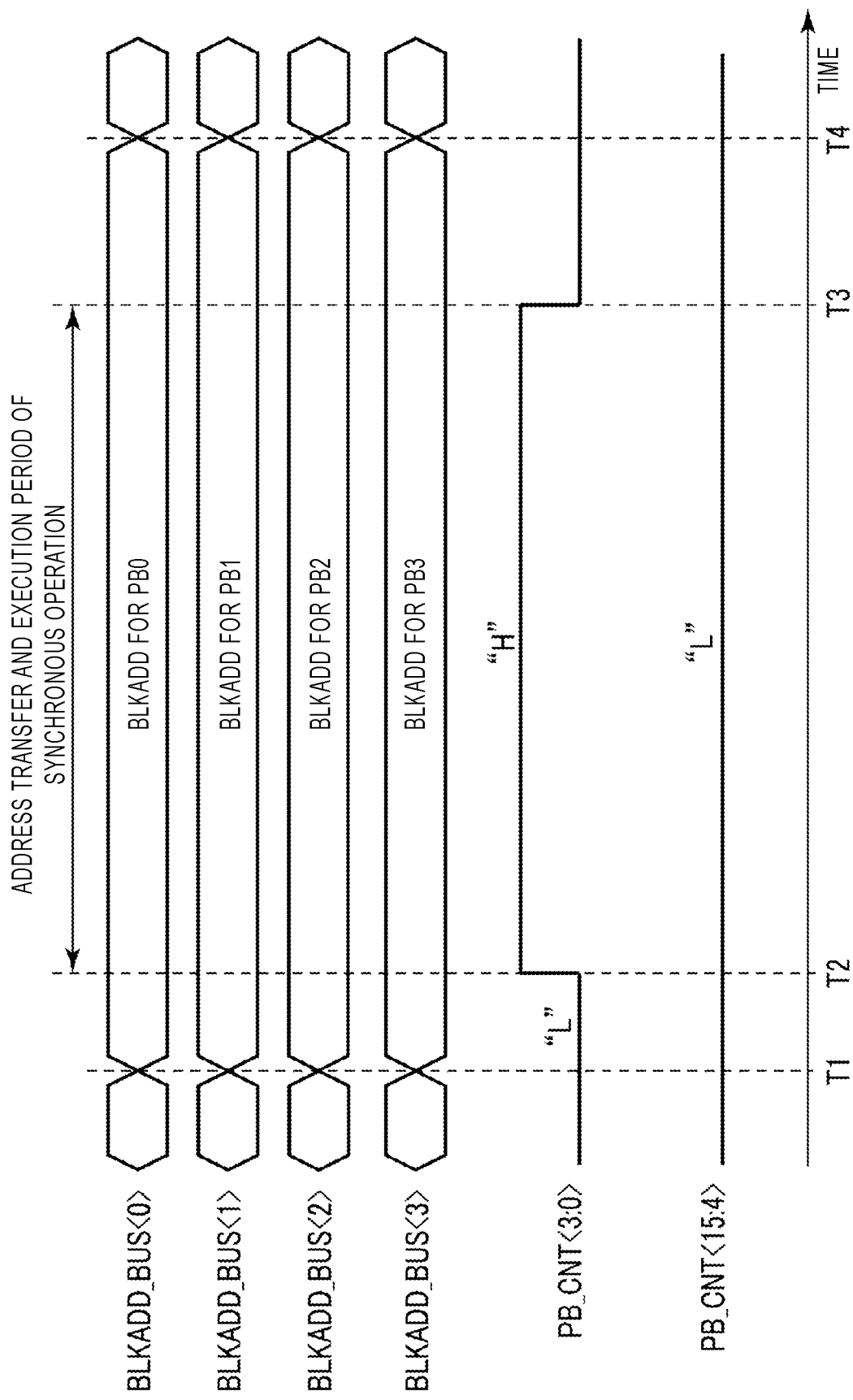
FIG. 10 is a timing chart for explaining a synchronous operation of plural planes in the semiconductor memory device according to the first embodiment.

FIG. 10 is a timing chart for explaining a synchronous operation of plural planes in the semiconductor memory device according to the first embodiment. An example of the control signals CNT generated by the sequencer 25 according to the command sequence illustrated in FIG. 9 is illustrated in FIG. 10.

As illustrated in FIG. 10, at time T1, the block address signal generation circuit 252 generates the signals BLKADD_BUS<0> to BLKADD_BUS<3> including the block address BLKADD for the plane PB0, BLKADD for the plane PB1, BLKADD for the plane PB2, and the block address BLKADD for the plane PB3, respectively. The generated signals BLKADD_BUS<0> to BLKADD_BUS<3> are transferred to the sets PSET0 to PSET3 each including 4 planes PB.

For example, the block address BLKADD for the plane PB0 is transferred to each of the planes PB0, PB4, PB8 and PB12 in the set PSET0. Here, from the block address BLKADD itself, although it is possible to specify a block in each plane, it is not possible to distinguish which plane is targeted. Therefore, the block address BLKADD for the plane PB0 hits in the corresponding block decoder 52 in each of the planes PB0, PB4, PB8 and PB12 in the set PSET0. However, at time T1, since the signals PB_CNT<15:0> are at the "L" level, none of the block decoders 52 hit by the block address BLKADD for the plane PB0 outputs a signal of "H" level to the node BLKSEL. The same operation is performed for the other sets PSET1 to PSET3.

Subsequently, at time T2, the plane control signal generation circuit 251 sets the signals PB_CNT<3:0> to an "H" level. Among the signals PB_CNT<3:0>, a signal supplied into the set PSET0 is only the signal PB_CNT<0> connected to the plane PB0. As a result, among the planes PB0, PB4, PB8 and PB12 in the set PSET0, only the logic circuit AND1 of the block decoder 52 provided in the plane PB0 outputs an "H" level. Therefore, the selected block BLK in the plane PB0 is in a selected state and a predetermined operation is executed. Similarly, only the logic circuits AND1 of the block decoders 52 provided in the plane PB1 in the set PSET1, the plane PB2 in the set PSET2 and the plane PB3 in the set PSET3 output an "H" level according to the remaining signals PB_CNT<3:1>, respectively. Therefore, the selected blocks BLK in the planes PB1 to PB3 are in a selected state and a predetermined operation is executed in synchronization with the plane PB0.

Subsequently, at time T3, the plane control signal generation circuit 251 sets the signals PB_CNT<3:0> to an "L" level. As a result, the selected blocks BLK in the planes PB0 to PB3 enters a non-selected state and the execution period of the synchronous operation is ended.

Subsequently, at time T4, the block address signal generation circuit 252 ends the transfer of the block addresses BLKADD for the planes PB0 to PB3. Thus, the synchronous operation of the plural planes is ended.

1.3. Effects of the Present Embodiment

According to the first embodiment, it is possible to prevent an increase in circuit area and wiring area of the semiconductor memory device capable of operating plural planes PB in synchronization. This effect will be described below.

The signals BLKADD_BUS<3:0> are supplied to the memory cell array 211 including the plural planes PB0 to PB15 via the four signal lines. The signals BLKADD_BUS<3:0> are supplied to the sets PSET0 to PSET3 of the planes PB, respectively. Further, the sequencer 25 may select the planes PB0 to PB15 independently from each other by using the signals PB_CNT<15:0>. Upon receiving command sets (a set including the command "XXh", the address ADD and the command "YYh" and a set of the command "XXh", the address ADD and the command "ZZh"), the sequencer 25 executes the synchronous operation on the planes PB in a specific group GRP. That is, the sequencer 25 simultaneously transfers the block addresses BLKADD for the planes PB0 to PB3 to the planes PB0 to PB3 via the signals BLKADD_BUS<3:0>, respectively, and uses the signals PB_CNT<3:0> to select the planes PB0 to PB3 at the same time. This makes it possible to reduce the number of signal lines for supplying the signals BLKADD_BUS and the size of the block address register 243.

In addition, the memory cell array 211 is divided into plural planes PB from the viewpoint of controlling the capacitance of the wirings such as the bit lines BL and the word lines WL connected to the memory cell transistor MT. In general, the plural planes PB are designed so that all the planes PB may be operated in synchronization. However, as the number of planes PB increases with the increase in storage capacity, the number of signal lines that supply the control signals CNT necessary for synchronous operation to the planes PB increases and the number of block address registers 243 that store the block addresses BLKADD for the planes PB increases.

Specifically, in the first embodiment, descriptions have been made on the configuration of transferring the block addresses BLKADD for the plural planes PBs at the same time and executing the synchronous operation simultaneously with the transfer. In such a configuration, in a first comparative example, the signals BLKADD_BUS may be individually supplied to 16 planes PB via 16 signal lines, respectively. In addition, the block address register 243 may be configured to store 16 block addresses BLKADD. Therefore, in the first comparative example, the circuit area and the wiring area of the sequencer 25 and the register 24 are enlarged.

In contrast, in the first embodiment, the number of planes that may be operated in synchronization is kept low (e.g., to 4) with respect to the number of (e.g., 16) planes in the memory cell array 211. As a result, the number of signals BLKADD_BUS to be supplied may be reduced from 16 to 4, and the number of block address registers 243 may be reduced from 16 to 4. Therefore, an increase in the circuit area and the wiring area can be prevented.

1.4. Modifications

In the first embodiment, descriptions have been made on the case where the block addresses BLKADD to be selected are individually allocated to the plural planes PB that execute the operations in synchronization. The present disclosure is not limited thereto. For example, the plural planes PB may be regarded as one virtual plane and the block addresses BLKADD to be selected may be commonly allocated to the one virtual plane. Then, plural such virtual planes may be set and execute the operations in synchronization. In the following description, the explanation on the same configuration and operation as those of the first embodiment will not be repeated for the sake of simplicity, and the configuration and operation different from those of the first embodiment will mainly be described.

1.4.1. Configuration of Register and Sequencer

Figure 11:
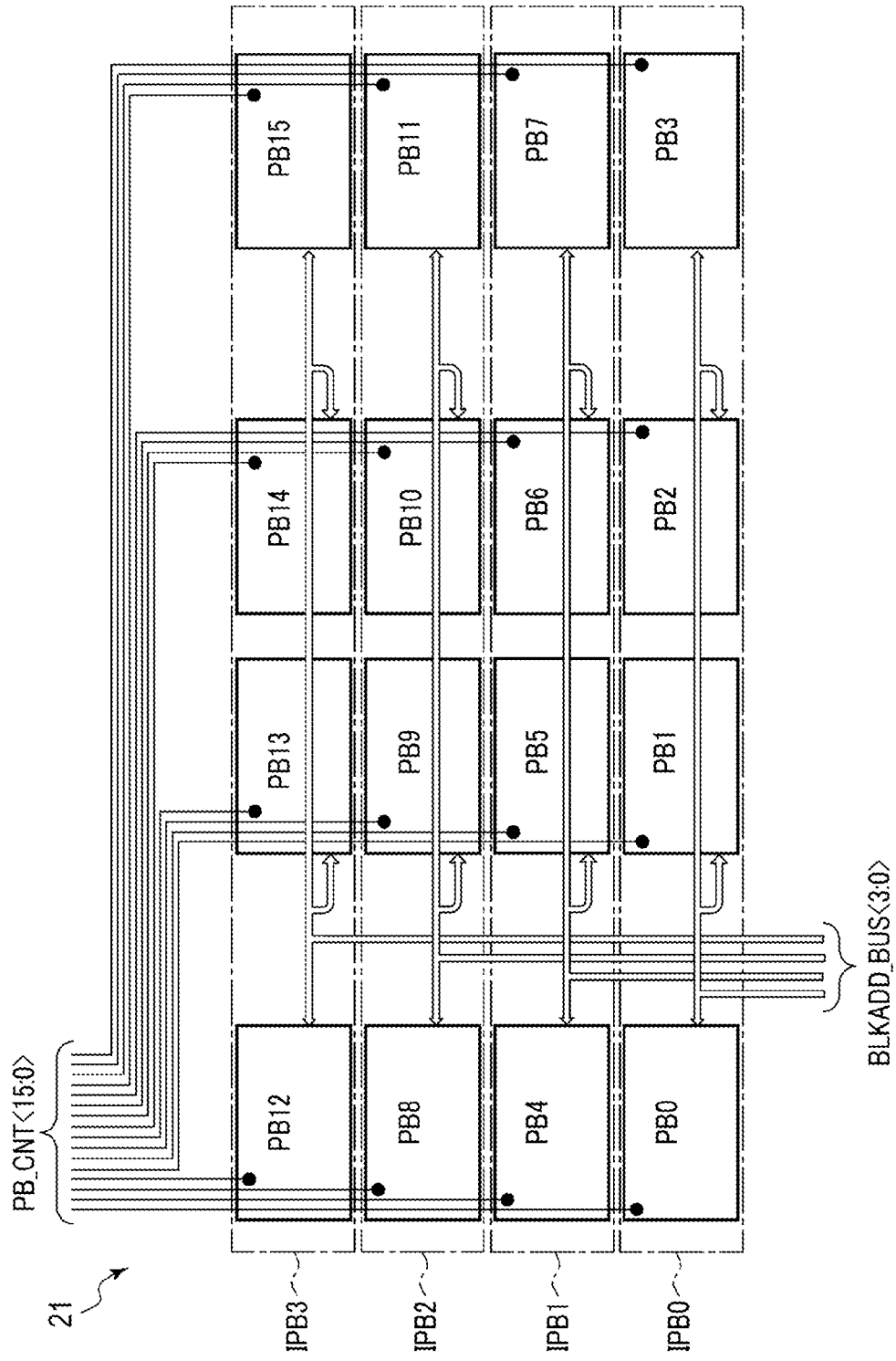
FIG. 11 is a schematic view for explaining a connection relationship between a control signal output from a sequencer and a core unit in a semiconductor memory device according to a modification of the first embodiment.

FIG. 11 is a schematic diagram that illustrates a connection relationship between control signals output from a sequencer and a core unit in a semiconductor memory device according to a modification of the first embodiment. FIG. 11 corresponds to FIG. 4 described in the first embodiment.

As illustrated in FIG. 11, the planes PB0 to PB15 are classified into 4 virtual planes IPB (IPB0 to IPB3). Specifically, the virtual plane IPB0 includes the planes PB0 to PB3, the virtual plane IPB1 includes the planes PB4 to PB7, the virtual plane IPB2 includes the planes PB8 to PB11, and the virtual plane IPB3 includes the planes PB12 to PB15. The virtual planes IPB are configured to be virtually operated like one plane PB when various signal lines are connected as described below.

Specifically, the signals BLKADD_BUS<3:0> are input to the corresponding virtual planes IPB0 to IPB3, respectively. More specifically, for example, the signal BLKADD_BUS<0> is commonly input to the planes PB0 to PB3 in the virtual plane IPB0, the signal BLKADD_BUS<1> is commonly input to the planes PB4 to PB7 in the virtual plane IPB1, the signal BLKADD_BUS<2> is commonly input to the planes PB8 to PB11 in the virtual plane IPB2, and the signal BLKADD_BUS<3> is commonly input to the planes PB12 to PB15 in the virtual plane IPB3.

As in the case of FIG. 4, a signal PB_CNT<k> is input to a plane PBk.

1.4.2. Synchronous Operation of Plural Planes

Figure 12:
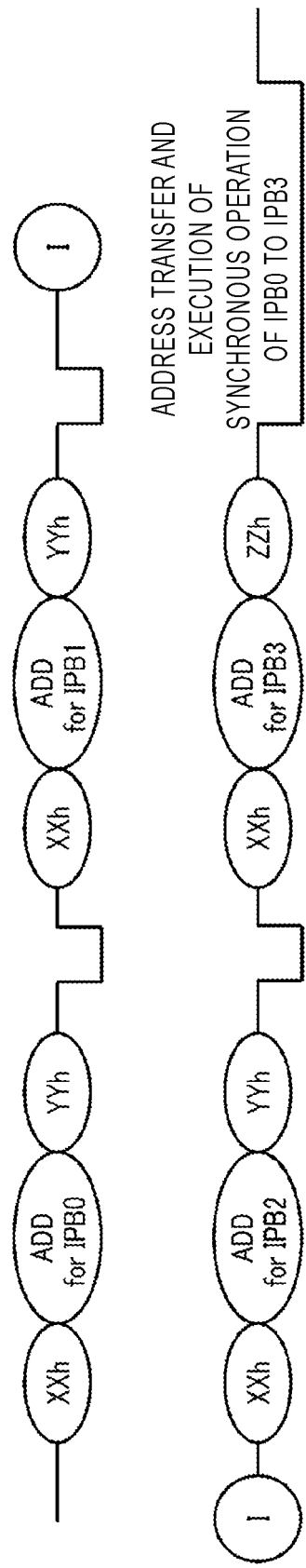
FIG. 12 is a command sequence for explaining a synchronous operation of plural planes in the semiconductor memory device according to the modification of the first embodiment.

Next, descriptions will be made on a synchronous operation of plural planes in the semiconductor memory device according to the modification of the first embodiment. FIG. 12 illustrates a command sequence for explaining a synchronous operation of plural planes in the semiconductor memory device according to the modification of the first embodiment. FIG. 12 corresponds to FIG. 9 in the first embodiment.

As illustrated in FIG. 12, the command sequence of the synchronous operation of plural planes in this modification is different from that of FIG. 9 in terms of an address ADD issued from the memory controller 10.

Specifically, the memory controller 10 issues a command set (i.e., a command "XXh", an address ADD over five cycles, and a command "YYh") to the virtual plane IPB0 and transmits the command set to the semiconductor memory device 20. Here, the address ADD includes a plane address PBADD that may commonly select the planes PB0 to PB3 in the virtual plane IPB0 (hereinafter, referred to as a plane address PBADD for the virtual plane IPB0) and a block address BLKADD of a block BLK commonly selected in the planes PB0 to PB3 in the virtual plane IPB0 (hereinafter, referred to as a block address BLKADD for the virtual plane IPB0). The sequencer 25 sets the signal /RB to an "L" level and stores information indicating that the virtual plane IPB0 is selected and the block address BLKADD for the virtual plane IPB0 in the plane address register 242<0> and the block address register 243<0>, respectively. After the storage of the command set is completed, the sequencer 25 sets the signal /RB to an "H" level and informs the memory controller 10 that the semiconductor memory device 20 is in a ready state.

Similarly, the memory controller 10 issues an address ADD including the block addresses PBADD for the virtual planes IPB1 to IPB3 and the block addresses BLKADD for the virtual planes IPB1 to IPB3 when issuing the command set to the virtual plains IPB1 to IPB3. The sequencer 25 sets the signal /RB to an "L" level and stores information that the virtual planes IPB1 to IPB3 are selected and the block addresses BLKADD for the virtual plains IPB1 to IPB3 in the plane address registers 242<3:1> and the block address registers 243<3:1>, respectively.

Upon receiving the command "ZZh", the sequencer 25 executes the operations of the virtual planes IPB0 to IPB3 in synchronization based on the information of the command CMD and the address ADD stored in the register 24. After the operation is completed, the sequencer 25 sets the signal /RB to an "H" level and informs the memory controller 10 that the semiconductor memory device 20 is in a ready state.

Thus, the synchronous operation of the virtual planes IPB0 to IPB3 is ended.

Figure 13:
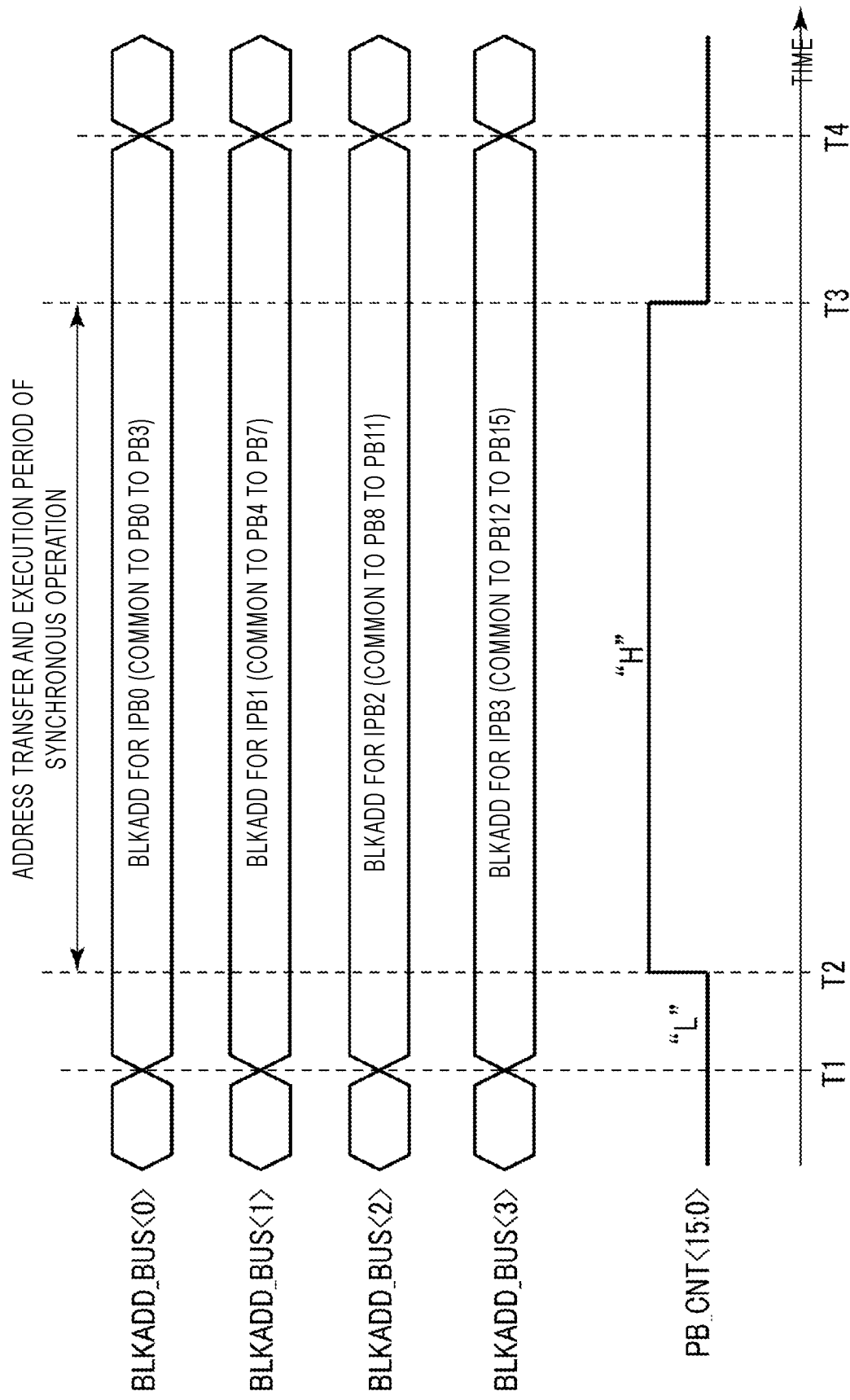
FIG. 13 is a timing chart for explaining a synchronous operation of plural planes in the semiconductor memory device according to the modification of the first embodiment.

FIG. 13 is a timing chart for explaining the synchronous operation of plural planes in the semiconductor memory device according to the modification of the first embodiment. FIG. 13 corresponds to FIG. 10 in the first embodiment and illustrates an example of the control signals CNT generated by the sequencer 25 according to the command sequence illustrated in FIG. 9.

As illustrated in FIG. 13, at time T1, the block address signal generation circuit 252 generates the signals BLKADD_BUS<0> to BLKADD_BUS<3> including the block addresses BLKADD for the virtual planes IPB0 to IPB3, respectively. The generated signals BLKADD_BUS<0> to BLKADD_BUS<3> are transferred to the virtual planes IPB0 to IPB3 each including four planes PB, respectively.

For example, in each of the planes PB0 to PB3 in the virtual plane IPB0, the block address BLKADD for the virtual plane IPB0 hits in a specific block decoder 52. However, at time T1, since the signals PB_CNT<15:0> have the "L" Level, none of the block decoders 52 hit by the block address BLKADD for the virtual plane IPB0 outputs a signal of "H" level to the node BLKSEL. The same operation is performed for the other virtual planes IPB1 to IPB3.

Subsequently, at time T2, the plane control signal generation circuit 251 sets the signals PB_CNT<15:0> to an "H" level. As a result, the logic circuits AND1 of the block decoders 52 provided in all the planes PB0 to PB15 output an "H" level. Therefore, a selected block BLK corresponding to each of the virtual planes IPB0 to IPB3 is in a selected state and a predetermined synchronous operation is executed.

Subsequently, at time T3, the plane control signal generation circuit 251 sets the signals PB_CNT<15:0> to an "L" level. As a result, a selected block BLK corresponding to each of the virtual planes IPB0 to IPB3 enters a non-selected state and the execution period of the synchronous operation is ended.

Subsequently, at time T4, the block address signal generation circuit 252 ends the transfer of the block addresses BLKADD for the virtual planes IPB0 to IPB3. Thus, the synchronous operation of the plural virtual planes IPB is completed.

1.4.3. Effects of this Modification

According to this modification, 16 planes PB are operated in synchronization as four virtual planes IPB. As a result, in one virtual plane IPB, under the condition that the block BLK corresponding to the same block address BLKADD is selected, the synchronous operation may be implemented by four block address registers 243 and four signal lines for the signals BLKADD_BUS. Therefore, an increase in circuit area and wiring area can be prevented.

With the configuration as in this modification, for example, the following operation may be applied. That is, when there is a write command to plural pages (e.g., four pages) for one cell unit CU from the memory controller 10, the semiconductor memory device 20 may write data of one page in each of the four planes PB0 to PB3 in the virtual plane IPB0. This operation may disperse the number of accesses to one memory cell transistor MT, thereby reducing the time required for write operation. In addition, even when the memory cell array 211 cannot store data of two or more pages in one cell unit CU, the memory controller 10 may dispersedly write data of plural pages in the plural planes PB according to a write instruction to the virtual planes IPB.

2. Second Embodiment

In the first embodiment, descriptions have been made for the case where the block address BLKADD transferred to the block decoder 52 is input to the logic circuit AND1 immediately (e.g., without requiring a clock input). However, the present disclosure is not limited thereto. A second embodiment is different from the first embodiment in that the block decoder 52 has a register capable of temporarily storing the transferred block address BLKADD. In the following description, the explanation on the same configuration and operation as those of the first embodiment will not be repeated for the sake of simplicity, and the configuration and operation different from those of the first embodiment will be mainly described.

2.1. Configuration

First, the configuration of a semiconductor memory device according to the second embodiment will be described.

Figure 14:
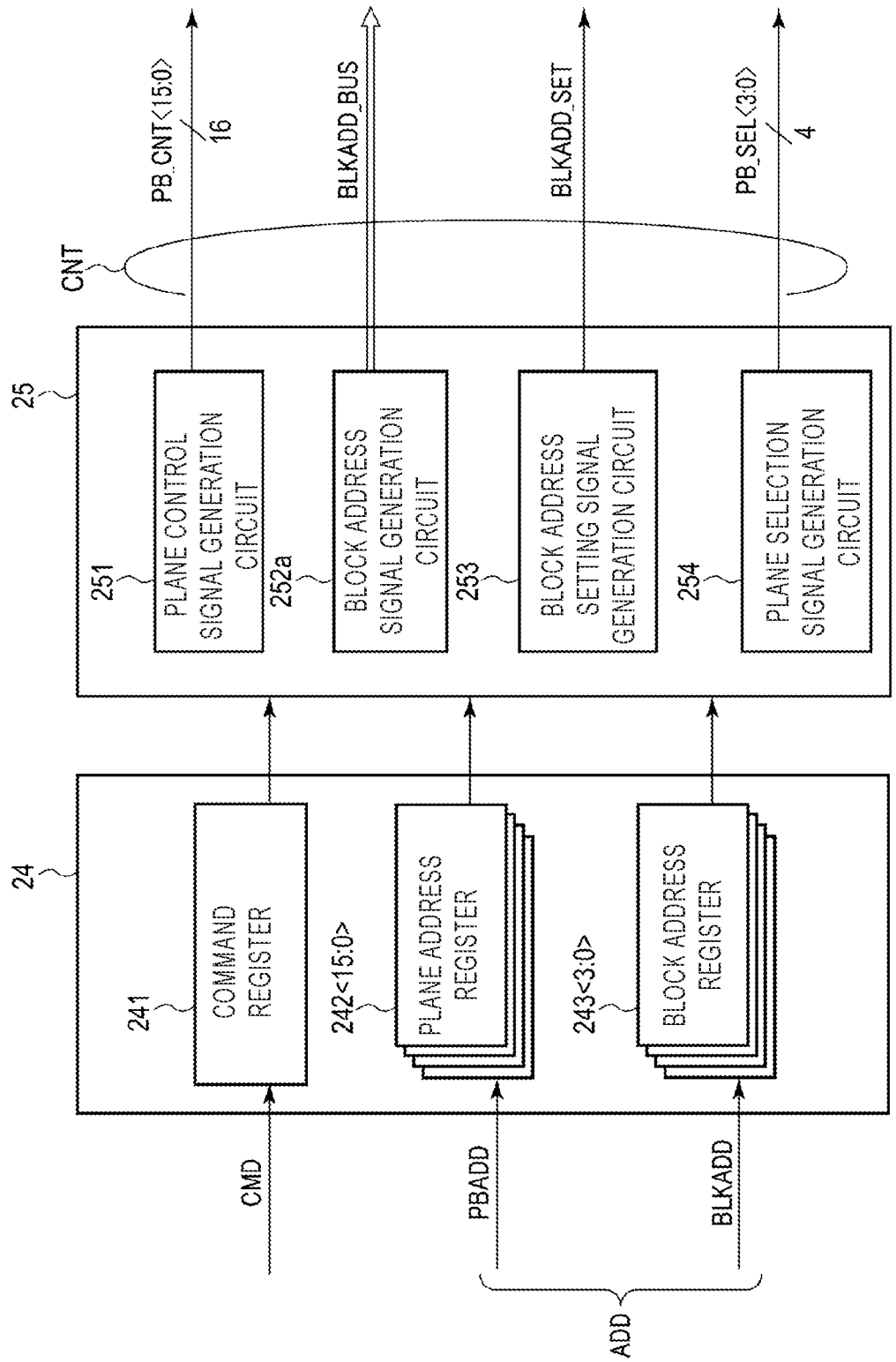
FIG. 14 is a schematic diagram for explaining the configuration of a register and a sequencer of a semiconductor memory device according to a second embodiment.

2.1.1. Configuration of Register and Sequencer FIG. 14 is a schematic diagram for explaining the configuration of a register and a sequencer of the semiconductor memory device according to the second embodiment. FIG. 14 corresponds to FIG. 3 in the first embodiment and schematically illustrates control signals CNT (signals PB_CNT<15:0>, BLKADD_BUS, BLKADD_SET and PB_SEL<3:0>) output from the sequencer 25 based on a command set (a command CMD and an address ADD) input to the register 24.

As illustrated in FIG. 14, the sequencer 25 includes a block address signal generation circuit 252a instead of the block address signal generation circuit 252. The sequencer 25 further includes a block address setting signal generation circuit 253 and a plane selection signal generation circuit 254.

The register 24 has the same configuration as that in FIG. 3 and therefore, explanations thereof will not be repeated.

The block address signal generation circuit 252a generates and outputs one signal BLKADD_BUS based on information stored in the command register 241, the plane address register 242<15:0> and the block address register 243<3:0>. The signal BLKADD_BUS is, for example, a signal that is output to one address bus connected commonly to all the planes PB, and includes, continuously in time series, block addresses BLKADD of a selected block for each of the plural planes PB that operate in synchronization. In the following description, the one address bus to which the signal BLKADD_BUS is output actually includes plural signal lines by which a specific block address BLKADD is specified.

The block address setting signal generation circuit 253 generates and outputs one signal BLKADD_SET based on the information stored in the command register 241, the plane address register 242<15:0> and the block address register 243<3:0>. The signal BLKADD_SET is, for example, a signal input commonly to all the planes PB, and designates a period during which a block address BLKADD included in the signal BLKADD_BUS is valid. That is, the signal BLKADD_SET has a function of designating a period during which each of plural block addresses BLKADD transferred in time series is valid and permitting the transfer of the block address BLKADD to the planes PB during the designated period.

The plane selection signal generation circuit 254 generates a 4-bit signal PB_SEL<3:0> that may specify the planes PB0 to PB15 individually based on the information stored in the command register 241, the plane address register 242<15:0> and the block address register 243<3:0>, and outputs the generated 4-bit signal to four signal lines one bit by one bit. The signal PB_SEL<3:0> is, for example, a signal input commonly to all the planes PB together with the signal BLKADD_SET and has a function of identifying a plane PB to which the period during which the block address BLKADD designated by the signal BLKADD_SET may be transferred, corresponds.

FIG. 15 is a table that shows the correspondence relationship between the signals generated in the plane selection signal generation circuit of the semiconductor memory device according to the second embodiment, and the planes.

As illustrated in FIG. 15, the signal PB_SEL<3:0> has individual data allocated to each plane PB. Specifically, for example, the data "0000" of the signal PB_SEL<3:0> corresponds to the plane PB0, the data "0001" of the signal corresponds to the plane PB1, . . . , the data "1111" of the signal corresponds to the plane PB15. The correspondence relationship illustrated in FIG. 15 is merely an example and any allocation may be applied as long as the planes PB0 to PB15 may be identified with a 4-bit signal.

Figure 16:
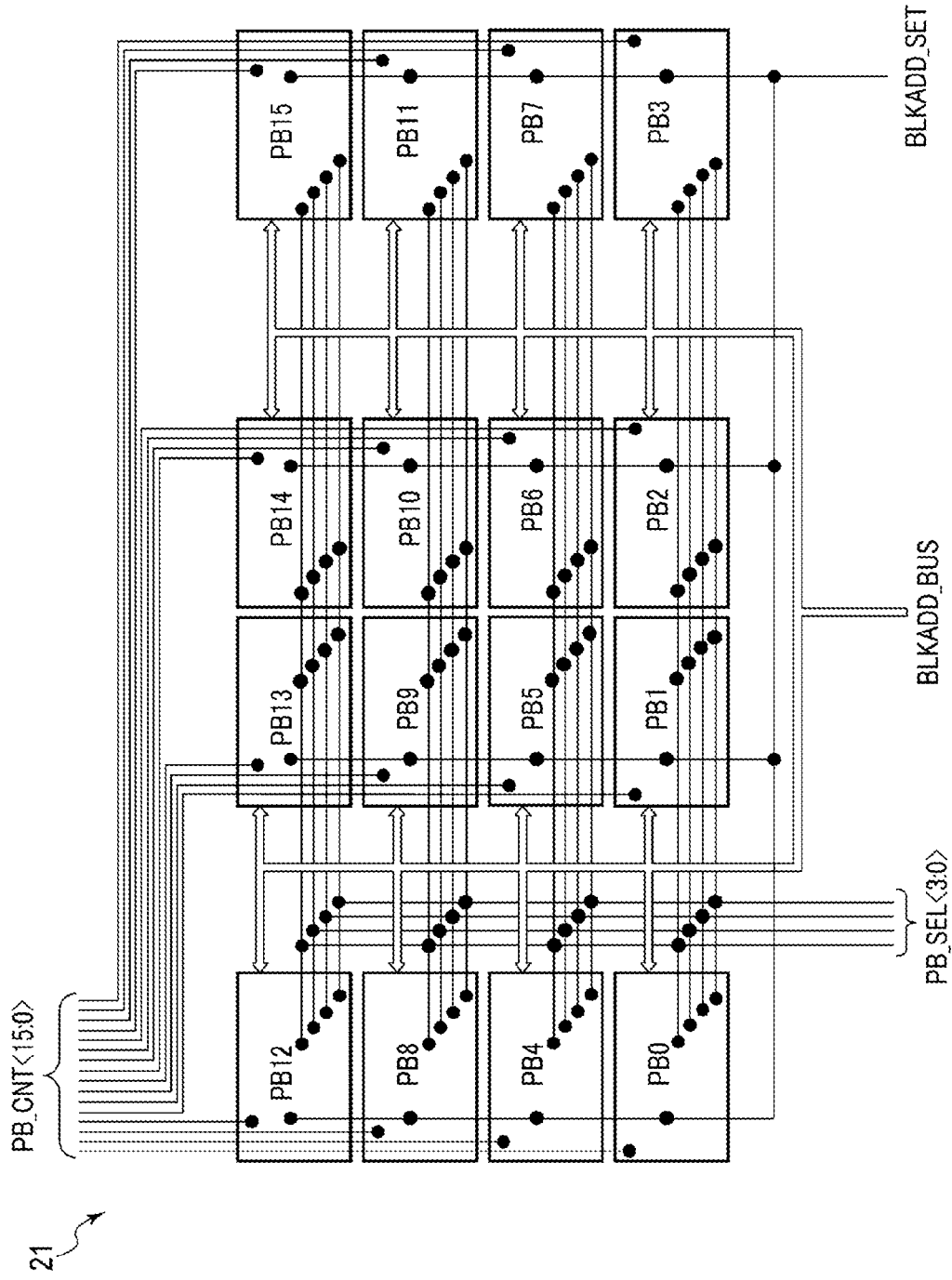
FIG. 16 is a schematic diagram that illustrates a connection relationship between a control signal output from a sequencer and a core unit in the semiconductor memory device according to the second embodiment.

FIG. 16 is a schematic diagram that illustrates a connection relationship between the control signals output from the sequencer and the core unit in the semiconductor memory device according to the second embodiment. FIG. 16 corresponds to FIG. 4 illustrated in the first embodiment.

As illustrated in FIG. 16, the signals BLKADD_BUS, BLKADD_SET and PB_SEL<3:0> are input commonly to all the planes PB0 to PB15.

As in the case of FIG. 4, a signal PB_CNT<k> is input to a plane PBk.

2.1.2. Configuration of Block Decoder

Figure 17:
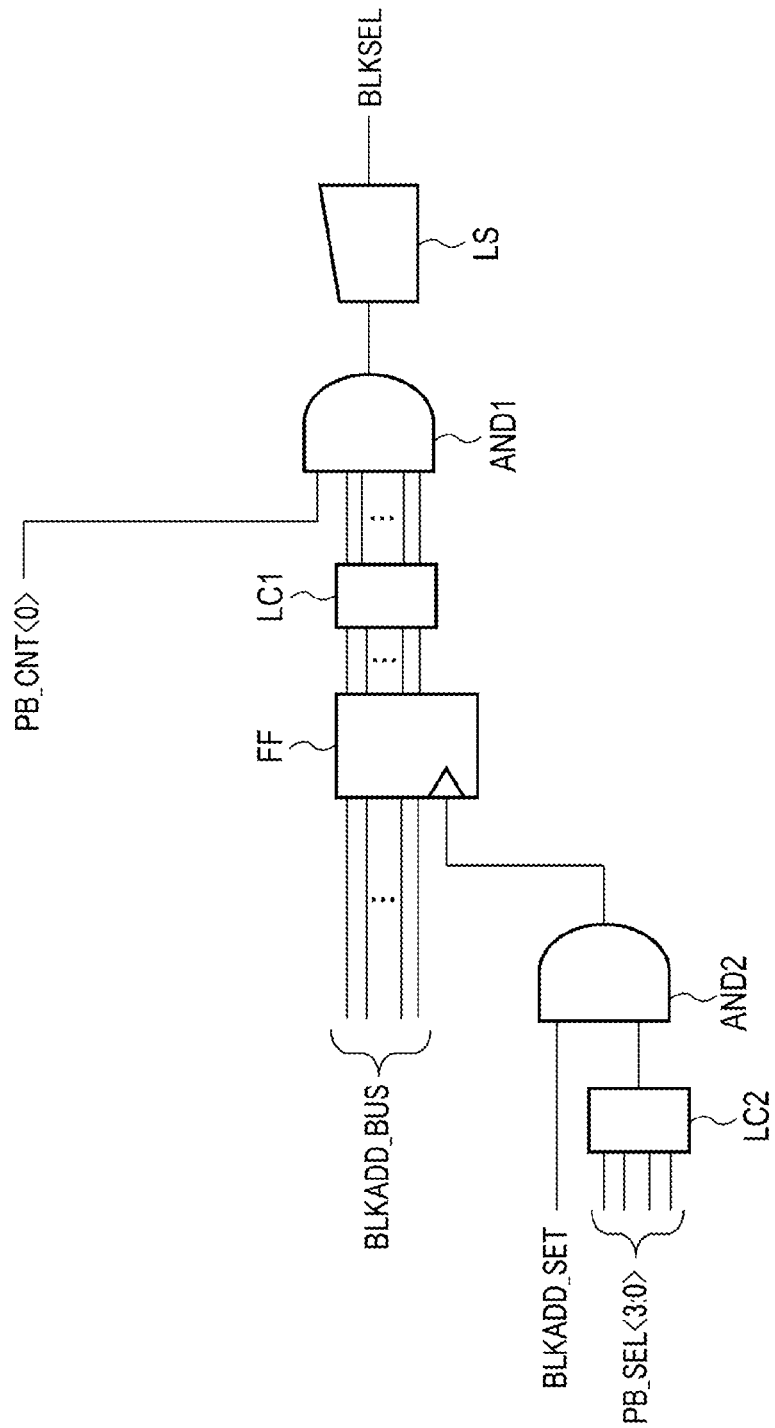
FIG. 17 is a circuit diagram for explaining the configuration of a block decoder of the semiconductor memory device according to the second embodiment.

Next, with reference to FIG. 17, descriptions will be made on the configuration of a block decoder of the semiconductor memory device according to the second embodiment. FIG. 17 corresponds to FIG. 8 in the first embodiment and illustrates a block decoder 52a instead of the block decoder 52 illustrated in FIG. 8.

As illustrated in FIG. 17, in addition to the configuration of the block decoder 52, the block decoder 52a further includes logic circuits LC2 and AND2 and a register FF.

The logic circuit LC2 includes an input terminal to which the signal PB_SEL<3:0> is supplied via four signal lines and an output terminal which is connected to a first input terminal of the logic circuit AND2. The logic circuit LC2 has different configurations corresponding to the plane PB in which the block decoder 52a is provided.

Specifically, for example, when the signal PB_SEL<3:0> having the data "0000" corresponding to the plane PB0 is supplied, the logic circuit LC2 corresponding to the plane PB0 outputs a signal of "H" level at the output terminal. When the signal PB_SEL<3:0> having data corresponding to a plane PB other than the plane PB0 is supplied, the logic circuit LC2 corresponding to the plane PB0 outputs a signal of "L" level to the output terminal.

The same also applies to the logic circuits LC2 corresponding to the other planes PB. For example, the logic circuit LC2 corresponding to the plane PB1 outputs a signal of "H" level to the output terminal when the signal PB_SEL<3:0> has the data "0001" corresponding to the plane PB1, and outputs a signal of "L" level for other data.

The logic circuit AND2 includes a first input terminal supplied with an output from the logic circuit LC2, a second input terminal supplied with a signal BLKADD_SET, and an output terminal connected to a clock input terminal of the register FF. The logic circuit AND2 is, for example, an AND operator and outputs an "H" level when both the first input terminal and the second input terminal are at an "H" level, and outputs an "L" level otherwise.

The register FF includes an input terminal supplied with a signal BLKADD_BUS via plural signal lines, a clock input terminal supplied with an output signal of the logic circuit AND2, and an output terminal connected to the input terminal of the logic circuit LC1. The register FF is, for example, a flip-flop circuit. When a signal of "H" level is input to the clock input terminal, the register FF temporarily stores signals supplied to its input terminals and outputs the signals through its output terminals.

With the above configuration, when the signal PB_SEL<3:0> hits in the corresponding plane PB and the signal BLKADD_SET is at an "H" level, the register FF stores the block address BLKADD contained in the signal BLKADD_BUS.

In the example of FIG. 17, descriptions have been made on the case where one set of logic circuits LC2 and AND2 and the register FF is provided for all the block decoders 52a in each plane PB. However, the present disclosure is not limited thereto. That is, it is sufficient when only one set of logic circuits LC2 and AND2 and the register FF is provided for each plane PB and the output signal from the register FF is supplied to the logic circuits LC1 in all the block decoders 52a in the same plane PB.

2.2. Synchronous Operation of Plural Planes

Next, descriptions will be made on a synchronous operation of plural planes in the semiconductor memory device according to the second embodiment.

Figure 18:
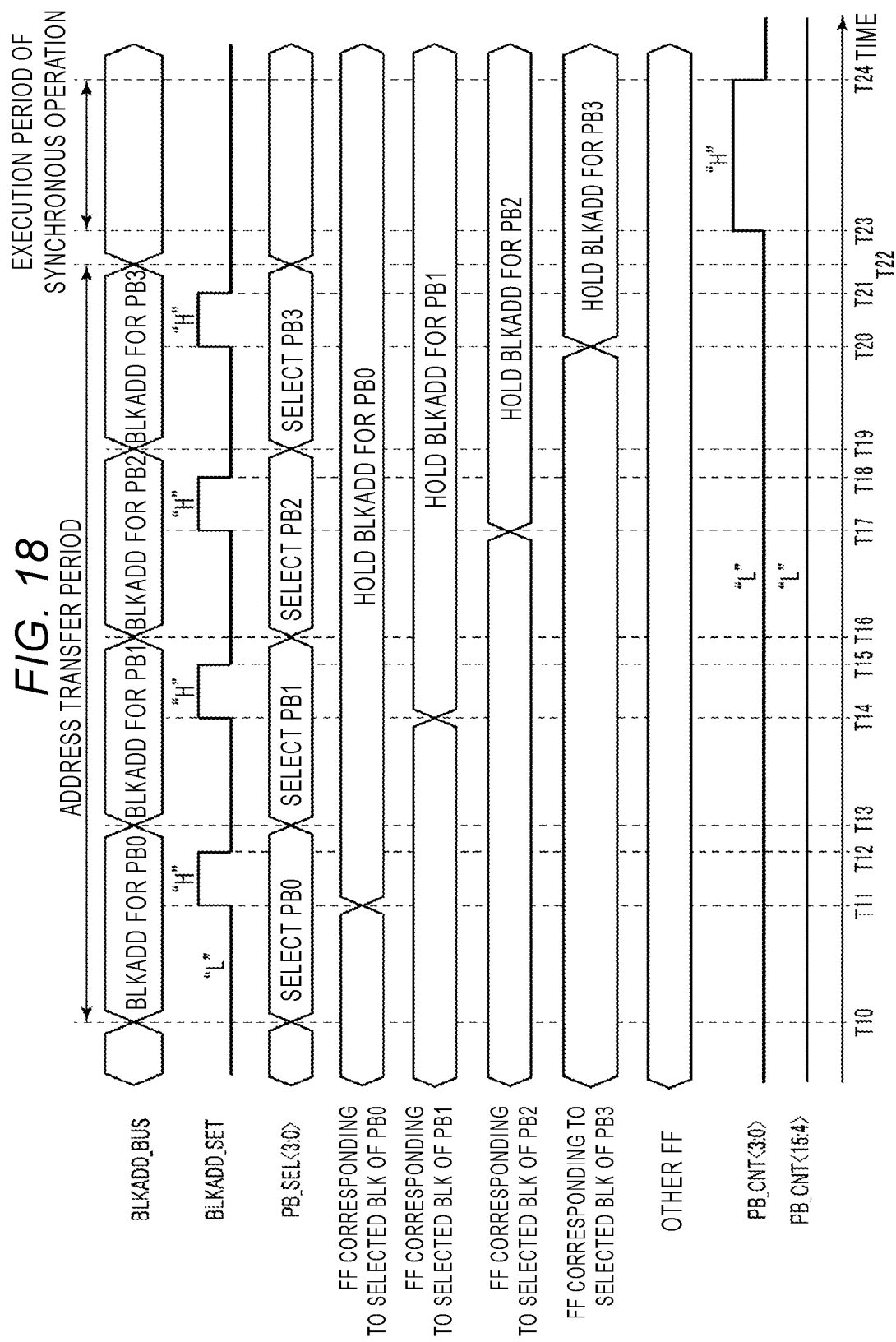
FIG. 18 is a timing chart for explaining a synchronous operation of plural planes in the semiconductor memory device according to the second embodiment.

FIG. 18 is a timing chart for explaining a synchronous operation of plural planes in the semiconductor memory device according to the second embodiment. FIG. 18 corresponds to FIG. 10 in the first embodiment.

As illustrated in FIG. 18, the signal BLKADD_BUS is transferred to all the planes PB in time series at periods of T10 to T13, T13 to T16, T16 to T19 and T19 to T22 in a state where the signal BLKADD_BUS includes the block address BLKADD for the plane PB0 to the block address BLKADD for the plane PB3.

Specifically, at time T10, the block address signal generation circuit 252a generates the signal BLKADD_BUS including the block address BLKADD for the plane PB0 and transfers the signal BLKADD_BUS to all the planes PB. In addition, the plane selection signal generation circuit 254 generates the signal PB_SEL<3:0> including the data "0000" that selects the plane PB0 and transfers the generated signal to all the planes PB. As a result, the logic circuit LC2 of the block decoder 52a in the plane PB0 outputs an "H" level to the first input terminal of the logic circuit AND2. Meanwhile, the logic circuits LC2 of the block decoders 52a in the other planes PB1 to PB15 output an "L" level.

At time T11, the block address setting signal generation circuit 253 sets the signal BLKADD_SET to an "H" level. As a result, an "H" level is input to the second input terminal of the logic circuit AND2 of the block decoder 52a in the plane PB0, and an "H" level is input to the clock input terminal of the register FF. Along with this, the block address BLKADD for the plane PB0 is stored in the register FF of the block decoder 52a in the plane PB0.

At time T12, the block address setting signal generation circuit 253 sets the signal BLKADD_SET to an "L" level. As a result, an "L" level is input to the clock input terminal of the register FF of the block decoder 52a in the plane PB0, and the address transfer to the register FF is completed.

As the address transfer to the plane PB0 is performed, the block address BLKLADD for the plane PB0 hits in the specific block decoder 52a in the plane PB0. However, since the signal PB_CNT<0> is at the "L" level at time T12, the block decoder 52a which is hit by the block address BLKADD for the plane PB0 does not output a signal of "H" level to the node BLKSEL.

Subsequently, at time T13, the block address signal generation circuit 252a generates the signal BLKADD_BUS including the block address BLKADD for the plane PB1 and transfers the generated signal to all the planes PB. Further, the plane selection signal generation circuit 254 generates the signal PB_SEL<3:0> including the data "0001" that selects the plane PB1 and transfers the generated signal to all the planes PB. As a result, the logic circuit LC2 of the block decoder 52a in the plane PB1 outputs an "H" level to the first input terminal of the logic circuit AND2. Meanwhile, the logic circuits LC2 of the block decoders 52a in the other planes PB0 and PB2 to PB15 output an "L" level.

At time T14, the block address setting signal generation circuit 253 sets the signal BLKADD_SET to an "H" level. As a result, an "H" level is input to the second input terminal of the logic circuit AND2 of the block decoder 52a in the plane PB1, and an "H" level is input to the clock input terminal of the register FF. Along with this, the block address BLKADD for the plane PB1 is stored in the register FF of the block decoder 52a in the plane PB1.

At time T15, the block address setting signal generation circuit 253 sets the signal BLKADD_SET to an "L" level. As a result, an "L" level is input to the clock input terminal of the register FF of the block decoder 52a in the plane PB1, and the address transfer to the register FF is completed.

As the address transfer to the plane PB1 is performed, the block address BLKLADD for the plane PB1 hits in the specific block decoder 52a in the plane PB1. However, since the signal PB_CNT<1> is at the "L" level at time T15, the block decoder 52a which is hit by the block address BLKADD for the plane PB1 does not output a signal of "H" level to the node BLKSEL.

Subsequently, at time T16, the block address signal generation circuit 252a generates the signal BLKADD_BUS including the block address BLKADD for the plane PB2 and transfers the generated signal to all the planes PB. In addition, the plane selection signal generation circuit 254 generates the signal PB_SEL<3:0> including the data "0010" that selects the plane PB2 and transfers the generated signal to all the planes PB. As a result, the logic circuit LC2 of the block decoder 52a in the plane PB2 outputs an "H" level to the first input terminal of the logic circuit AND2. Meanwhile, the logic circuits LC2 of the block decoders 52a in the other planes PB0, PB1 and PB3 to PB15 output an "L" level.

At time T17, the block address setting signal generation circuit 253 sets the signal BLKADD_SET to an "H" level. As a result, an "H" level is input to the second input terminal of the logic circuit AND2 of the block decoder 52a in the plane PB2, and an "H" level is input to the clock input terminal of the register FF2. Along with this, the block address BLKADD for the plane PB2 is stored in the register FF of the block decoder 52a in the plane PB2.

At time T18, the block address setting signal generation circuit 253 sets the signal BLKADD_SET to an "L" level. As a result, an "L" level is input to the clock input terminal of the register FF of the block decoder 52a in the plane PB2, and the address transfer to the register FF is completed.

As the address transfer to the plane PB2 is performed, the block address BLKLADD for the plane PB2 hits in the specific block decoder 52a in the plane PB2. However, at time T18, since the signal PB_CNT<2> is at the "L" level, the block decoder 52a which is hit by the block address BLKADD for the plane PB2 does not output a signal of "H" level to the node BLKSEL.

At time T19, the block address signal generation circuit 252a generates the signal BLKADD_BUS including the block address BLKADD for the plane PB3 and transfers the generated signal to all the planes PB. In addition, the plane selection signal generation circuit 254 generates the signal PB_SEL<3:0> including the data "0011" that selects the plane PB3 and transfers the generated signal to all the planes PB. As a result, the logic circuit LC2 of the block decoder 52a in the plane PB3 outputs an "H" level to the first input terminal of the logic circuit AND2. Meanwhile, the logic circuits LC2 of the block decoders 52a in the other planes PB0 to PB2 and PB4 to PB15 output an "L" level.

At time T20, the block address setting signal generation circuit 253 sets the signal BLKADD_SET to an "H" level. As a result, an "H" level is input to the second input terminal of the logic circuit AND2 of the block decoder 52a in the plane PB3, and an "H" level is input to the clock input terminal of the register FF3. Along with this, the block address BLKADD for the plane PB3 is stored in the register FF of the block decoder 52a in the plane PB3.

At time T21, the block address setting signal generation circuit 253 sets the signal BLKADD_SET to an "L" level. As a result, an "L" level is input to the clock input terminal of the register FF of the block decoder 52a in the plane PB3, and the address transfer to the register FF is completed.

As the address transfer to the plane PB3 is performed, the block address BLKLADD for the plane PB3 hits in the specific block decoder 52a in the plane PB3. However, at time T21, since the signal PB_CNT<3> is at the "L" level, the block decoder 52a which is hit by the block address BLKADD for the plane PB3 does not output a signal of "H" level to the node BLKSEL.

At time T22, the block address signal generation circuit 252a ends the generation of the signal BLKADD_BUS including the block address BLKADD. As a result, the transfer of all the block addresses BLKADD is ended.

At time T23, the plane control signal generation circuit 251 sets the signal PB_CNT<3:0> to an "H" level. As a result, the logic circuits AND1 of the block decoders 52a provided in the planes PB0 to PB3 are driven. Therefore, the selected blocks BLK in the planes PB0 to PB3 may be brought into a selected state. Accordingly, in the planes PB0 to PB3, a predetermined synchronous operation is performed on the selected blocks BLK.

At time T24, the plane control signal generation circuit 251 sets the signal PB_CNT<3:0> to an "L" level. As a result, the selected blocks BLK in the planes PB0 to PB3 are brought into a non-selected state, and the execution period of the synchronous operation is ended. Thus, the synchronous operation of the plural planes is completed.

2.3. Effects of the Present Embodiment Upon receiving command sets (a set of the command "XXh", the address ADD and the command "YYh" and a set of the command "XXh", the address ADD and the command "ZZh"), the sequencer 25 executes the synchronous operation on the planes PB in a specific group GRP. That is, the sequencer transfers the signal BLKADD_BUS including the block address BLKADD for a specific plane PB to all the planes PB0 to PB15 in time series. The sequencer 25 uses the signals BLKADD_SET and BLKADD SEL<3:0> to store the signal BLKADD_BUS in the register FF of a specific plane PB for a specific period. After the transfer of the block address BLKADD to all the plane PBs operated in synchronization is completed, the sequencer 25 uses the signal PB_CNT<3:0> to select the planes PB0 to PB3 at the same time. This makes it possible to reduce the number of signal lines that supply the signal BLKADD_BUS and the size of the block address register 243.

In addition, the semiconductor memory device 20 is designed so that all the planes PB in the core unit 21 may be operated in synchronization. However, as the number of planes PB increases with the increase in storage capacity, the number of signal lines that supply the control signals CNT necessary for synchronous operation to the planes PB increases and the number of block address registers 243 that store the block addresses BLKADD for the planes PB increases.

Specifically, in the second embodiment, descriptions have been made on the configuration of transferring the block addresses BLKADD for the plural plane PBs in time series and executing the synchronous operation after the transfer is completed. On the other hand, in a second comparative example, the signals BLKADD SEL may be individually supplied to 16 planes PB via 16 signal lines, respectively. In addition, the block address register 243 may be configured to store 16 block addresses BLKADD. Therefore, in the second comparative example, the circuit area and the wiring area of the sequencer 25 and the register 24 are enlarged, which may increase a load on design.

In contrast, in the second embodiment, the number of planes that may be operated in synchronization is kept low (e.g., to four) with respect to the number of (e.g., 16) planes in the memory cell array 211. As a result, the number of signal lines that supply the signal BLKADD_BUS may be reduced from 16 to 4, and the number of block address registers 243 may be reduced from 16 to 4. Therefore, an increase in the circuit area and the wiring area can be prevented.

2.4. First Modification

In the second embodiment, as in the modification of the first embodiment, the plural planes PB may be regarded as one virtual plane and the block addresses BLKADD to be selected may be commonly allocated to the one virtual plane. Then, plural such virtual planes may be set and execute the operations in synchronization. In the following description, the explanation on the same configuration and operation as those of the modification of the first embodiment and the second embodiment will not be repeated for the sake of simplicity, and the configuration and operation different from those of the modification of the first embodiment and the second embodiment will mainly be described.

2.4.1. Configuration of Register and Sequencer

Figure 19:
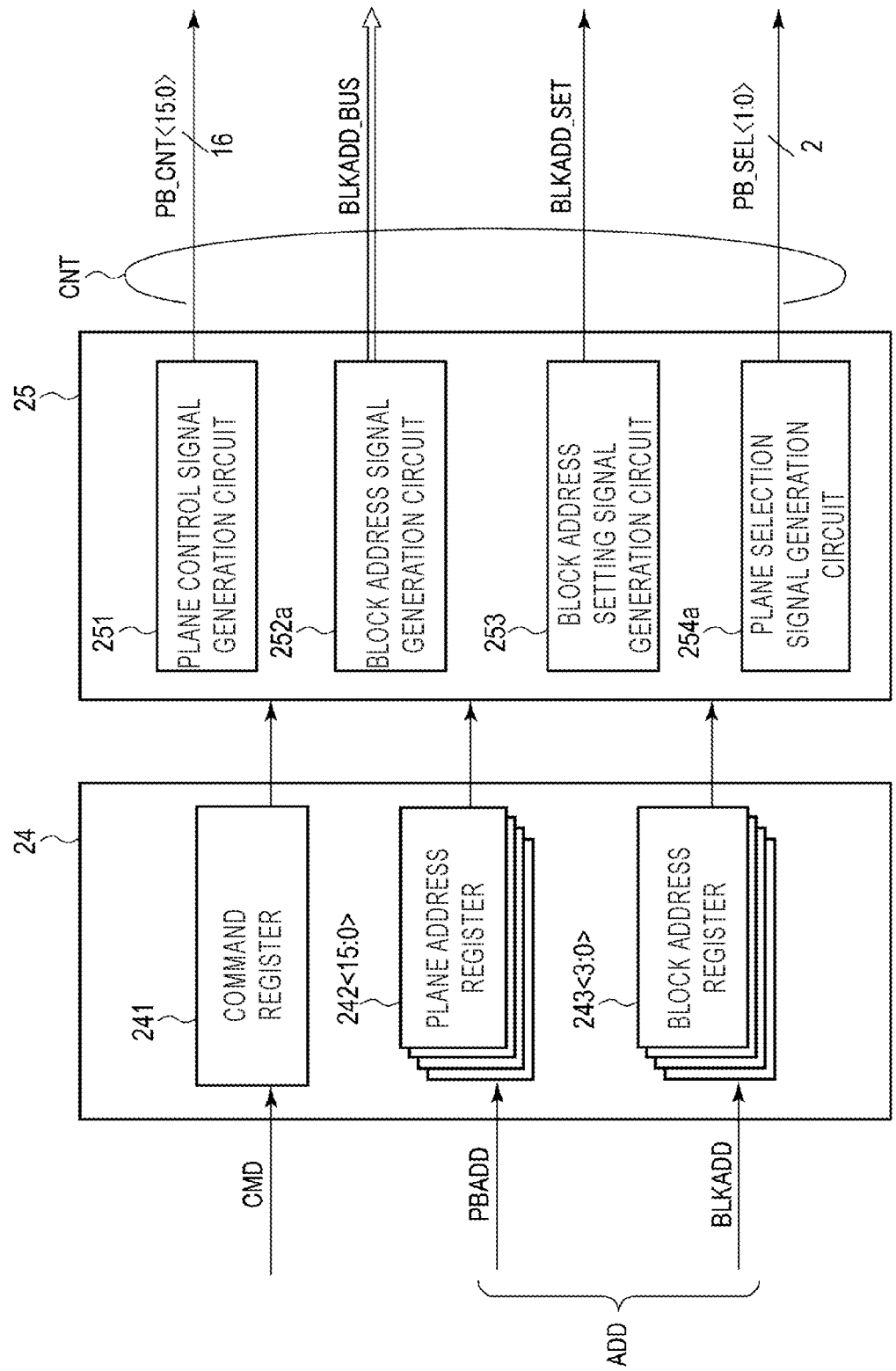
FIG. 19 is a schematic diagram for explaining the configuration of a register and a sequencer of a semiconductor memory device according to a first modification of the second embodiment.

FIG. 19 is a schematic diagram for explaining the configuration of a register and a sequencer of the semiconductor memory device according to the first modification of the second embodiment. FIG. 19 corresponds to FIG. 14 in the second embodiment and schematically illustrates control signals CNT (signals PB_CNT<15:0>, BLKADD_BUS, BLKADD_SET and PB_SEL<1:0>) output from the sequencer 25 based on a command set (a command CMD and an address ADD) input to the register 24.

As illustrated in FIG. 19, the sequencer 25 includes a plane selection signal generation circuit 254a instead of the plane selection signal generation circuit 254.

The register 24 has the same configuration as that in FIG. 3 and therefore, explanations thereof will not be repeated.

The plane selection signal generation circuit 254a generates a 2-bit signal PB_SEL<1:0> that may specify the virtual planes IPB0 to IPB3 individually and outputs the generated 2-bit signal to 2 signal lines one bit by one bit. The signal PB_SEL<1:0> is, for example, a signal input commonly to all the planes PB together with the signal BLKADD_SET and has a function of identifying a virtual plane IPB to which the period during which the block address BLKADD designated by the signal BLKADD_SET may be transferred, corresponds.

FIG. 20 is a table that shows the correspondence relationship between the signals generated in the plane selection signal generation circuit of the semiconductor memory device according to the first modification of the second embodiment, and the planes.

As illustrated in FIG. 20, the signal PB_SEL<1:0> has individual data allocated to each virtual plane IPB. Specifically, for example, the data "00" of the signal PB_SEL<1:0> corresponds to the virtual plane IPB0, the data "01" of the signal corresponds to the virtual plane IPB1, the data "10" of the signal corresponds to the virtual plane IPB2, and the data "11" of the signal corresponds to the virtual plane IPB3. The correspondence relationship illustrated in FIG. 20 is merely an example and any allocation may be applied as long as the virtual planes IPB0 to IPB3 may be identified with a 2-bit signal.

Figure 21:
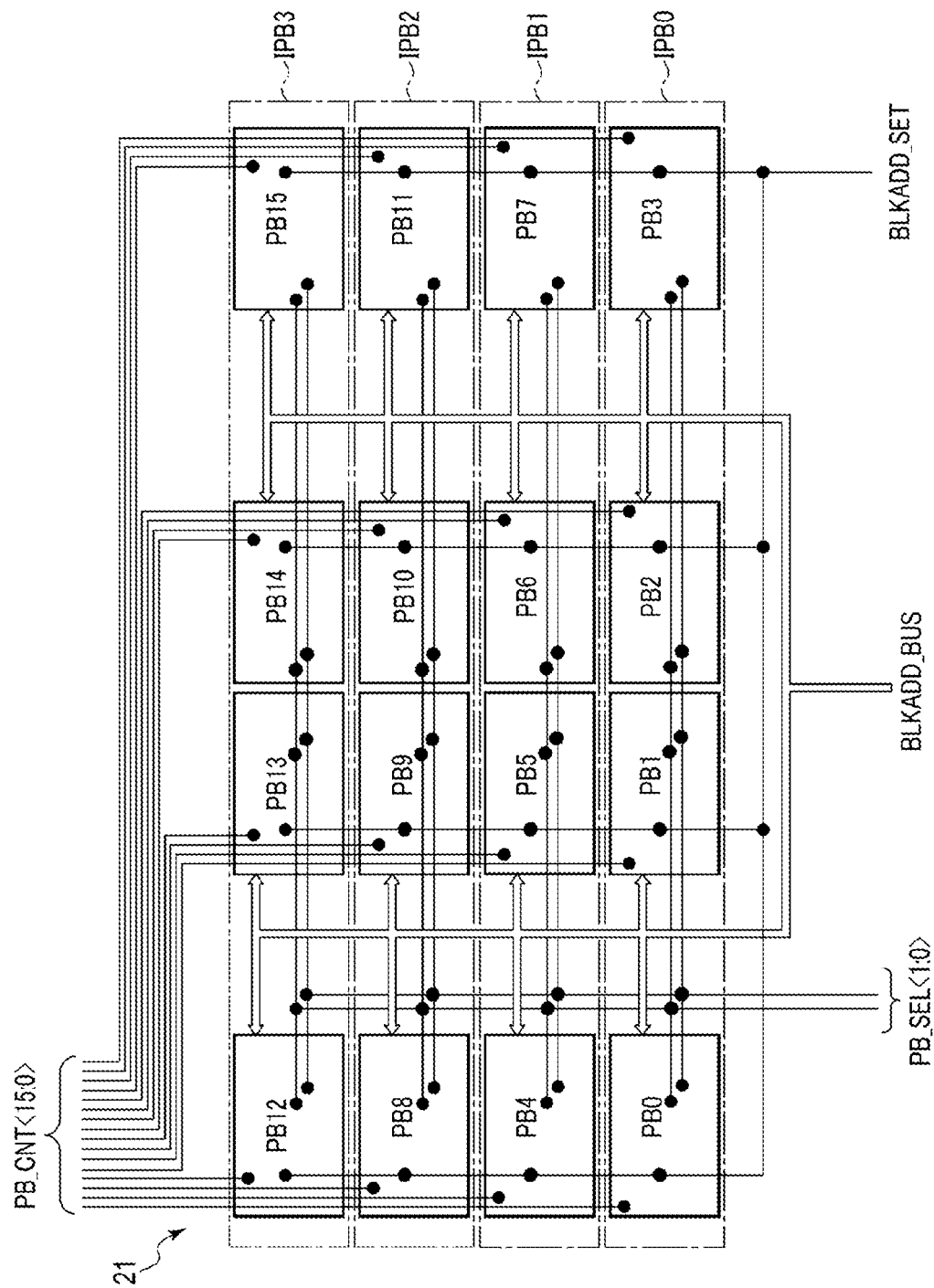
FIG. 21 is a schematic diagram that illustrates a connection relationship between a control signal output from a sequencer and a core unit in the semiconductor memory device according to the first modification of the second embodiment.

FIG. 21 is a schematic diagram that illustrates a connection relationship between the control signals output from the sequencer and the core unit in the semiconductor memory device according to the first modification of the second embodiment. FIG. 21 corresponds to FIG. 16 illustrated in the second embodiment.

As illustrated in FIG. 21, the signals BLKADD_BUS, BLKADD_SET and PB_SEL<1:0> are input commonly to all the planes PB0 to PB15.

As in the case of FIG. 16, a signal PB_CNT<k> is input to a plane PBk.

2.4.2. Configuration of Block Decoder

Figure 22:
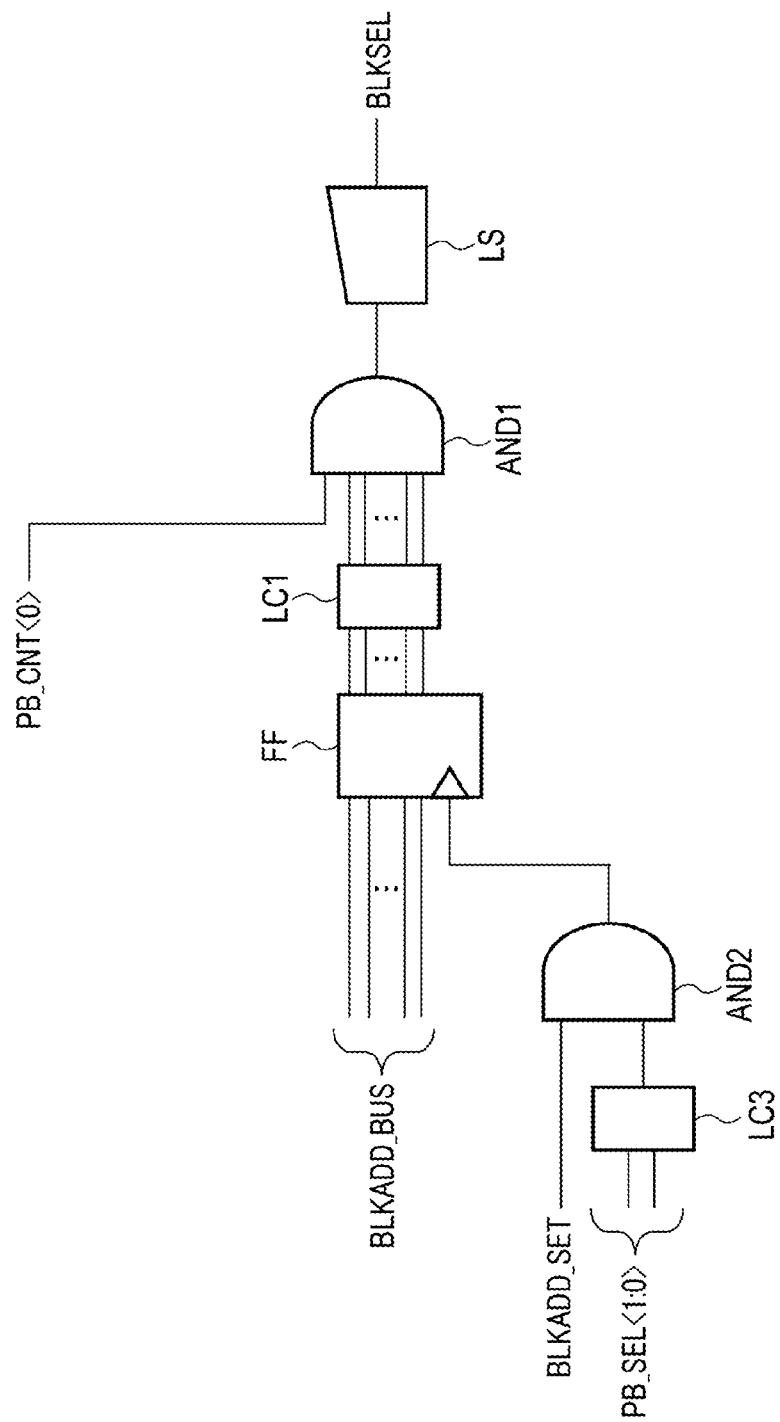
FIG. 22 is a circuit diagram for explaining the configuration of a block decoder of the semiconductor memory device according to the first modification of the second embodiment.

FIG. 22 is a circuit diagram for explaining the configuration of a block decoder of the semiconductor memory device according to the first modification of the second embodiment. FIG. 22 corresponds to FIG. 17 in the second embodiment and illustrates a block decoder 52b provided in the plane PB0 as an example.

As illustrated in FIG. 22, the block decoder 52b includes a logic circuit LC3 instead of the logic circuit LC2 in the block decoder 52a.

The logic circuit LC3 includes an input terminal supplied with the signal PB_SEL<1:0> via two signal lines, and an output terminal connected to the first input terminal of the logic circuit AND2. The logic circuit LC3 has different configurations corresponding to the virtual plane IPB in which the block decoder 52b is provided.

Specifically, for example, when the signal PB_SEL<1:0> having the data "00" corresponding to the virtual plane IPB0 is supplied to the logic circuit LC3 in the planes PB0 to PB3 corresponding to the virtual plane IPB0, the logic circuit LC3 outputs a signal of "H" level at the output terminal. When the signal PB_SEL<1:0> having data corresponding to the virtual planes IPB other than the virtual plane IPB0 is supplied to the logic circuit LC3 corresponding to the virtual plane IPB0, the logic circuit LC3 outputs a signal of "L" level at the output terminal.

The same also applies to the logic circuits LC3 corresponding to the other virtual planes IPB. For example, when the signal PB_SEL<1:0> has the data "01" corresponding to the virtual plane IPB1, the logic circuit LC3 in the planes PB4 to PB7 corresponding to the virtual plane IPB1 outputs a signal of "H" level at the output terminal. Otherwise, the logic circuit LC3 outputs a signal of "L" level at the output terminal.

With the above configuration, when the signal PB_SEL<1:0> hits in the corresponding virtual plane IPB and the signal BLKADD_SET is at the "H" level, the register FF may store the block address BLKADD in the signal BLKADD_BUS.

In the example of FIG. 22, descriptions have been made on the case where one set of logic circuits LC3 and AND2 and the register FF is provided for all the block decoders 52*b* in each plane PB. However, the present disclosure is not limited thereto. For example, it is sufficient when only one set of logic circuits LC3 and AND2 and register FF is provided for each plane PB and the output signal from the register FF is supplied to the logic circuits LC1 in all the block decoders 52*b* in the same virtual plane IPB.

2.4.3. Synchronous Operation of Plural Planes

Figure 23:
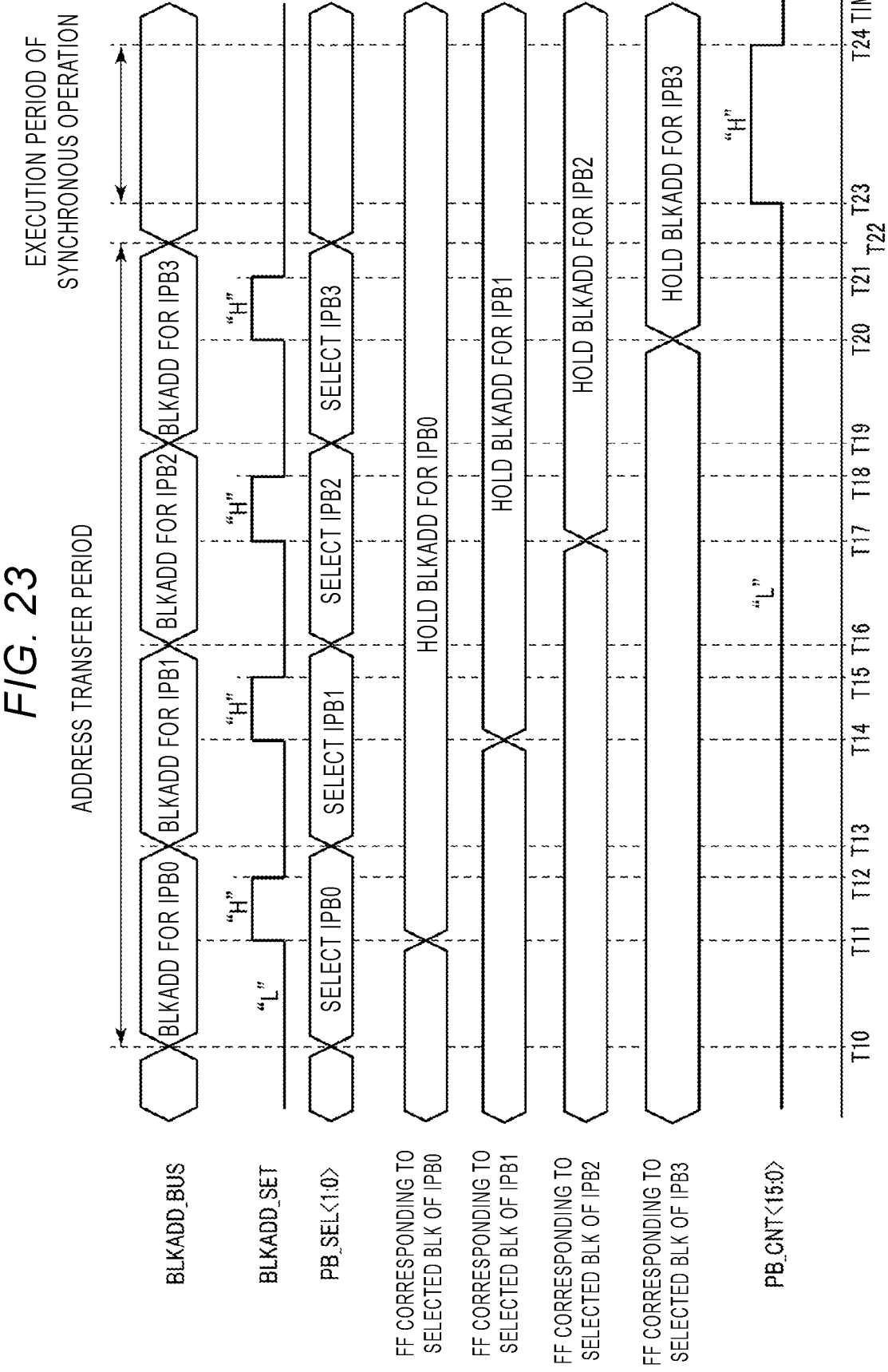
FIG. 23 is a timing chart for explaining a synchronous operation of plural planes in the semiconductor memory device according to the first modification of the second embodiment.

Next, descriptions will be made on a synchronous operation of plural planes in the semiconductor memory device according to the first modification of the second embodiment. FIG. 23 is a timing chart for explaining a synchronous operation of plural planes in the semiconductor memory device according to the first modification of the second embodiment. FIG. 23 corresponds to FIG. 18 in the second embodiment.

As illustrated in FIG. 23, the signal BLKADD_BUS is transferred to all the planes PB in time series at periods of T10 to T13, T13 to T16, T16 to T19 and T19 to T22 in a state where the signal BLKADD_BUS includes the block address BLKADD for the virtual plane IPB0 to the block address BLKADD for the virtual plane IPB3.

Specifically, at time T10, the block address signal generation circuit 252*a* generates the signal BLKADD_BUS including the block address BLKADD for the virtual plane IPB0 and transfers the generated signal to all the planes PB. In addition, the plane selection signal generation circuit 254*a* generates the signal PB_SEL<1:0> including the data "00" that selects the virtual plane IPB0 and transfers the generated signal to all the planes PB. As a result, the logic circuit LC3 of the block decoder 52*b* in the virtual plane IPB0 outputs an "H" level to the first input terminal of the logic circuit AND2. Meanwhile, the logic circuits LC3 of the block decoders 52*b* in the other virtual planes IPB1 to IPB15 output an "L" level.

At time T11, the block address setting signal generation circuit 253 sets the signal BLKADD_SET to an "H" level. As a result, an "H" level is input to the second input terminal of the logic circuit AND2 of the block decoder 52*b* in the virtual plane IPB0, and an "H" level is input to the clock input terminal of the register FF. Along with this, the block address BLKADD for the virtual plane IPB0 is stored in the register FF of the block decoder 52*b* in the virtual plane IPB0.

At time T12, the block address setting signal generation circuit 253 sets the signal BLKADD_SET to an "L" level. As a result, an "L" level is input to the clock input terminal of the register FF of the block decoder 52*b* in the virtual plane IPB0, and the address transfer to the register FF is completed.

As the address transfer to the virtual plane IPB0 is performed, the block address BLKLADD for the virtual plane IPB0 hits in the specific block decoder 52*b* in the virtual plane IPB0. However, since the signal PB_CNT<3:0> is at the "L" level at time T12, the block decoder 52*b* which is hit by the block address BLKADD for the virtual plane IPB0 does not output a signal of "H" level to the node BLKSEL.

Subsequently, at time T13, the block address signal generation circuit 252*a* generates the signal BLKADD_BUS including the block address BLKADD for the virtual plane IPB1 and transfers the generated signal to all the planes PB. Further, the plane selection signal generation circuit 254*a* generates the signal PB_SEL<1:0> including the data "01" that selects the virtual plane IPB1 and transfers the generated signal to all the planes PB. As a result, the logic circuit LC3 of the block decoder 52*b* in the virtual plane IPB1 outputs an "H" level to the first input terminal of the logic circuit AND2. Meanwhile, the logic circuits LC3 of the block decoders 52*b* in the other virtual planes IPB0, IPB2 and IPB3 output an "L" level.

At time T14, the block address setting signal generation circuit 253 sets the signal BLKADD_SET to an "H" level. As a result, an "H" level is input to the second input terminal of the logic circuit AND2 of the block decoder 52*b* in the virtual plane IPB1, and an "H" level is input to the clock input terminal of the register FF. Along with this, the block address BLKADD for the virtual plane IPB1 is stored in the register FF of the block decoder 52*b* in the virtual plane IPB1.

At time T15, the block address setting signal generation circuit 253 sets the signal BLKADD_SET to an "L" level. As a result, an "L" level is input to the clock input terminal of the register FF of the block decoder 52*b* in the virtual plane IPB1, and the address transfer to the register FF is completed.

As the address transfer to the virtual plane IPB1 is performed, the block address BLKLADD for the virtual plane IPB1 hits in the specific block decoder 52*b* in the virtual plane IPB1. However, since the signal PB_CNT<7:4> is at the "L" level at time T15, the block decoder 52*b* which is hit by the block address BLKADD for the virtual plane IPB1 does not output a signal of "H" level to the node BLKSEL.

Subsequently, at time T16, the block address signal generation circuit 252*a* generates the signal BLKADD_BUS including the block address BLKADD for the virtual plane IPB2 and transfers the generated signal to all the planes PB. In addition, the plane selection signal generation circuit 254*a* generates the signal PB_SEL<1:0> including the data "10" that selects the virtual plane IPB2 and transfers the generated signal to all the planes PB. As a result, the logic circuit LC3 of the block decoder 52*b* in the virtual plane IPB2 outputs an "H" level to the first input terminal of the logic circuit AND2. Meanwhile, the logic circuits LC3 of the block decoders 52*b* in the other virtual planes IPB0, IPB1 and IPB3 output an "L" level.

At time T17, the block address setting signal generation circuit 253 sets the signal BLKADD_SET to an "H" level. As a result, an "H" level is input to the second input terminal of the logic circuit AND2 of the block decoder 52*b* in the virtual plane IPB2, and an "H" level is input to the clock input terminal of the register FF. Along with this, the block address BLKADD for the virtual plane IPB2 is stored in the register FF of the block decoder 52*b* in the virtual plane IPB2.

At time T18, the block address setting signal generation circuit 253 sets the signal BLKADD_SET to an "L" level. As a result, an "L" level is input to the clock input terminal of the register FF of the block decoder 52*b* in the virtual plane IPB2, and the address transfer to the register FF is completed.

As the address transfer to the virtual plane IPB2 is performed, the block address BLKLADD for the virtual plane IPB2 hits in the specific block decoder 52b in the virtual plane IPB2. However, at time T18, since the signal PB_CNT<11:8> is at the "L" level, the block decoder 52b which is hit by the block address BLKADD for the virtual plane IPB2 does not output a signal of "H" level to the node BLKSEL.

At time T19, the block address signal generation circuit 252a generates the signal BLKADD_BUS including the block address BLKADD for the virtual plane IPB3 and transfers the generated signal to all the planes PB. In addition, the plane selection signal generation circuit 254a generates the signal PB_SEL<1:0> including the data "11" that selects the virtual plane IPB3 and transfers the generated signal to all the planes PB. As a result, the logic circuit LC3 of the block decoder 52b in the virtual plane IPB3 outputs an "H" level to the first input terminal of the logic circuit AND2. Meanwhile, the logic circuits LC3 of the block decoders 52b in the other virtual planes IPB0 to IPB2 output an "L" level.

At time T20, the block address setting signal generation circuit 253 sets the signal BLKADD_SET to an "H" level. As a result, an "H" level is input to the second input terminal of the logic circuit AND2 of the block decoder 52b in the virtual plane IPB3, and an "H" level is input to the clock input terminal of the register FF. Along with this, the block address BLKADD for the virtual plane IPB3 is stored in the register FF of the block decoder 52b in the virtual plane IPB3.

At time T21, the block address setting signal generation circuit 253 sets the signal BLKADD_SET to an "L" level. As a result, an "L" level is input to the clock input terminal of the register FF of the block decoder 52b in the virtual plane IPB3, and the address transfer to the register FF is completed.

As the address transfer to the virtual plane IPB3 is performed, the block address BLKLADD for the virtual plane IPB3 hits in the specific block decoder 52b in the virtual plane IPB3. However, at time T21, since the signal PB_CNT<15:12> is at the "L" level, the block decoder 52b which is hit by the block address BLKADD for the virtual plane IPB3 does not output a signal of "H" level to the node BLKSEL.

At time T22, the block address signal generation circuit 252a ends the generation of the signal BLKADD_BUS including the block address BLKADD. As a result, the transfer of all the block addresses BLKADD is ended.

At time T23, the plane control signal generation circuit 251 sets the signal PB_CNT<15:0> to an "H" level. As a result, the logic circuits AND1 of the block decoders 52b provided in the virtual planes IPB0 to IPB3 (i.e., all the planes PB) are driven. Therefore, the selected blocks BLK in the virtual planes IPB0 to IPB3 may be brought into a selected state. Accordingly, in the virtual planes IPB0 to IPB3, a predetermined operation is performed on the selected blocks BLK.

At time T24, the plane control signal generation circuit 251 sets the signal PB_CNT<15:0> to an "L" level. As a result, the selected blocks BLK in the virtual planes IPB0 to IPB3 are brought into a non-selected state, and the execution period of the operation is ended. Thus, the synchronous operation of the plural planes is completed.

2.4.4. Effects of this Modification

According to this modification, the same effects as the modification of the first embodiment may be obtained even for the configuration in which the block addresses BLKADD for the plural planes PB are transferred in time series and the synchronous operation is executed after the transfer is completed, as described in the second embodiment.

In the first modification of the second embodiment, descriptions have been made on the case where one of the virtual planes IPB0 to IPB3 is selected by the signal PB_SEL<1:0> supplied from two signal lines. However, the present disclosure is not limited thereto. For example, the signal PB_SEL may be supplied from four signal lines capable of independently selecting each virtual plane IPB. With this configuration, it is possible to configure a virtual plane including 8 planes PB and a virtual plane including all 16 planes PB as well as the virtual plane IPB including the four planes PB as in the first modification of the second embodiment.

2.5. Second Modification

In the second embodiment, descriptions have been made on the case where four of the 16 planes PB are operated in synchronization. However, the present disclosure is not limited thereto. For example, eight of the 16 planes PB may be operated in synchronization, for example, by repeating a command set that executes the four planes PB plural times in synchronization. In the following description, the explanation on the same configuration and operation as those of the second embodiment will not be explained for the sake of simplicity, and the configuration and operation different from those of the second embodiment will be mainly described.

Figure 24:
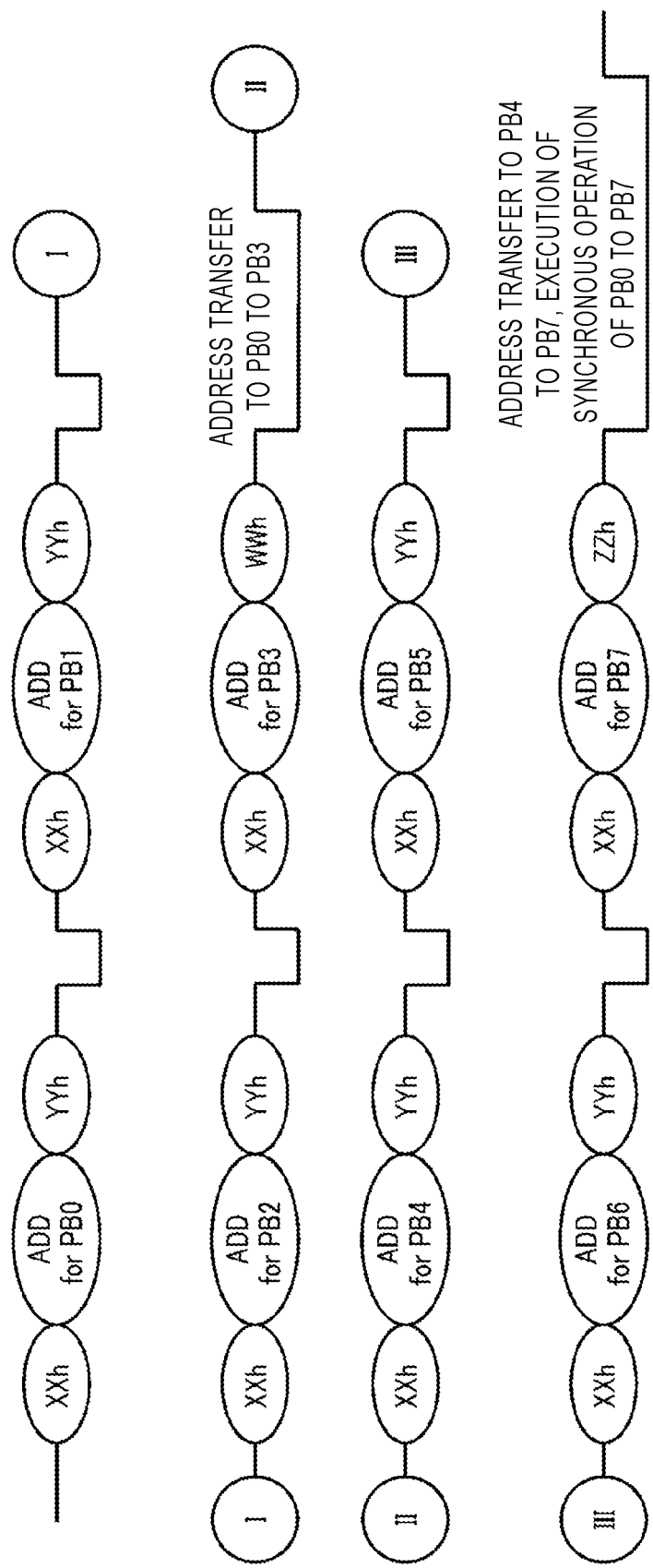
FIG. 24 is a command sequence for explaining a synchronous operation of plural planes in a semiconductor memory device according to a second modification of the second embodiment.

FIG. 24 is a command sequence for explaining a synchronous operation of plural planes in a semiconductor memory device according to a second modification of the second embodiment. FIG. 24 corresponds to FIG. 9 that is commonly used in the first embodiment and the second embodiment.

As illustrated in FIG. 24, in the command sequence of synchronous operation of plural planes in the present modification, a command set including a block address BLKADD for one group GRP0 (planes PB0 to PB3) that may be stored in the sequencer 25 is issued, and then, the address transfer for that amount is once performed. Thereafter, a command set including a block address BLKADD for a group GRP1 (planes PB4 to PB7) different from the group GRP0 is issued.

That is, the memory controller 10 issues a command set to the planes PB0 to PB2 in the same sequence as in FIG. 9, and transmits the issued command set to the semiconductor memory device 20. Subsequently, the memory controller 10 issues a command set (i.e., a command "XXh", an address ADD over 5 cycles, and a command "WWh") to the plane PB3 and transmits the issued command set to the semiconductor memory device 20. Here, the command "WWh" informs the semiconductor memory device 20 that there is the end of issuance of the command set for one group GRP, the transfer instruction of the block address BLKADD for the one group GRP, and issuance of a command set for another group GRP after the transfer of the block address BLKADD.

Specifically, upon receiving the command "WWh", the semiconductor memory device 20 sets the signal /RB to an "L" level and transfers the block address BLKADD stored in the register 24 to the planes PB0 to PB3 to be operated. After completion of the transfer, the sequencer 25 sets the signal /RB to an "H" level and informs the memory controller 10 that the semiconductor memory device 20 is in a ready state. At this time point, the information stored in the register 24 becomes unnecessary and another command set may be received.

Subsequently, the memory controller 10 issues a command set (i.e., a command "XXh", an address ADD over 5 cycles, and a command "YYh") to each of the planes PB4 to PB6, and transmits the issued command set to the semiconductor memory device 20.

Subsequently, the memory controller 10 issues a command set (i.e., a command "XXh", an address ADD over 5 cycles, and a command "ZZh") to the plane PB7, and transmits the issued command set to the semiconductor memory device 20. Upon receiving the command "ZZh", the sequencer 25 sets the signal /RB to an "L" level, stores the command set in the register 24, and thereafter, transmits the block address BLKADD stored in the register 24 to the planes PB4 to PB7 to be operated. After completion of the transfer, the sequencer 25 executes the operation of the planes PB0 to PB7 in synchronization. After completion of the operation, the sequencer 25 sets the signal /RB to an "H" level and informs the memory controller 10 that the semiconductor memory device 20 is in a ready state.

Thus, the synchronous operation of the planes PB0 to PB7 is ended.

With the above-described operation, even when the number of signal lines that supply the signal BLKADD SEL is reduced to four and the number of block address registers 243 is reduced to four block addresses BLKADD, it is possible to operate the 8 planes PB in synchronization. In a similar manner, it is possible to operate all 16 planes PB in synchronization.

2.6. Third Modification

In the second embodiment, descriptions have been made on the case where the 4-bit signal PB_SEL<3:0> is used. However, the present disclosure is not limited thereto. For example, a 2-bit signal PB_SEL<1:0> may be used. In the following description, the explanation on the same configuration and operation as those of the second embodiment will not be repeated for the sake of simplicity, and the configuration and operation different from those of the second embodiment will be mainly described.

2.6.1. Configuration of Register and Sequencer

Figure 25:
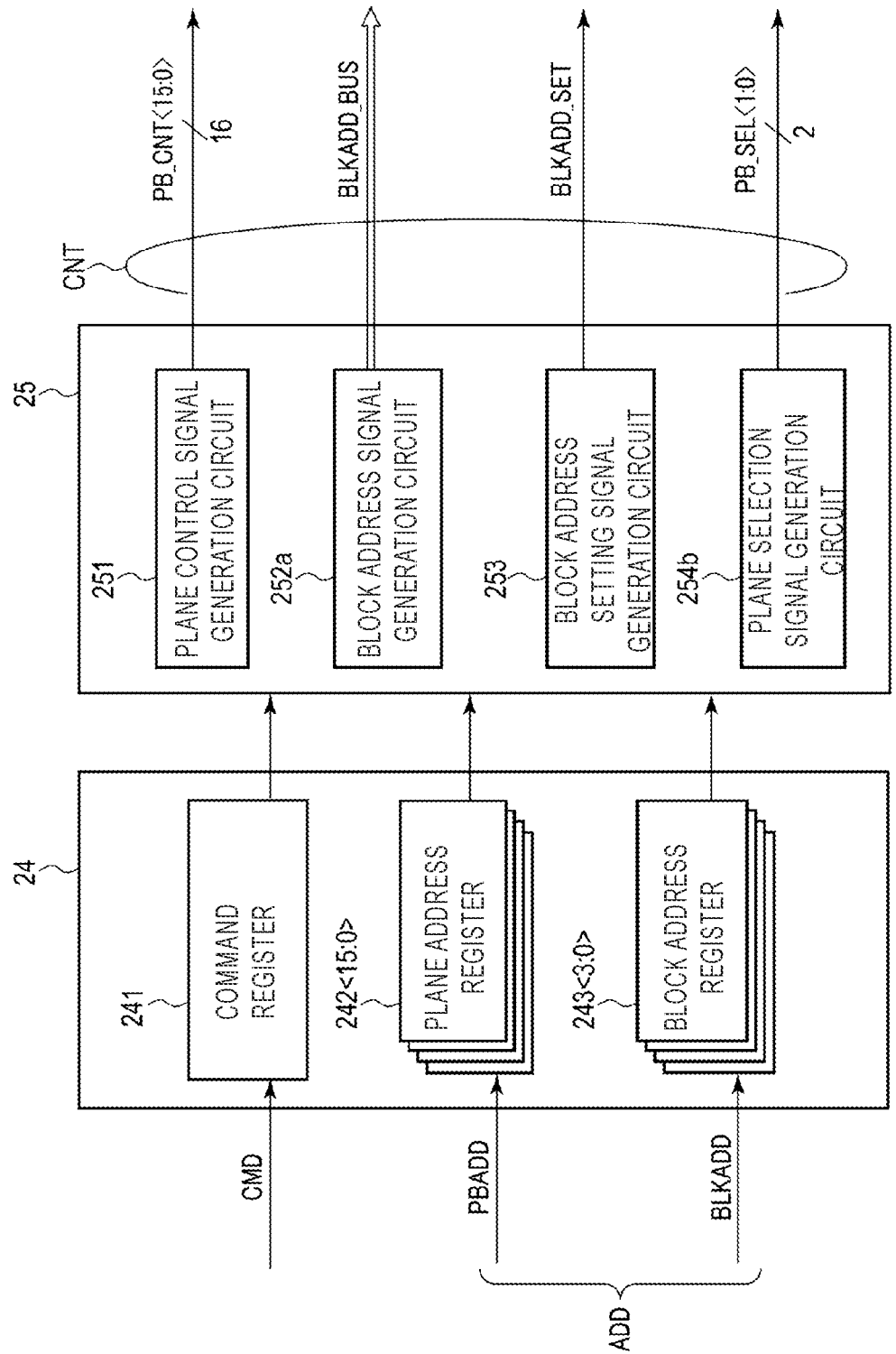
FIG. 25 is a schematic diagram for explaining the configuration of a register and a sequencer of a semiconductor memory device according to a third modification of the second embodiment.

FIG. 25 is a schematic diagram for explaining the configuration of a register and a sequencer of a semiconductor memory device according to a third modification of the second embodiment. FIG. 25 corresponds to FIG. 14 in the second embodiment and schematically illustrates control signals CNT (signals PB_CNT<15:0>, BLKADD_BUS, BLKADD_SET and PB_SEL<1:0>) output from the sequencer 25 based on a command set (a command CMD and an address ADD) input to the register 24.

As illustrated in FIG. 25, the sequencer 25 includes a plane selection signal generation circuit 254b instead of the plane selection signal generation circuit 254.

Since the register 24 has the same configuration as that of FIG. 14, explanations thereof will not be repeated.

The plane selection signal generation circuit 254b generates a 2-bit signal PB_SEL<1:0> that may individually specify sets PSET0 to PSET3 of a plane PB and outputs the generated signal PB_SEL<1:0> to two signal lines one bit by one bit. For example, the signal PB_SEL<1:0> is a signal commonly input to all the planes PB together with the signal BLKADD_SET and has a function of identifying a plane PB to which the period during which the block address BLKADD designated by the signal BLKADD_SET may be transferred, corresponds.

FIG. 26 is a table that shows the correspondence relationship between the signals generated in the plane selection signal generation circuit of the semiconductor memory device according to the third modification of the second embodiment, and the planes.

As illustrated in FIG. 26, the signal PB_SEL<1:0> has individual data allocated to each set PSET. Specifically, for example, the data "00" of the signal PB_SEL<1:0> corresponds to the set PSET0, the data "01" of the signal corresponds to the set PSET1, the data "10" of the signal corresponds to the set PSET2, and the data "11" of the signal corresponds to the set PSET3. The correspondence relationship illustrated in FIG. 26 is merely an example and any allocation may be applied as long as the sets PSET0 to PSET3 may be identified with a 2-bit signal.

Figure 27:
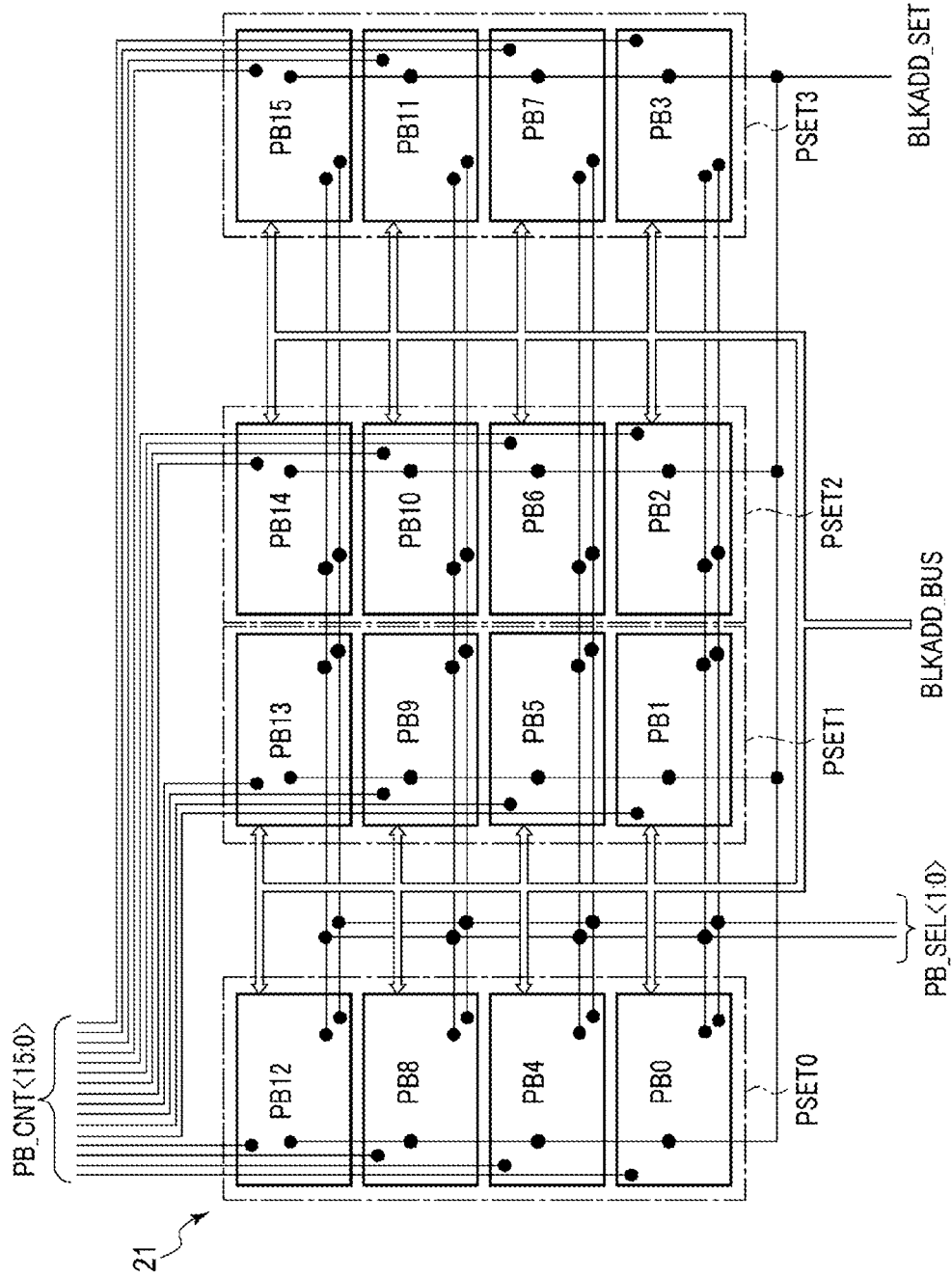
FIG. 27 is a schematic diagram that illustrates a connection relationship between a control signal output from a sequencer and a core unit in the semiconductor memory device according to the third modification of the second embodiment.

FIG. 27 is a schematic diagram that illustrates a connection relationship between the control signals output from the sequencer and the core unit in the semiconductor memory device according to the third modification of the second embodiment. FIG. 27 corresponds to FIG. 16 illustrated in the second embodiment.

As illustrated in FIG. 27, the signals BLKADD_BUS, BLKADD_SET and PB_SEL<1:0> are input commonly to all the planes PB0 to PB15.

As in the case of FIG. 16, a signal PB_CNT<k> is input to a plane PBk.

2.6.2. Configuration of Block Decoder

Figure 28:
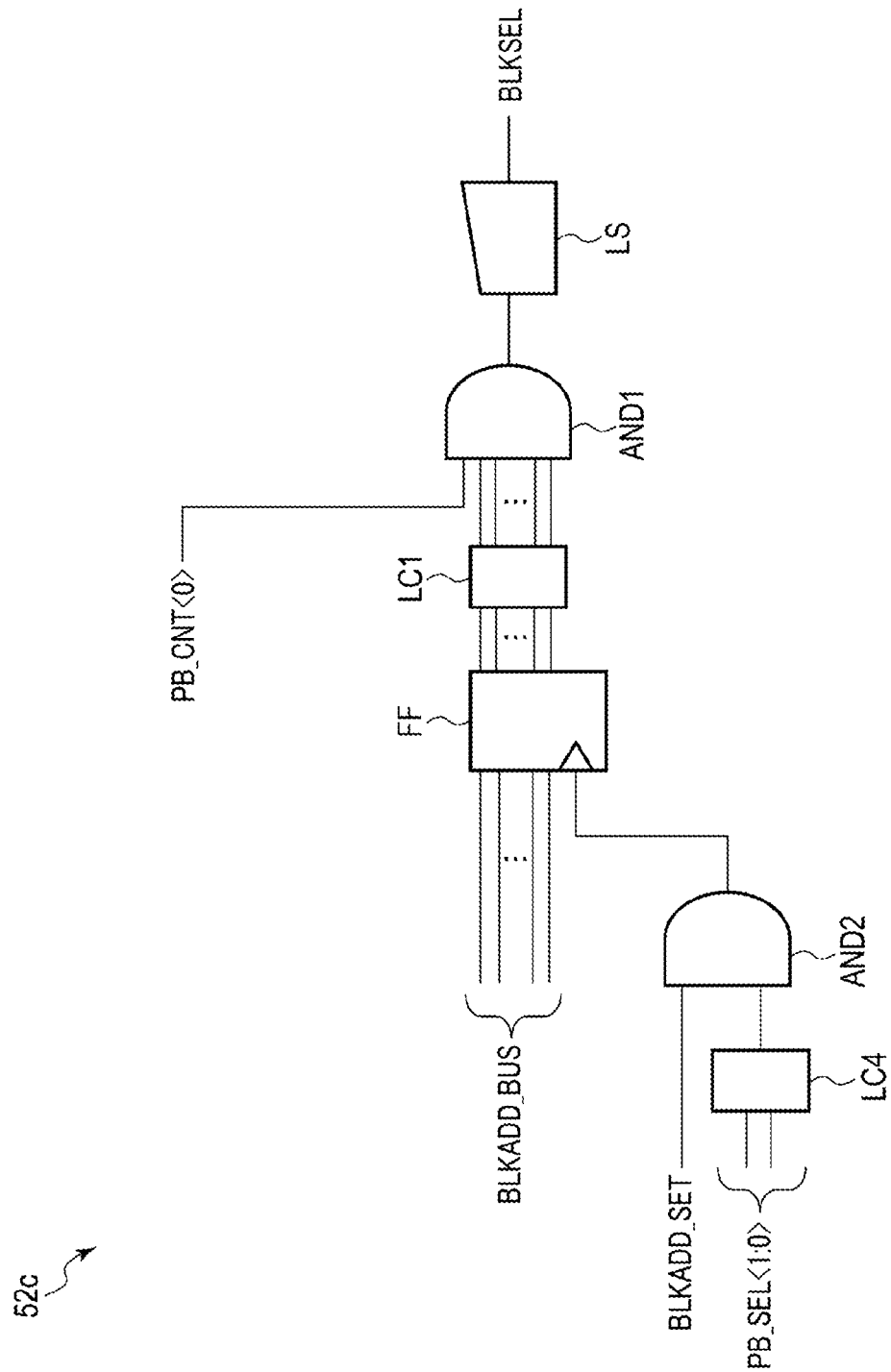
FIG. 28 is a circuit diagram for explaining the configuration of a block decoder of the semiconductor memory device according to the third modification of the second embodiment.

FIG. 28 is a circuit diagram for explaining the configuration of a block decoder of the semiconductor memory device according to the third modification of the second embodiment. FIG. 28 corresponds to FIG. 17 in the second embodiment and illustrates a block decoder 52c provided in the plane PB0 as an example.

As illustrated in FIG. 28, the block decoder 52c includes a logic circuit LC4 instead of the logic circuit LC2 in the block decoder 52a.

The logic circuit LC4 includes an input terminal supplied with the signal PB_SEL<1:0> via two signal lines, and an output terminal connected to the first input terminal of the logic circuit AND2. The logic circuit LC4 has different configurations corresponding to the set PSET in which the block decoder 52c is provided.

Specifically, for example, when the signal PB_SEL<1:0> having the data "00" corresponding to the set PSET0 is supplied to the logic circuit LC4 in the planes PB0, PB4, PB8 and PB12 corresponding to the set PSET0, the logic circuit LC4 outputs a signal of "H" level at the output terminal. When the signal PB_SEL<1:0> having data corresponding to the sets PSET other than the set PSET0 is supplied to the logic circuit LC4 corresponding to the set PSET0, the logic circuit LC4 outputs a signal of "L" level at the output terminal.

The same also applies to the logic circuits LC4 corresponding to the other sets PSET. For example, when the signal PB_SEL<1:0> has the data "01" corresponding to the set PSET1, the logic circuit LC4 in the planes PB1, PB5, PB9 and PB13 corresponding to the set PSET1 outputs a signal of "H" level at the output terminal. Otherwise, the logic circuit LC4 outputs a signal of "L" level at the output terminal.

With the above configuration, when the signal PB_SEL<1:0> hits in the corresponding set PSET and the signal BLKADD_SET is at the "H" level, the register FF may store the block address BLKADD in the signal BLKADD_BUS.

In the example of FIG. 28, descriptions have been made on the case where one set of logic circuits LC4 and AND2 and the register FF is provided for all the block decoders 52c in each plane PB. However, the present disclosure is not limited thereto. For example, it is sufficient when only one set of logic circuits LC4 and AND2 and the register FF is provided for each plane PB and the output signal from the register FF is supplied to the logic circuits LC1 in all the block decoders 52c in the same set PSET.

2.6.3. Synchronous Operation of Plural Planes

Figure 29:
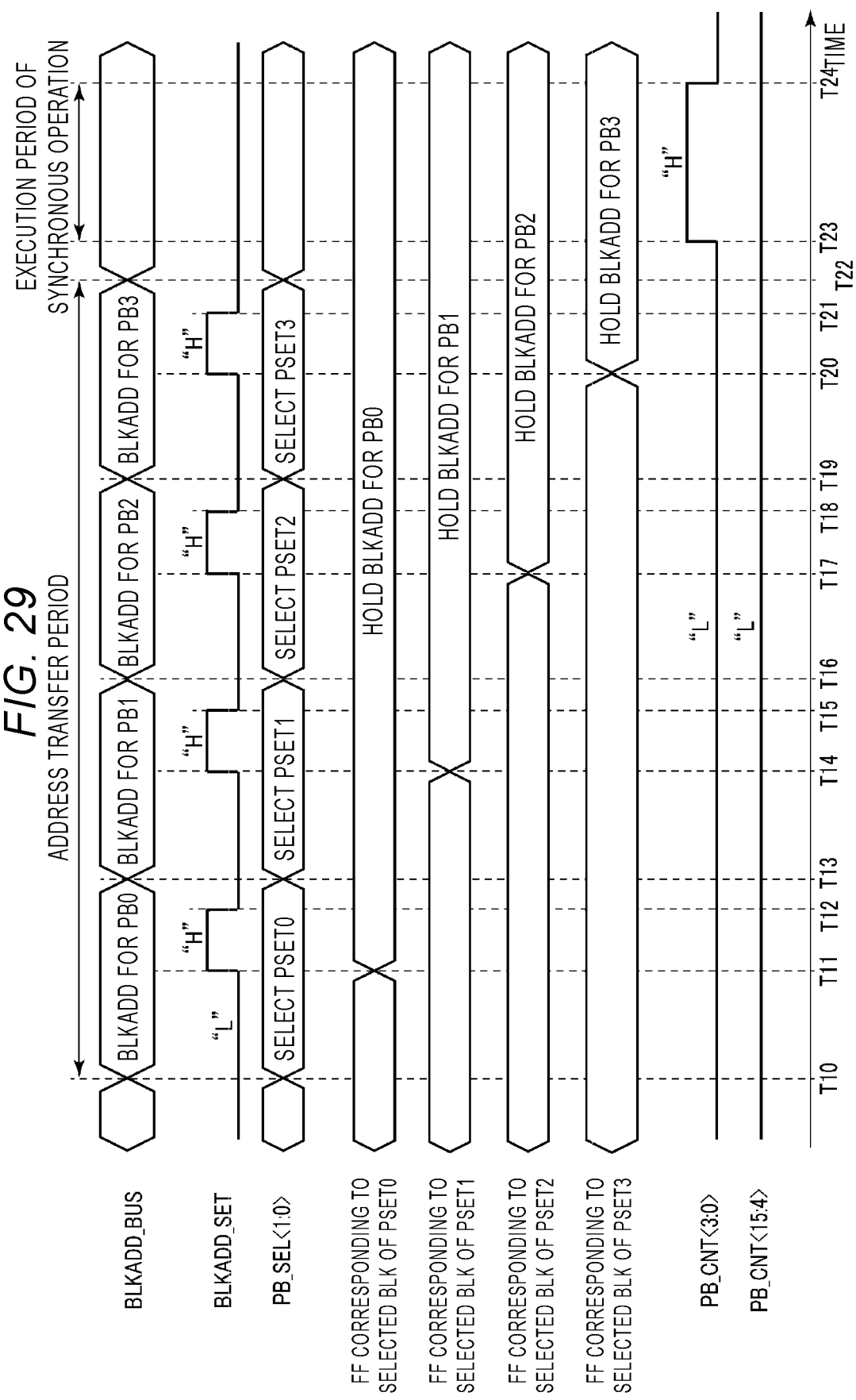
FIG. 29 is a timing chart for explaining a synchronous operation of plural planes in the semiconductor memory device according to the third modification of the second embodiment.

Next, descriptions will be made on a synchronous operation of plural planes in the semiconductor memory device according to the third modification of the second embodiment. FIG. 29 is a timing chart for explaining a synchronous operation of plural planes in the semiconductor memory device according to the third modification of the second embodiment. FIG. 29 corresponds to FIG. 18 in the second embodiment.

As illustrated in FIG. 29, the signal BLKADD_BUS is transferred to all the planes PB in time series at periods of T10 to T13, T13 to T16, T16 to T19 and T19 to T22 in a state where the signal BLKADD_BUS includes the block address BLKADD for the set PSET0 to the block address BLKADD for the set PSET3.

Specifically, at time T10, the block address signal generation circuit 252a generates the signal BLKADD_BUS including the block address BLKADD for the plane PB0 and transfers the generated signal to all the planes PB. In addition, the plane selection signal generation circuit 254b generates the signal PB_SEL<1:0> including the data "00" that selects the set PSET0 and transfers the generated signal to all the planes PB. As a result, the logic circuit LC4 of the block decoder 52c in the set PSET0 outputs an "H" level to the first input terminal of the logic circuit AND2. Meanwhile, the logic circuits LC4 of the block decoders 52c in the other set PSET1 to PSET3 output an "L" level.

At time T11, the block address setting signal generation circuit 253 sets the signal BLKADD_SET to an "H" level. As a result, an "H" level is input to the second input terminal of the logic circuit AND2 of the block decoder 52c in the set PSET0, and an "H" level is input to the clock input terminal of the register FF. Along with this, the block address BLKADD for the plane PB0 is stored in the register FF of the block decoder 52c in the set PSET0.

At time T12, the block address setting signal generation circuit 253 sets the signal BLKADD_SET to an "L" level. As a result, an "L" level is input to the clock input terminal of the register FF of the block decoder 52c in the set PSET0, and the address transfer to the register FF is completed.

As the address transfer to the set PSET0 is performed, the block address BLKLADD for the plane PB0 hits in the specific block decoder 52c in the set PSET0. However, since the signals PB_CNT<0>, PB_CNT<4>, PB_CNT<8> and PB_CNT<12> are at the "L" level at time T12, the block decoder 52c which is hit by the block address BLKADD for the plane PB0 does not output a signal of "H" level to the node BLKSEL.

Subsequently, at time T13, the block address signal generation circuit 252a generates the signal BLKADD_BUS including the block address BLKADD for the plane PB1 and transfers the generated signal to all the planes PB. Further, the plane selection signal generation circuit 254b generates the signal PB_SEL<1:0> including the data "01" that selects the set PSET1 and transfers the generated signal to all the planes PB. As a result, the logic circuit LC4 of the block decoder 52c in the set PSET1 outputs an "H" level to the first input terminal of the logic circuit AND2. Meanwhile, the logic circuits LC4 of the block decoders 52c in the other sets PSET0, PSET2 and PSET3 output an "L" level.

At time T14, the block address setting signal generation circuit 253 sets the signal BLKADD_SET to an "H" level.

As a result, an "H" level is input to the second input terminal of the logic circuit AND2 of the block decoder 52c in the set PSET1, and an "H" level is input to the clock input terminal of the register FF. Along with this, the block address BLKADD for the plane PB1 is stored in the register FF of the block decoder 52c in the set PSET1.

At time T15, the block address setting signal generation circuit 253 sets the signal BLKADD_SET to an "L" level. As a result, an "L" level is input to the clock input terminal of the register FF of the block decoder 52c in the set PSET1, and the address transfer to the register FF is completed.

As the address transfer to the set PSET1 is performed, the block address BLKLADD for the plane PB1 hits in the specific block decoder 52c in the set PSET1. However, since the signals, PB_CNT<1>, PB_CNT<5>, PB_CNT<9> and PB_CNT<13> are at the "L" level at time T15, the block decoder 52c which is hit by the block address BLKADD for the plane PB1 does not output a signal of "H" level to the node BLKSEL.

Subsequently, at time T16, the block address signal generation circuit 252a generates the signal BLKADD_BUS including the block address BLKADD for the plane PB2 and transfers the generated signal to all the planes PB. In addition, the plane selection signal generation circuit 254a generates the signal PB_SEL<1:0> including the data "10" that selects the set PSET2 and transfers the generated signal to all the planes PB. As a result, the logic circuit LC4 of the block decoder 52c in the set PSET2 outputs an "H" level to the first input terminal of the logic circuit AND2. Meanwhile, the logic circuits LC4 of the block decoders 52c in the other sets PSET0, PSET1 and PSET3 output an "L" level.

At time T17, the block address setting signal generation circuit 253 sets the signal BLKADD_SET to an "H" level. As a result, an "H" level is input to the second input terminal of the logic circuit AND2 of the block decoder 52c in the set PSET2, and an "H" level is input to the clock input terminal of the register FF. Along with this, the block address BLKADD for the plane PB2 is stored in the register FF of the block decoder 52c in the set PSET2.

At time T18, the block address setting signal generation circuit 253 sets the signal BLKADD_SET to an "L" level. As a result, an "L" level is input to the clock input terminal of the register FF of the block decoder 52c in the set PSET2, and the address transfer to the register FF is completed.

As the address transfer to the set PSET2 is performed, the block address BLKLADD for the plane PB2 hits in the specific block decoder 52c in the set PSET2. However, at time T18, since the signals PB_CNT<2>, PB_CNT<6>, PB_CNT<10> and PB_CNT<14> are at the "L" level, the block decoder 52c which is hit by the block address BLKADD for the plane PB2 does not output a signal of "H" level to the node BLKSEL.

At time T19, the block address signal generation circuit 252a generates the signal BLKADD_BUS including the block address BLKADD for the plane PB3 and transfers the generated signal to all the planes PB. In addition, the plane selection signal generation circuit 254a generates the signal PB_SEL<1:0> including the data "11" that selects the set PSET3 and transfers the generated signal to all the planes PB. As a result, the logic circuit LC4 of the block decoder 52c in the set PSET3 outputs an "H" level to the first input terminal of the logic circuit AND2. Meanwhile, the logic circuits LC4 of the block decoders 52c in the other sets PSET0 to PSET2 output an "L" level.

At time T20, the block address setting signal generation circuit 253 sets the signal BLKADD_SET to an "H" level. As a result, an "H" level is input to the second input terminal of the logic circuit AND2 of the block decoder 52*c* in the set PSET3, and an "H" level is input to the clock input terminal of the register FF. Along with this, the block address BLKADD for the plane PB3 is stored in the register FF of the block decoder 52*c* in the set PSET3.

At time T21, the block address setting signal generation circuit 253 sets the signal BLKADD_SET to an "L" level. As a result, an "L" level is input to the clock input terminal of the register FF of the block decoder 52*c* in the set PSET3, and the address transfer to the register FF is completed.

As the address transfer to the set PSET3 is performed, the block address BLKLADD for the plane PB3 hits in the specific block decoder 52*c* in the set PSET3. However, at time T21, since the signals PB_CNT<3>, PB_CNT<7>, PB_CNT<11> and PB_CNT<15> are at the "L" level, the block decoder 52*c* which is hit by the block address BLKADD for the plane PB3 does not output a signal of "H" level to the node BLKSEL.

At time T22, the block address signal generation circuit 252*a* ends the generation of the signal BLKADD_BUS including the block address BLKADD. As a result, the transfer of all the block addresses BLKADD is ended.

At time T23, the plane control signal generation circuit 251 sets the signal PB_CNT<3:0> to an "H" level. As a result, the logic circuits AND1 of the block decoders 52*c* provided in the planes PB0 to PB3 are driven. Therefore, the selected blocks BLK in the planes PB0 to PB3 may be brought into a selected state. Accordingly, in the planes PB0 to PB3, a predetermined operation is performed on the selected blocks BLK.

At time T24, the plane control signal generation circuit 251 sets the signal PB_CNT<15:0> to an "L" level. As a result, the selected blocks BLK in the planes PB0 to PB3 are brought into a non-selected state, and the execution period of the operation is ended. Thus, the synchronous operation of the plural planes is completed.

2.6.4. Effects of this Modification

According to this modification, the number of signal lines that supply the signal BLKADD SEL is further reduced from four to two. As a result, at the time of transfer of the block address BLKADD for the plane PB0, the block address BLKADD for the plane PB0 is also stored in the registers FF in the other planes PB4, PB8 and PB12 in the set PSET0. However, the sequencer 25 may individually select the planes PB0 to PB15 according to the signal PB_CNT<15:0>. Therefore, the sequencer 25 may set the signals PB_CNT<0> to an "H" level and set the signals PB_CNT<4>, PB_CNT<8> and PB_CNT<12> to an "L" level so as to avoid the blocks BLK in the planes PB4, PB8 and PB12 from being selected. Accordingly, it is possible to achieve the same effects as in the second embodiment with a smaller number of signal lines.

2.7. Fourth Modification

In the third modification of the second embodiment, descriptions have been made on the case where the individual signals PB_CNT<15:0> for each plane PB are used to simultaneously select four of 16 planes PB. However, the present disclosure is not limited thereto. For example, in order to simultaneously select four of the 16 planes PB, the number of signal lines that supply the signal PB_CNT may be reduced. In the following description, the explanation on the same configuration and operation as those of the third modification of the second embodiment will not be repeated for the sake of simplicity, and the configuration and operation different from those of the third modification of the second embodiment will be mainly described.

2.7.1. Configuration of Register and Sequencer

Figure 30:
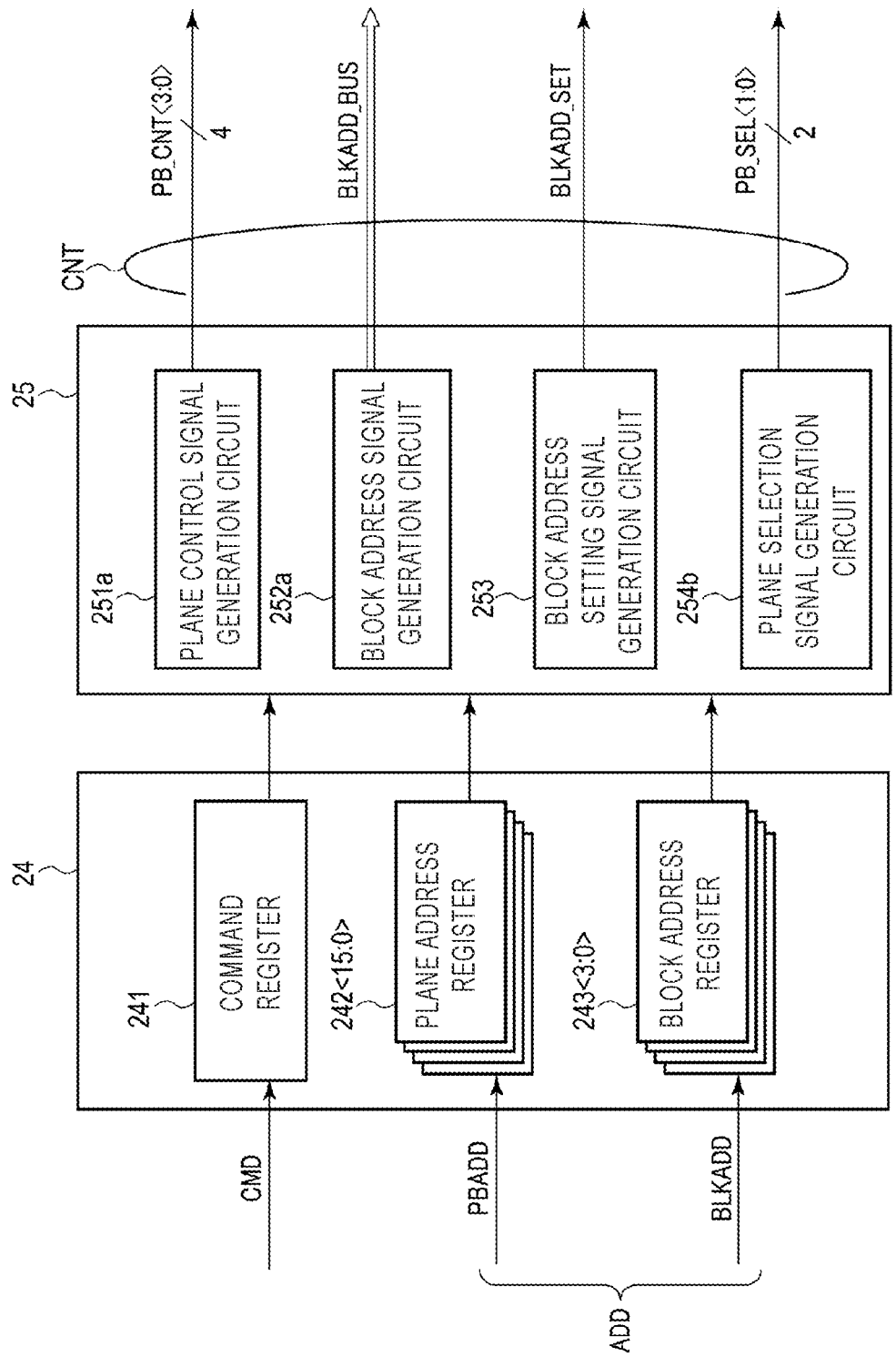
FIG. 30 is a schematic diagram for explaining the configuration of a register and a sequencer of a semiconductor memory device according to a fourth modification of the second embodiment.

FIG. 30 is a schematic diagram for explaining the configuration of a register and a sequencer of a semiconductor memory device according to a fourth modification of the second embodiment. FIG. 30 corresponds to FIG. 25 in the third modification of the second embodiment and schematically illustrates control signals CNT (signals PB_CNT<3:0>, BLKADD_BUS, BLKADD_SET and PB_SEL<1:0>) output from the sequencer 25 based on a command set (a command CMD and an address ADD) input to the register 24.

As illustrated in FIG. 30, the sequencer 25 includes a plane control signal generation circuit 251*a* instead of the plane control signal generation circuit 251.

Since the register 24 has the same configuration as that of FIG. 25, explanations thereof will not be repeated.

The plane control signal generation circuit 251*a* generates a signal PB_CNT<3:0>. For example, the signal PB_CNT<3:0> is a signal which is output to four signal lines each corresponding to one group GRP, and includes information indicating which group GRP to be activated.

Figure 31:
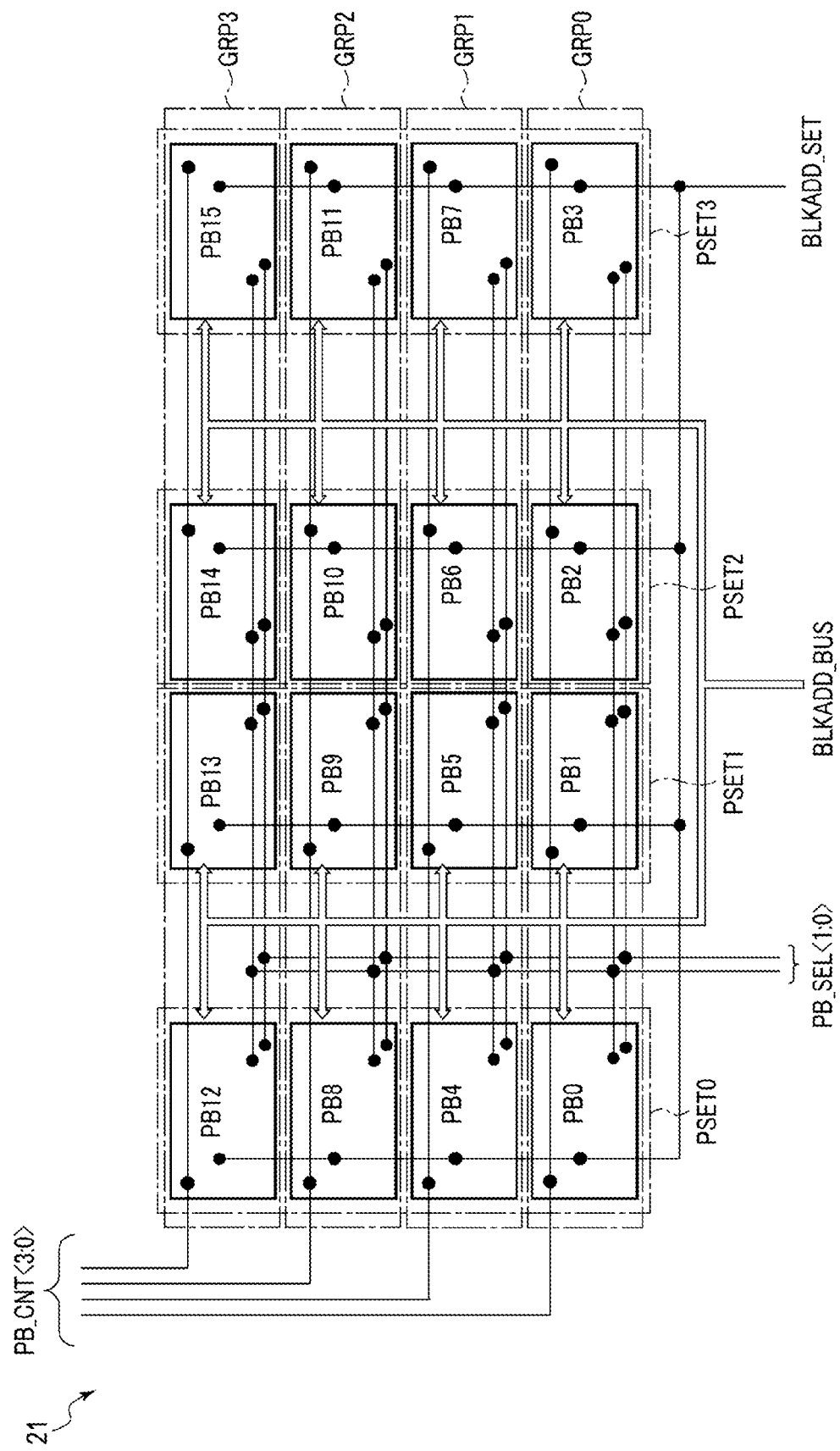
FIG. 31 is a schematic diagram that illustrates a connection relationship between a control signal output from a sequencer and a core unit in the semiconductor memory device according to the fourth modification of the second embodiment.

FIG. 31 is a schematic diagram that illustrates a connection relationship between the control signals output from the sequencer and the core unit in the semiconductor memory device according to the fourth modification of the second embodiment. FIG. 31 corresponds to FIG. 27 illustrated in the third modification of the second embodiment.

As illustrated in FIG. 31, the signals PB_CNT<0> to PB_CNT<3> are input to groups GRP0 (planes PB0 to PB3) to GRP3 (planes PB12 to PB15), respectively.

As in the case of FIG. 25, the signals BLKADD_BUS, BLKADD_SET and PB_SEL<1:0> are commonly input to all the planes PB0 to PB15.

2.7.2. Synchronous Operation of Plural Planes

Figure 32:
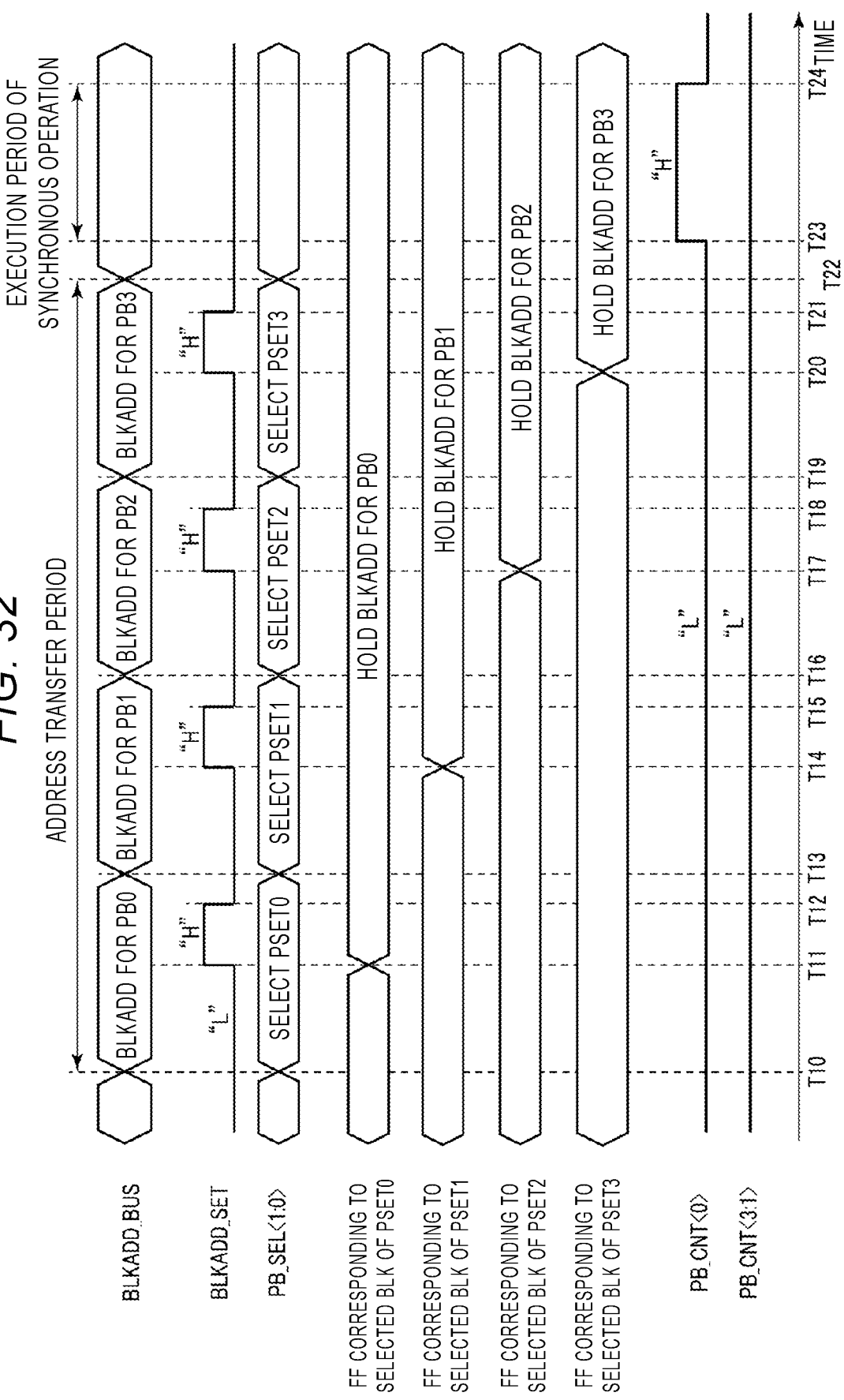
FIG. 32 is a timing chart for explaining a synchronous operation of plural planes in the semiconductor memory device according to the fourth modification of the second embodiment.

Next, descriptions will be made on a synchronous operation of plural planes in the semiconductor memory device according to the fourth modification of the second embodiment. FIG. 32 is a timing chart for explaining a synchronous operation of plural planes in the semiconductor memory device according to the fourth modification of the second embodiment. FIG. 32 corresponds to FIG. 29 in the third modification of the second embodiment.

As illustrated in FIG. 29, the operations up to times T10 to T22 are the same as those in FIG. 29 and therefore, explanations thereof will not be repeated.

At time T23, the plane control signal generation circuit 251*a* sets the signal PB_CNT<0> to an "H" level. As a result, the logic circuits AND1 of the block decoders 52*c* provided in the group GRP0 (planes PB0 to PB3) are driven. Therefore, the selected blocks BLK in the planes PB0 to PB3 may be brought into a selected state. Accordingly, in the planes PB0 to PB3, a predetermined synchronous operation is performed on the selected blocks BLK.

At time T24, the plane control signal generation circuit 251*a* sets the signal PB_CNT<0> to an "L" level. As a result, the selected blocks BLK in the planes PB0 to PB3 are brought into a non-selected state, and the execution period of the operation is ended. Thus, the synchronous operation of the plural planes is completed.

2.7.4. Effects of this Modification

According to this modification, the number of signal lines that supply the signal PB_CNT is further reduced from 16 to 4. As a result, when selecting planes PB to be operated in synchronization, the signals PB_CNT to the four planes PB0 to PB3 to which an "H" level is simultaneously transferred are commonly used. Therefore, the sequencer 25 may set the signal PB_CNT<0> supplied commonly to the planes PB0 to PB3 to an "H" level so that the blocks BLK in the planes PB0 to PB3 may be selected. Further, the sequencer 25 may set the signal PB_CNT<3:1> to an "L" level so as to avoid the blocks BLK in the planes PB4 to PB15 from being selected. Accordingly, it is possible to achieve the same effects as in the second embodiment with a smaller number of signal lines.

The fourth modification of the second embodiment has shown a case where the group GRP is selected by using the signal PB_CNT<3:0> and the set PSET is selected by using the signal PB_SEL<1:0>. The present disclosure is not limited thereto. For example, a selection range of the signal PB_SEL<1:0> and the signal PB_CNT<3:0> may be reversed. That is, the group GRP may be selected by the signal PB_SEL<1:0>, whereas the set PSET may be selected by the signal PB_CNT<3:0>.

2.8. Fifth Modification

In the fourth modification of the second embodiment, descriptions have been made on the case where four of the 16 planes PB are always selected at the same time by reducing the number of signal lines that supply the signal PB_CNT. However, the present disclosure is not limited thereto. For example, any ones of the 16 planes PB may be individually selected while reducing the number of signal lines that supply the signal PB_CNT. In the following description, the explanation on the same configuration and operation as those of the fourth modification of the second embodiment will not be repeated for the sake of simplicity, and the configuration and operation different from those of the fourth modification of the second embodiment will be mainly described.

2.8.1. Configuration of Register and Sequencer

Figure 33:
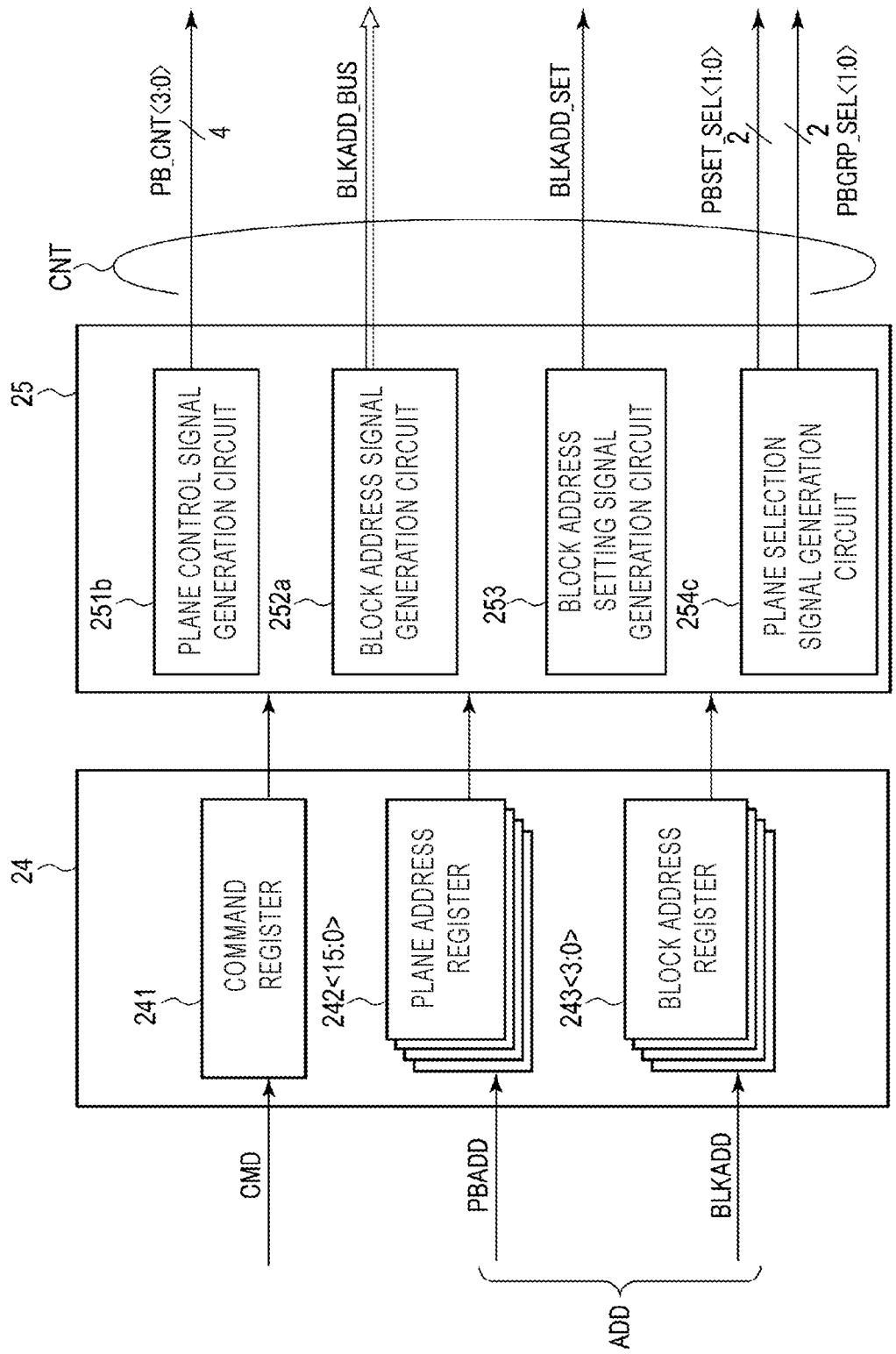
FIG. 33 is a schematic diagram for explaining the configuration of a register and a sequencer of a semiconductor memory device according to a fifth modification of the second embodiment.

FIG. 33 is a schematic diagram for explaining the configuration of a register and a sequencer of a semiconductor memory device according to a fifth modification of the second embodiment. FIG. 33 corresponds to FIG. 30 in the fourth modification of the second embodiment and schematically illustrates control signals CNT (signals PB_CNT<3:0>, BLKADD_BUS, BLKADD_SET, PBSET_SEL<1:0> and PBGRP_SEL<1:0>) output from the sequencer 25 based on a command set (a command CMD and an address ADD) input to the register 24.

As illustrated in FIG. 33, the sequencer 25 includes a plane control signal generation circuit 251b instead of the plane control signal generation circuit 251a, and a plane selection signal generation circuit 254c instead of the plane selection signal generation circuit 254b.

Since the register 24 has the same configuration as that of FIG. 30, explanations thereof will not be repeated.

The plane control signal generation circuit 251b generates and outputs a signal PB_CNT<3:0>. For example, the signal PB_CNT<3:0> is a signal which is output to four signal lines each corresponding to one set PSET and includes information indicating which set PSET to be activated.

The plane selection signal generation circuit 254c generates a 2-bit signal PBSET_SEL<1:0> that may individually specify sets PSET0 to PSET3 of a plane PB and outputs the generated signal PBSET_SEL<1:0> to two signal lines one bit by one bit. In addition, the plane selection signal generation circuit 254c generates a 2-bit signal PBGRP_SEL<1:0> that may individually specify groups GRP0 to GRP3 of a plane PB and outputs the generated signal PBGRP_SEL<1:0> to two signal lines one bit by one bit. For example, the signals PBSET_SEL<1:0> and PBGRP_SEL<1:0> are signals commonly input to all the planes PB together with the signal BLKADD_SET and have a function of identifying a plane PB to which the period during which the block address BLKADD designated by the signal BLKADD_SET may be transferred, corresponds.

FIG. 34 is a table that shows the correspondence relationship between the signals generated in the plane selection signal generation circuit of the semiconductor memory device according to the fifth modification of the second embodiment, and the planes.

As illustrated in FIG. 34, the signal PBSET_SEL<1:0> has individual data allocated to each set PSET.

Specifically, for example, the data "00" of the signal PBSET_SEL<1:0> corresponds to the set PSET0, the data "01" of the signal corresponds to the set PSET1, the data "10" of the signal corresponds to the set PSET2, and the data "11" of the signal corresponds to the set PSET3.

In addition, the signal PBGRP_SEL<1:0> has individual data allocated to each group GRP. Specifically, for example, the data "00" of the signal PBGRP_SEL<1:0> corresponds to the group GRP0, the data "01" of the signal corresponds to the group GRP1, the data "10" of the signal corresponds to the group GRP2, and the data "11" of the signal corresponds to the group GRP3. The correspondence relationship illustrated in FIG. 34 is merely an example and any allocation may be applied as long as the sets PSET0 to PSET3 may be identified with a 2-bit signal and the groups GRP0 to GRP3 may be identified with another 2-bit signal.

Figure 35:
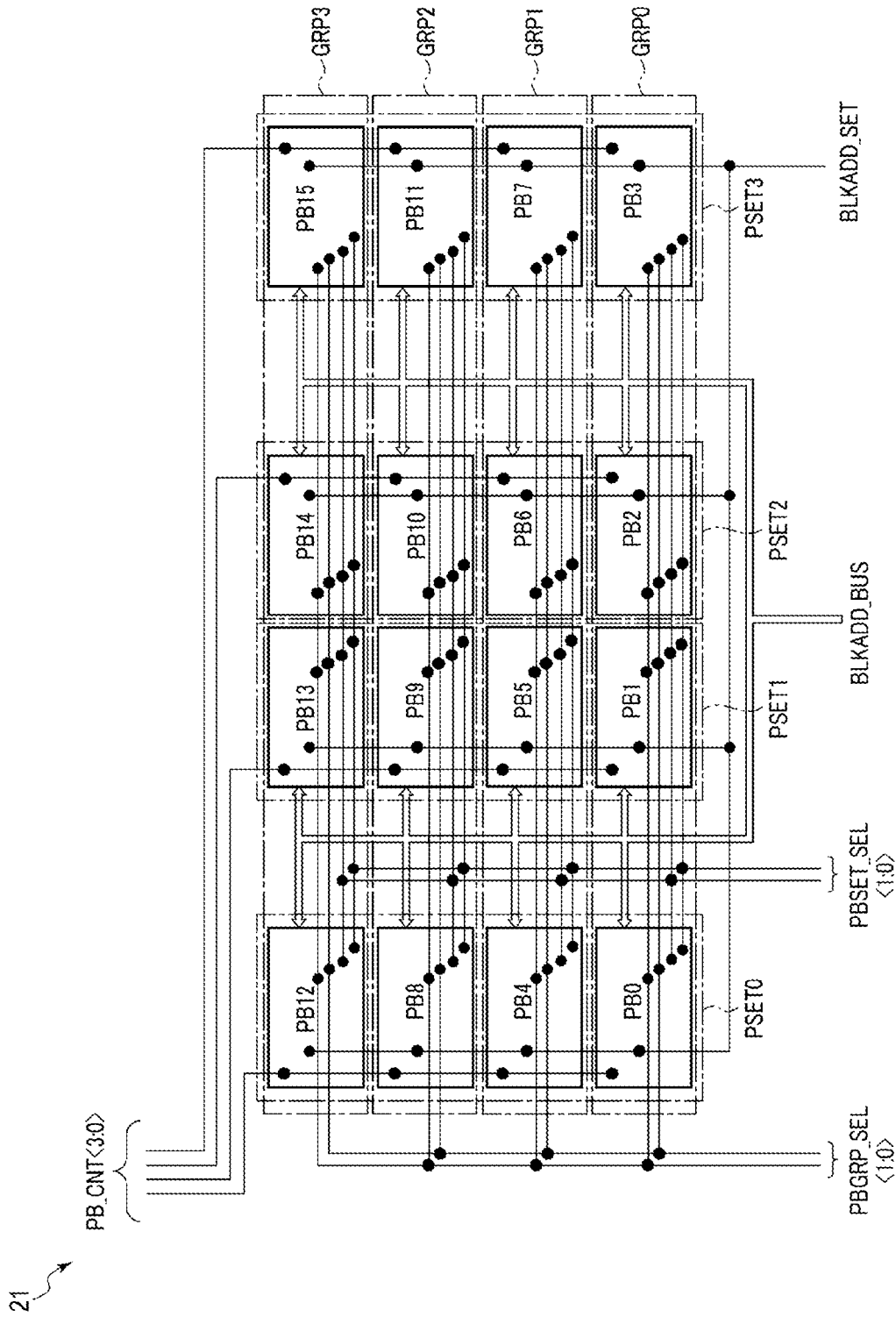
FIG. 35 is a schematic diagram that illustrates a connection relationship between a control signal output from a sequencer and a core unit in the semiconductor memory device according to the fifth modification of the second embodiment.

FIG. 35 is a schematic diagram that illustrates a connection relationship between the control signals output from the sequencer and the core unit in the semiconductor memory device according to the fifth modification of the second embodiment. FIG. 35 corresponds to FIG. 31 illustrated in the fourth modification of the second embodiment.

As illustrated in FIG. 35, the signals PB_CNT<0> to PB_CNT<3> are input to the sets PSET0 (the planes PB0, PB4, PB8 and PB12) to PSET3 (PB3, PB7, PB11 and PB 15), respectively.

In addition, the signals PBSET_SEL<1:0> and PBGRP<1:0> are input commonly to all the planes PB0 to PB15 in the same manner as the signals BLKADD_BUS and BLKADD_SET.

2.8.2. Configuration of Block Decoder

Figure 36:
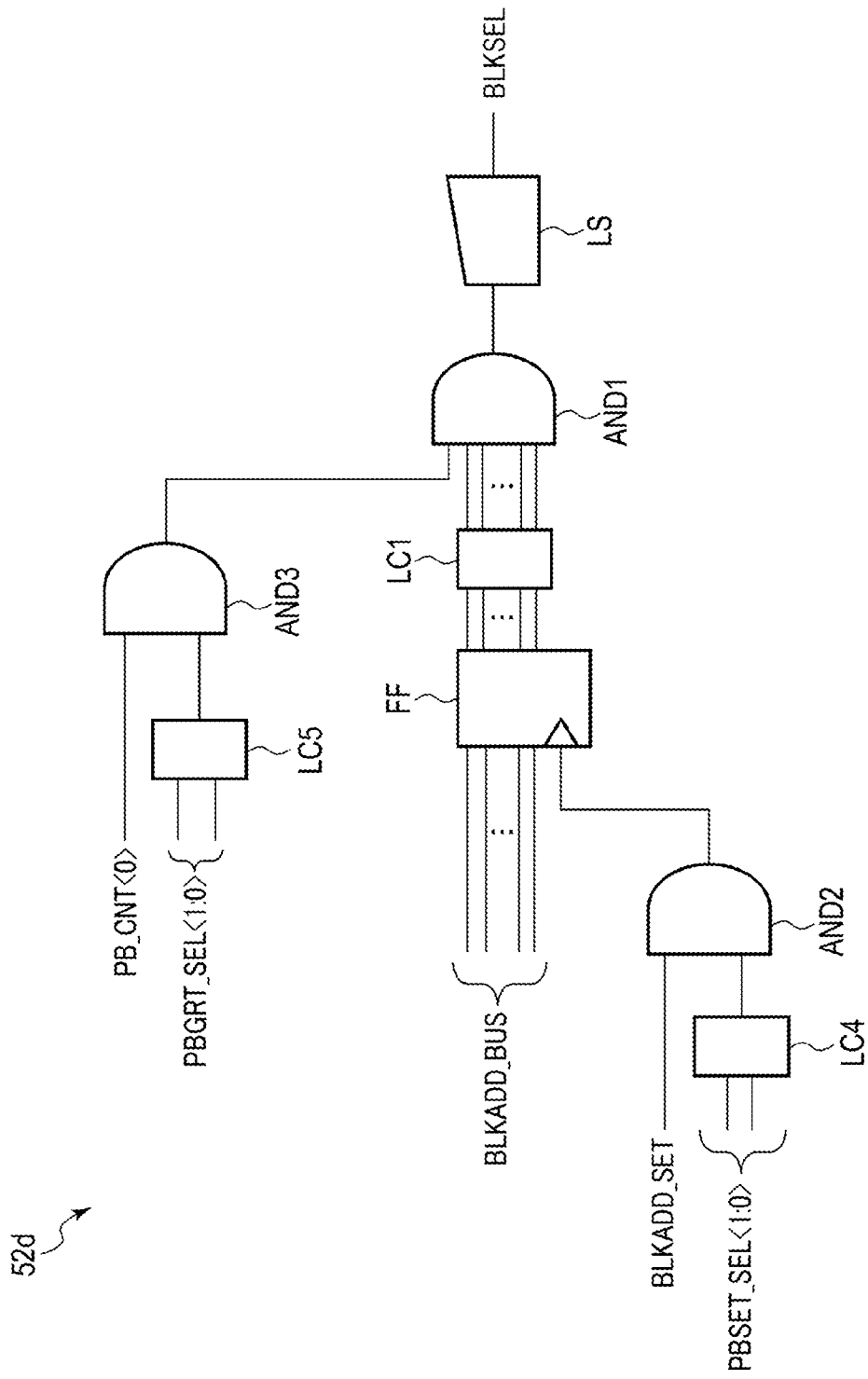
FIG. 36 is a circuit diagram for explaining the configuration of a block decoder of the semiconductor memory device according to the fifth modification of the second embodiment.

FIG. 36 is a circuit diagram for explaining the configuration of a block decoder of the semiconductor memory device according to the fifth modification of the second embodiment. FIG. 36 corresponds to FIG. 28 in the third modification of the second embodiment and illustrates a block decoder 52d provided in the plane PB0 as an example.

As illustrated in FIG. 36, the block decoder 52d further includes logic circuits LC5 and AND3 in addition to the block decoder 52c.

The logic circuit LC5 includes an input terminal supplied with the signal PBGRP_SEL<1:0> via two signal lines, and an output terminal connected to the first input terminal of the logic circuit AND3. The logic circuit LC5 has different configurations corresponding to the group GRP in which plane PB of the block decoder 52d belongs.

Specifically, for example, when the signal PBGRP_SEL<1:0> having the data "00" corresponding to the group GRP0 is supplied to the logic circuit LC5 in the planes PB0 to PB3 corresponding to the group GRP0, the logic circuit LC5 outputs a signal of "H" level at the output terminal. When the signal PBGRP_SEL<1:0> having data corresponding to the groups GRP other than the group GRP0 is supplied to the logic circuit LC5 corresponding to the group GRP0, the logic circuit LC5 outputs a signal of "L" level at the output terminal.

The same also applies to the logic circuits LC5 corresponding to the other groups GRP. For example, when the signal PBGRP_SEL<1:0> has the data "01" corresponding to the group GRP1, the logic circuit LC5 in the planes PB4 to PB7 corresponding to the group GRP1 outputs a signal of "H" level at the output terminal. Otherwise, the logic circuit LC5 outputs a signal of "L" level at the output terminal.

The logic circuit AND3 includes a first input terminal supplied with an output from the logic circuit LC5, a second input terminal supplied with one (the signal PB_CNT<0> in the case of FIG. 36) of the signals PB_CNT<3:0>, and an input terminal connected to the second input terminal of the logic circuit AND1. The logic circuit AND3 is, for example, an AND operator, which outputs an "H" level when both the first input terminal and the second input terminal are at an "H" level, and outputs an "L" level otherwise.

With the above configuration, when the signal PBGRP_SEL<1:0> hits in the corresponding group GRP and the signal PB_CNT<3:0> input to the logic circuit AND3 is at the "H" level, an "H" level is input to the first input terminal of the logic circuit AND1.

In the example of FIG. 36, descriptions have been made on the case where one set of logic circuits LC5 and AND3 is provided for all the block decoders 52d in each plane PB. However, the present disclosure is not limited thereto. For example, it is sufficient when only one set of logic circuits LC5 and AND3 is provided for each group GRP and the output signal of the logic circuit AND3 is supplied to the logic circuits AND1 in all the block decoders 52d in the same group GRP.

2.8.2. Synchronous Operation of Plural Planes

Figure 37:
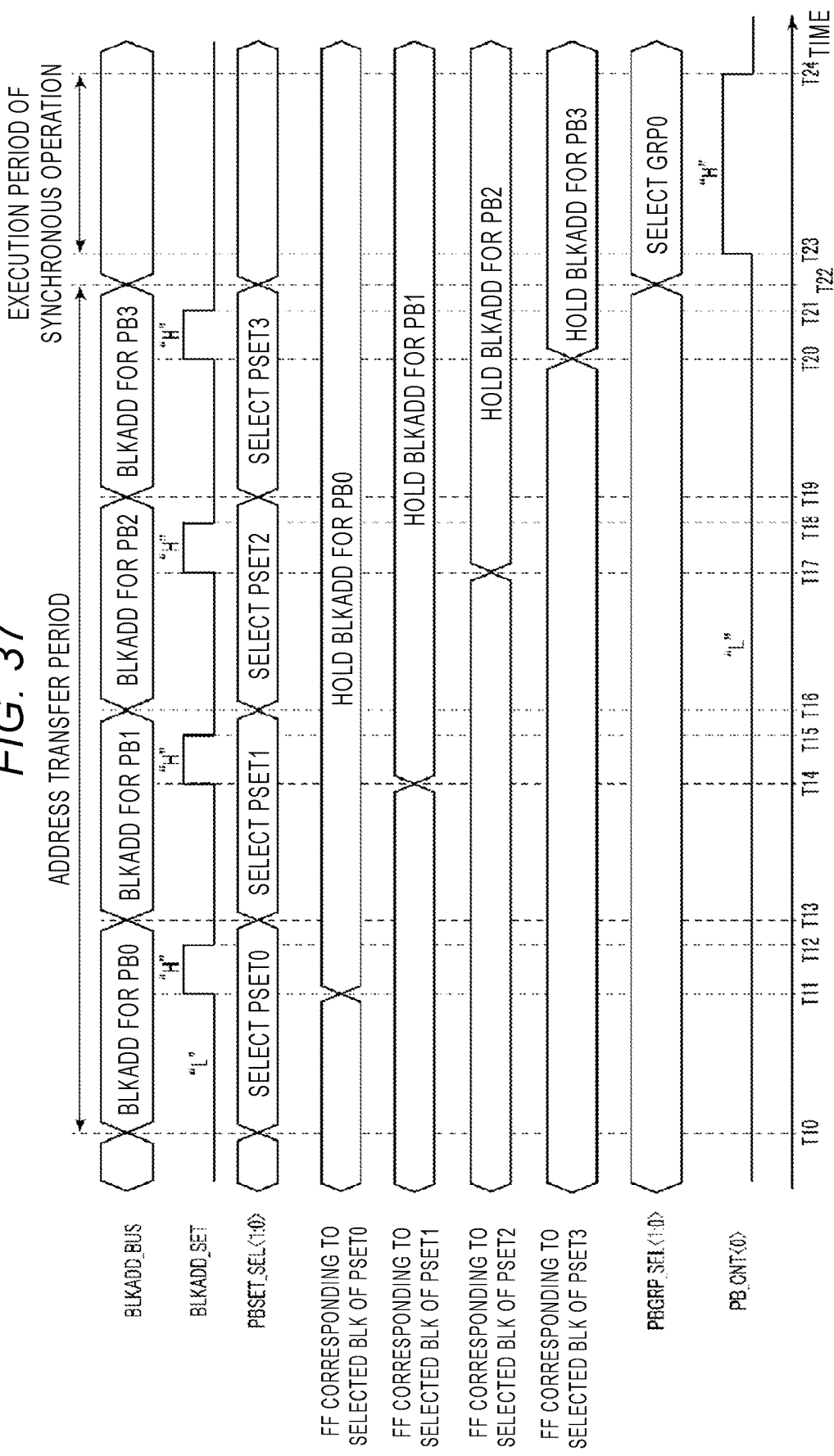
FIG. 37 is a timing chart for explaining a synchronous operation of plural planes in the semiconductor memory device according to the fifth modification of the second embodiment.

Next, descriptions will be made on a synchronous operation of plural planes in the semiconductor memory device according to the fifth modification of the second embodiment. FIG. 37 is a timing chart for explaining a synchronous operation of plural planes in the semiconductor memory device according to the fifth modification of the second embodiment. FIG. 37 corresponds to FIG. 32 in the fourth modification of the second embodiment.

As illustrated in FIG. 37, the operations up to times T10 to T21 are the same as those in FIG. 32 and therefore, explanations thereof will not be repeated.

At time T22, the plane selection signal 254c generates the signal PBGRP_SEL<1:0> including the data "00" that selects the group GRP0 and transfers the generated signal to all the planes PB. As a result, the logic circuit LC5 of the block decoder 52d in the group GRP0 outputs an "H" level to the first input terminal of the logic circuit AND3. Meanwhile, the logic circuits LC5 of the block decoders 52d in the other groups GRP1 to GRP3 output an "L" level.

At time T23, the plane control signal generation circuit 251b sets the signal PB_CNT<3:0> to an "H" level. As a result, the logic circuits AND3 of the block decoders 52d provided in the planes PB0 to PB3 output an "H" level and the logic circuit AND1 outputs an "H" level. Therefore, the selected blocks BLK in the planes PB0 to PB3 may be brought into a selected state. Accordingly, in the planes PB0 to PB3, a predetermined operation is performed on the selected blocks BLK.

At time T24, the plane control signal generation circuit 251 sets the signal PB_CNT<3:0> to an "L" level. As a result, the selected blocks BLK in the planes PB0 to PB3 are brought into a non-selected state, and the execution period of the operation is ended. Thus, the synchronous operation of the plural planes is completed.

2.8.4. Effects of this Modification

According to this modification, the number of signal lines that supply the signal PB_CNT is further reduced from 16 to 4. As a result, when selecting planes PB to be operated in synchronization, the signal PB_CNT to each of the four sets PSET0 to PSET3 to which the "H" level is transferred at the same time is commonly used. Further, the plane selection signal PBGRP_SEL<1:0> may select each group GRP independently. Therefore, the sequencer 25 may select the blocks BLK in the planes PB0 to PB3 by setting the signal PB_CNT<3:0> to an "H" level and select the group GRP0 by using the signal PBGRP_SEL<1:0>. Therefore, a synchronous operation of the plural planes may be executed.

Further, for example, it is also possible to select only the plane PB0 by setting the signal PB_CNT<0> of the signals PB_CNT<3:0> to an "H" level and setting the signal PB_CNT<3:1> to an "L" level. As a result, it is possible to construct a configuration capable of executing both the synchronous operation of the plural planes PB and the independent operation by the single plane PB.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit, of the inventions. The accompanying claims and their equivalents are intended to cover such forms or modifications as would fall within the scope and spirit of the inventions.

What is claimed is:

1. A semiconductor memory device comprising:
   an input/output circuit through which a command and an address are input;
   a first register configured to store the command and the address;
   a plurality of planes including a first plane and a second plane, each of the planes including:
      a memory cell array including a plurality of memory cells;
      a row decoder including a level shifter, a first decode circuit, and a second register; and
      a sense amplifier module;
   a first plane selection line connected to the first decode circuit in the first plane;
   a second plane selection line connected to the first decode circuit in the second plane;
   an address designation line connected between the first register and the second register in the first plane and between the first register and the second register in the second plane; and
   a set line connected to the second register in the first plane and to the second register in the second plane.

2. The semiconductor memory device according to claim 1, wherein the plurality of planes further includes a third plane and a fourth plane, the semiconductor memory device further comprising:
   a third plane selection line connected to the first decode circuit in the third plane; and
   a fourth plane selection line connected to the first decode circuit in the fourth plane, wherein
   the address designation line is further connected to the second register in the third plane and to the second register in the fourth plane, and
   the set line is further connected to the second register in the third plane and to the second register in the fourth plane.

3. The semiconductor memory device according to claim 2, wherein
the row decoder in each of the first to fourth planes further includes a second decode circuit, and
the set line is connected between the first register and the second register in each of the first to fourth planes via the respective second decode circuit in each of the first to fourth planes.

4. The semiconductor memory device according to claim 3, wherein
upon receipt of a first set signal corresponding to the second decoder circuit in the first plane through the set line during supply of a first block address signal through the address designation line, the second register in the first plane stores the first block address signal, and
upon receipt of a second set signal corresponding to the second decoder circuit in the second plane through the set line during supply of a second block address signal through the address designation line, the second register in the second plane stores the second block address signal.

5. The semiconductor memory device according to claim 4, wherein
when a synchronous process is performed on the first plane and the second plane, a selection signal is applied to each of the first plane selection line and the second plane selection line to thereby select the first plane and the second plane.

6. The semiconductor memory device according to claim 5, wherein
in the synchronous process, an operation is performed in the first plane on a block corresponding to the first block address signal, and an operation is performed in the second plane on a block corresponding to the second block address signal.

7. The semiconductor memory device according to claim 3, wherein
upon receipt of a first set signal corresponding to the second decoder circuit in the first plane through the set line during supply of a first block address signal through the address designation line, the second register in the first plane stores the first block address signal,
upon receipt of a second set signal corresponding to the second decoder circuit in the second plane through the set line during supply of a second block address signal through the address designation line, the second register in the second plane stores the second block address signal,
upon receipt of a third set signal corresponding to the second decoder circuit in the third plane through the set line during supply of a third block address signal through the address designation line, the second register in the third plane stores the third block address signal, and
upon receipt of a fourth set signal corresponding to the second decoder circuit in the fourth plane through the set line during supply of a fourth block address signal through the address designation line, the second register in the fourth plane stores the fourth block address signal.

8. The semiconductor memory device according to claim 7, wherein
when a synchronous process is performed on the first to fourth planes, a selection signal is applied to each of the first to fourth plane selection lines to thereby select the first to fourth planes.

9. The semiconductor memory device according to claim 8, wherein
in the synchronous process:
an operation is performed in the first plane on a block corresponding to the first block address signal;
an operation is performed in the second plane on a block corresponding to the second block address signal;
an operation is performed in the third plane on a block corresponding to the third block address signal; and
an operation is performed in the fourth plane on a block corresponding to the fourth block address signal.

10. The semiconductor memory device according to claim 3, wherein
the second register in each of the first to fourth planes has a clock input terminal, and
a timing signal is supplied to the clock input terminal of each of the second registers to trigger storing of data on the address designation line therein.

11. A semiconductor memory device comprising:
a plurality of planes including a first plane and a second plane, each of the planes including:
a memory cell array including a plurality of memory cells;
a row decoder including
a first decode circuit having i first input terminals and a first output terminal, i being an integer greater than or equal to 3,
a second decode circuit having j second input terminals and a second output terminal, j being an integer greater than or equal to 2,
a register having k third input terminals, k third output terminals and a clock input terminal, k being an integer of greater than or equal to (i−1), and
a level shifter having a fourth input terminal and a fourth output terminal,
the first output terminal being connected to the fourth input terminal,
the k third output terminals being connected to a part of the i first input terminals, respectively,
the second output terminal being connected to the clock input terminal; and
a sense amplifier module;
a first plane selection line connected to the remaining part of the i first input terminals of the first decode circuit in the first plane;
a second plane selection line connected to the remaining part of the i first input terminals of the first decode circuit in the second plane;
k address designation lines respectively connected to the k third input terminals of the register in the first plane and respectively connected to the k third input terminals of the register in the second plane; and
j set lines respectively connected to the j second input terminals of the second decode circuit in the first plane and respectively connected to the j second input terminals of the second decode circuit in the second plane.

12. The semiconductor memory device according to claim 11, wherein
the first decode circuit includes a first logic part and a first AND gate part, and
the second decode circuit includes a second logic part and a second AND gate part.

13. The semiconductor memory device according to claim 12, wherein the first logic part includes the part of the i first input terminals, the first AND gate part includes the remaining part of the i first input terminals and the first output terminal, the second logic part includes a part of the j second input terminals, and the second AND gate part includes the remaining part of the j second input terminals and the second output terminal.

14. The semiconductor memory device according to claim 13, wherein the first AND gate part includes input terminals that are respectively connected to output terminals of the first logic part, and the second AND gate part includes input terminals that are respectively connected to output terminals of the second logic part.

* * * * *